US006335873B1

(12) United States Patent
Kawaguchi et al.

(10) Patent No.: US 6,335,873 B1
(45) Date of Patent: Jan. 1, 2002

(54) SEMICONDUCTOR INTEGRATED CIRCUIT DEVICE

(75) Inventors: Masaki Kawaguchi; Takeo Fujii; Yoshinori Matsui; Hiroshi Furuta; Seiichi Hannai, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/525,226

(22) Filed: Mar. 14, 2000

(30) Foreign Application Priority Data

Mar. 15, 1999 (JP) .................................................. 11-069308

(51) Int. Cl.⁷ ....................................................... G11C 5/06

(52) U.S. Cl. ........................ 365/63; 365/230.03; 365/149; 365/51

(58) Field of Search ............................... 365/63, 230.03, 365/149, 51, 49

(56) References Cited

U.S. PATENT DOCUMENTS 6,101,146 A * 8/2000 Maesako et al. ......... 365/230.03
6,104,653 A * 8/2000 Proebsting .................... 365/203

FOREIGN PATENT DOCUMENTS

| JP | 57-20983 | 2/1982 |
| JP | 60-7690 | 1/1985 |
| JP | 62-38590 | 2/1987 |
| JP | 1-146187 | 6/1989 |
| JP | 1-166398 | 6/1989 |
| JP | 4-159689 | 6/1992 |
| JP | 4-252486 | 9/1992 |
| JP | 4-318389 | 11/1992 |
| JP | 5-2872 | 1/1993 |
| JP | 6-36556 | 2/1994 |
| JP | 6-44800 | 2/1994 |

OTHER PUBLICATIONS

J.F. Ziegler et al., "Effect of Cosmic Rays on Computer Memories", Science, vol. 206, Nov. 16, 1979, pp. 776–788.
A. Eto et al., "Impact of Nuetron flux on Soft Errors in MOS Memories", IEDM 98, (Sep. 1998), pp. 367–370 with Abstract.
A. Eto et al., "Soft Error of Memory LSI, Actual Measurement of Effects of Cosmic Rays", Nikkei Electronics, No. 672, Oct. 7, 1996, pp. 145–155.
W.R. McKee et al., "Cosmic Ray Neutron Induced Upsets as a Major Contributor to the Soft Error Rate of Current and Future Generation DRAMS", IEEE IRPS, (May 1996), 1–6 with Abstract.

* cited by examiner

Primary Examiner—Huan Hoang
(74) Attorney, Agent, or Firm—Sughrue Mion, PLLC

(57) ABSTRACT

A semiconductor integrated circuit device is configured using a DRAM and an SRAM between which data transfer is performed by way of a data transfer circuit using data transfer bus lines. Herein, the DRAM is divided into at least two DRAM arrays, each of which contains a number of columns each consisting of memory cells. In addition, the columns are arranged in mixture in connection with external I/O terminals respectively in such a way that columns respectively containing memory cells which are simultaneously subjected to read operations within a same cycle are arranged not to adjoin each other. Thus, it is possible to reduce a probability in which multiple memory cells which are simultaneously subjected to read operations within the same cycle exist within a range of an area under influence of charged particles, which are produced locally due to neutrons. Even if data of memory cells which are concentrated at a certain region are simultaneously placed under influence of the charged particles, it is possible to remarkably reduce a number of chances in that multiple bits of data being read out to the external I/O terminals go defective simultaneously.

14 Claims, 45 Drawing Sheets

FIG. 4

PIN LAYOUT

64M DRAM+16K SRAM(×8)

| Left signal | Left pin | | Right pin | Right signal |
|---|---|---|---|---|
| Vcc | 1 | | 54 | Vss |
| DQ0 | 2 | | 53 | DQ7 |
| VccQ | 3 | | 52 | VssQ |
| NC | 4 | | 51 | NC |
| DQ1 | 5 | | 50 | DQ6 |
| VssQ | 6 | | 49 | VccQ |
| NC | 7 | | 48 | NC |
| DQ2 | 8 | | 47 | DQ5 |
| VccQ | 9 | | 46 | VssQ |
| NC | 10 | | 45 | NC |
| DQ3 | 11 | 54pin | 44 | DQ4 |
| VssQ | 12 | 400mil x 875mil | 43 | VccQ |
| NC | 13 | 0.8mm Pitch | 42 | NC |
| Vcc | 14 | TSOP II | 41 | Vss |
| NC | 15 | | 40 | NC, VREF |
| /WE | 16 | | 39 | DQM |
| /CAS | 17 | | 38 | CLK |
| /RAS | 18 | | 37 | CKE |
| /CS | 19 | | 36 | NC |
| A13(BA) | 20 | | 35 | A11 |
| A12 | 21 | | 34 | A9 |
| A10(AP) | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

FIG. 5

TABLE FOR RELATIONSHIPS BETWEEN COMMANDS AND CONTROL SIGNALS INPUT FROM EXTERNAL

| COMMAND | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| READ | H | x | L | H | L | H | x | x | x | x | SRAM COLUMN SELECT ||||| SRAM ROW SEL |||||
| WRITE | H | x | L | H | L | L | x | x | x | x | SRAM COLUMN SELECT ||||| SRAM ROW SEL |||||
| PRE-FETCH | H | x | L | H | H | L | BANK SELECT | x | x | L | L | DRAM COLUMN SEL |||| x | SRAM ROW SEL ||||
| PRE-FETCH (AUTO PRECHARGE) | H | x | L | H | H | L | BANK SELECT | x | x | H | L | DRAM COLUMN SEL |||| x | SRAM ROW SEL ||||
| RESTORE | H | x | L | H | H | L | BANK SELECT | x | x | L | H | DRAM COLUMN SEL |||| x | SRAM ROW SEL ||||
| RESTORE (AUTO PRECHARGE) | H | x | L | H | H | L | BANK SELECT | x | x | H | H | DRAM COLUMN SEL |||| x | SRAM ROW SEL ||||
| ACTIVE | H | x | L | L | H | H | BANK SELECT | DRAM ROW SELECT |||||||||||
| PRECHARGE | H | x | L | L | H | L | BANK SELECT | x | x | L | L | x | x | x | x | x | x | x | x | x |
| FULL BANK PRECHARGE | H | x | L | L | H | L | x | x | x | H | x | x | x | x | x | x | x | x | x | x |
| CBR REFRESH | H | x | L | L | L | H | x | x | x | x | x | x | x | x | x | x | x | x | x | x |
| NON-OPERATION | H | x | L | H | H | H | x | x | x | x | x | x | x | x | x | x | x | x | x | x |
| DEVICE NON-SELECTION | H | x | H | x | x | x | x | x | x | x | x | x | x | x | x | x | x | x | x | x |
| REGISTER SETTING (1) | H | x | L | L | L | L | L | L | L | L | L | L | L | H | REGISTER SET ||||||
| REGISTER SETTING (2) | H | x | L | L | L | L | L | L | L | L | L | L | L | L | REGISTER SET ||||||

H: HIGH LEVEL   L: LOW LEVEL   x: HIGH OR LOW (DON'T CARE)

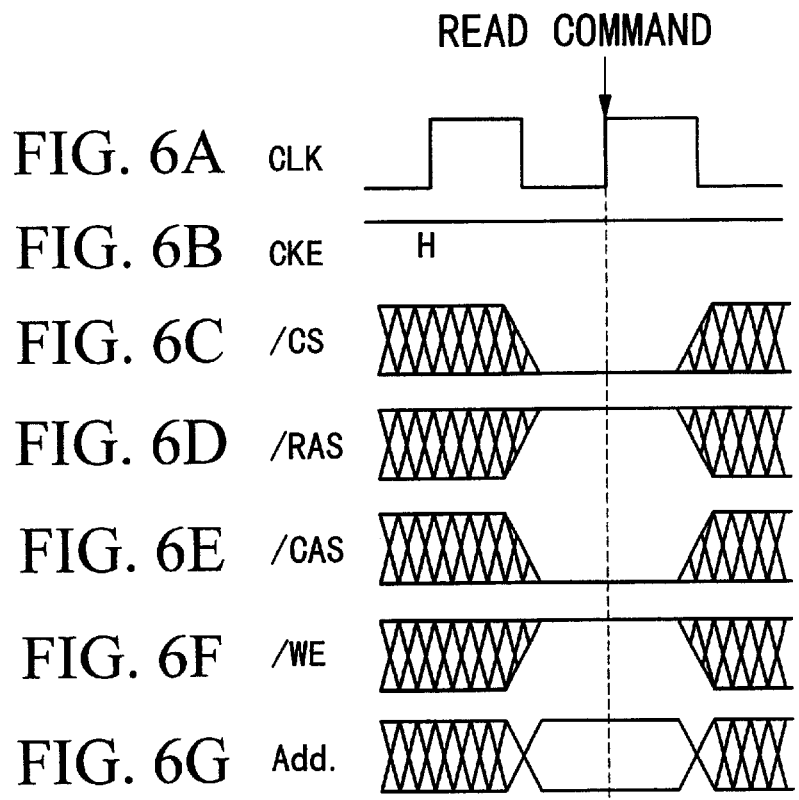
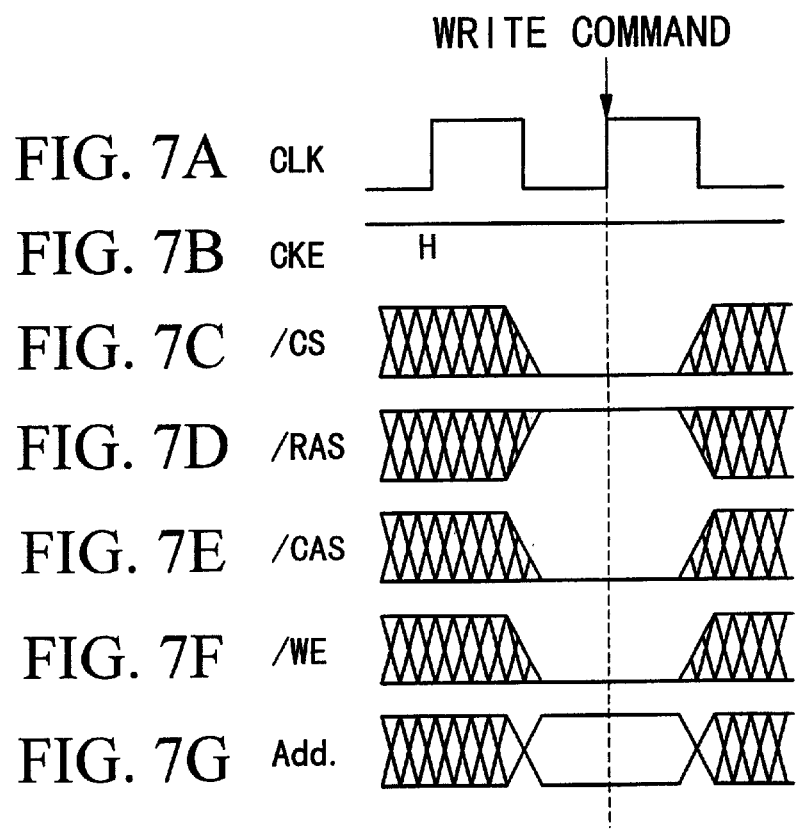

PRE-FETCH COMMAND
FIG. 8A  CLK 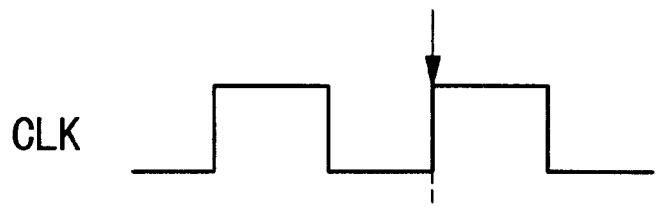
FIG. 8B  CKE  H
FIG. 8C  /CS 
FIG. 8D  /RAS 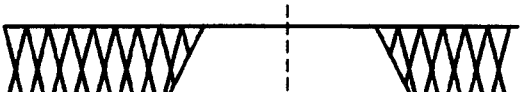
FIG. 8E  /CAS 
FIG. 8F  /WE 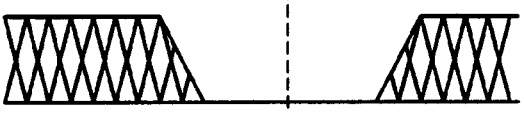
FIG. 8G  A13 
BANK SELECT
FIG. 8H  Add. 
A10=L
A9 =L PRE-FETCH COMMAND WITH
AUTO PRECHARGE
FIG. 9A  CLK  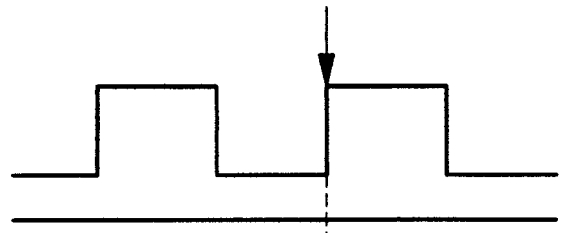
FIG. 9B  CKE  H
FIG. 9C  /CS  
FIG. 9D  /RAS  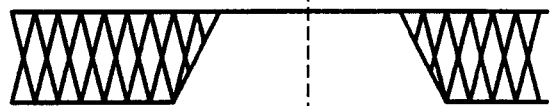
FIG. 9E  /CAS  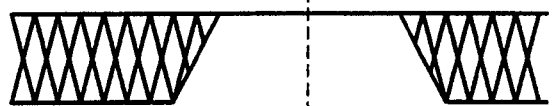
FIG. 9F  /WE  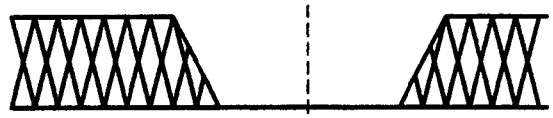
FIG. 9G  A13   BANK SELECT
FIG. 9H  Add.  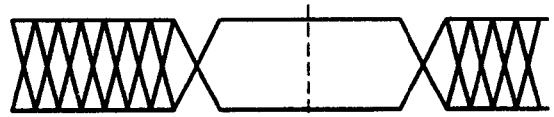
A10=H
A9 =L

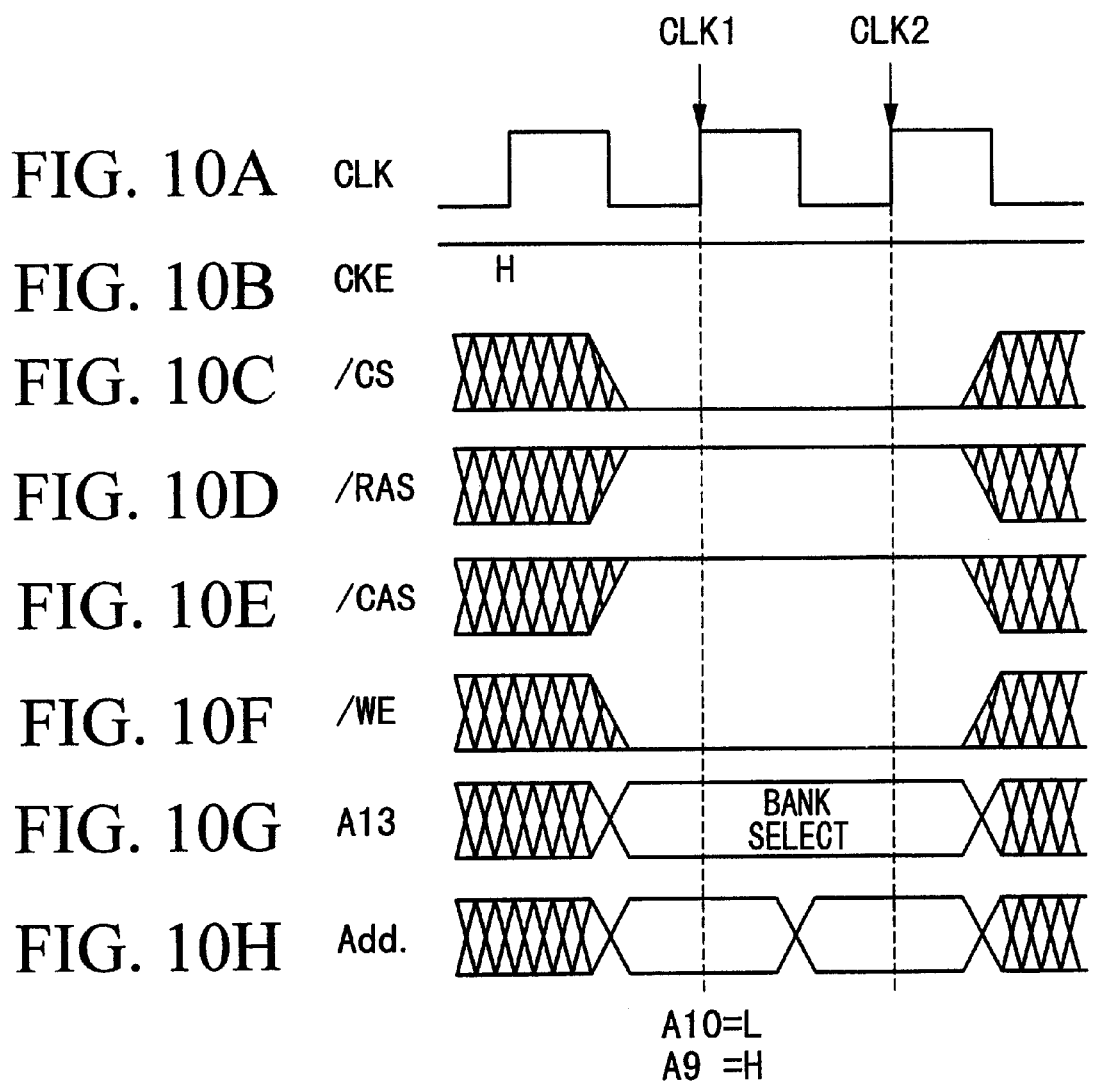

RESTORE COMMAND WITH AUTO PRECHARGE
FIG. 11A CLK 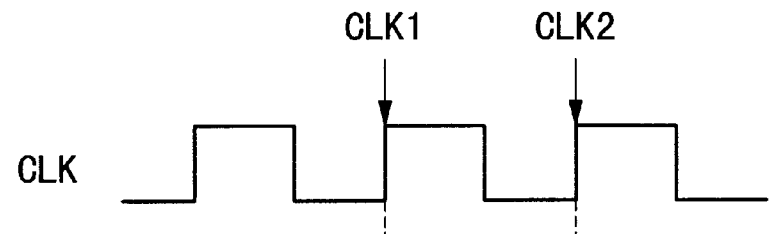
FIG. 11B CKE
FIG. 11C /CS 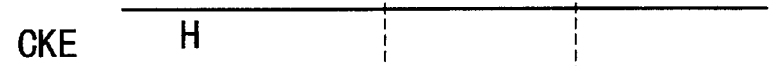
FIG. 11D /RAS 
FIG. 11E /CAS 
FIG. 11F /WE 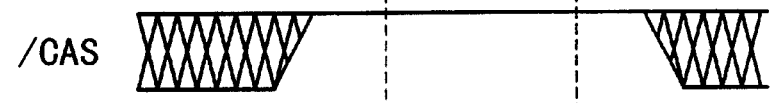
FIG. 11G A13  BANK SELECT
FIG. 11H Add. 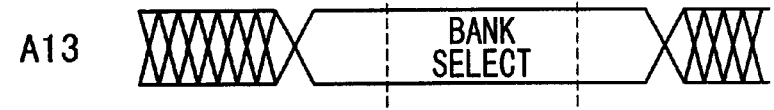
A10=H
A9 =H ACTIVE COMMAND
FIG. 12A  CLK 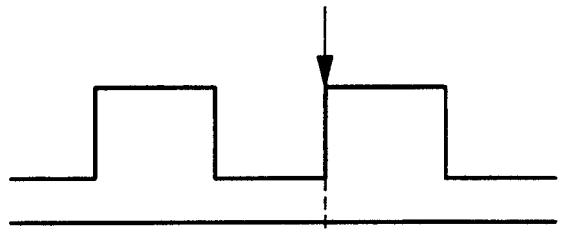
FIG. 12B  CKE  H 
FIG. 12C  /CS 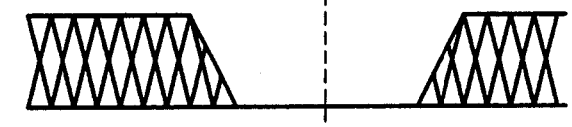
FIG. 12D  /RAS 
FIG. 12E  /CAS 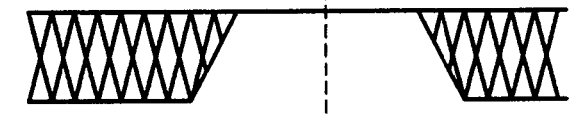
FIG. 12F  /WE 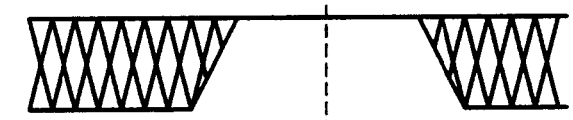
FIG. 12G  A13 
BANK SELECT
FIG. 12H  Add. 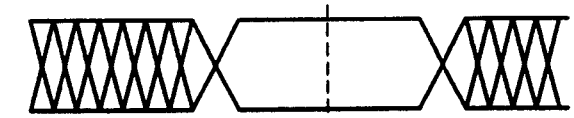

PRECHARGE COMMAND
FIG. 13A CLK 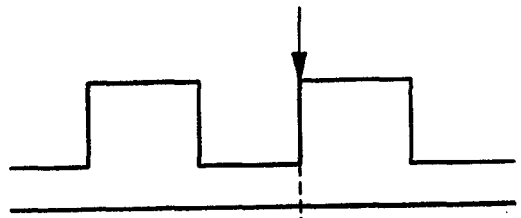
FIG. 13B CKE H
FIG. 13C /CS 
FIG. 13D /RAS 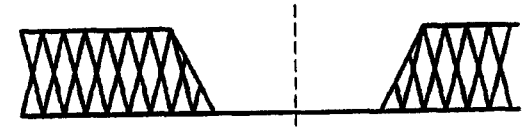
FIG. 13E /CAS 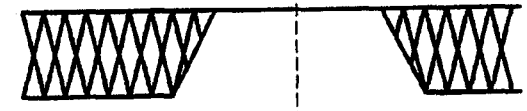
FIG. 13F /WE 
FIG. 13G A13  BANK SELECT
FIG. 13H Add. 
A10=L

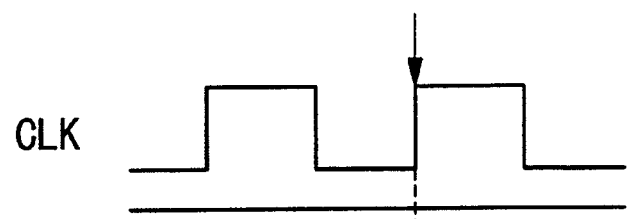
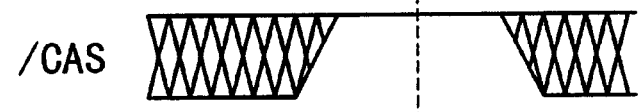
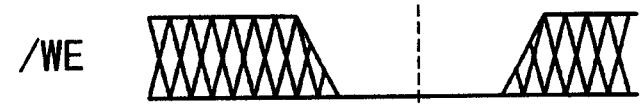
FIG. 14A CLK
FIG. 14B CKE
FIG. 14C /CS
FIG. 14D /RAS
FIG. 14E /CAS
FIG. 14F /WE
FIG. 14G Add.
FULL BANK PRECHARGE COMMAND
A10=H

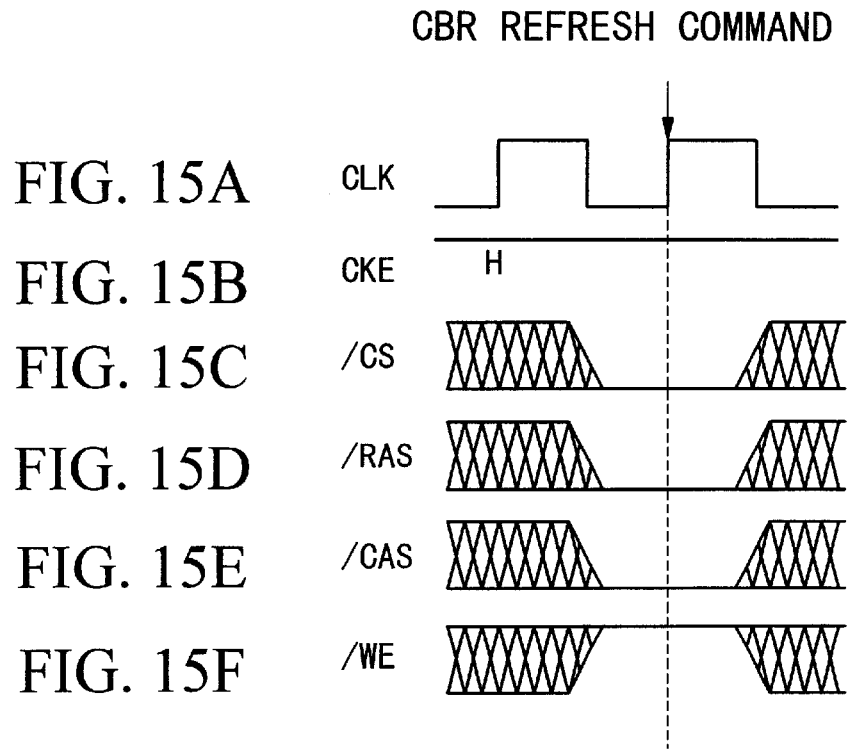
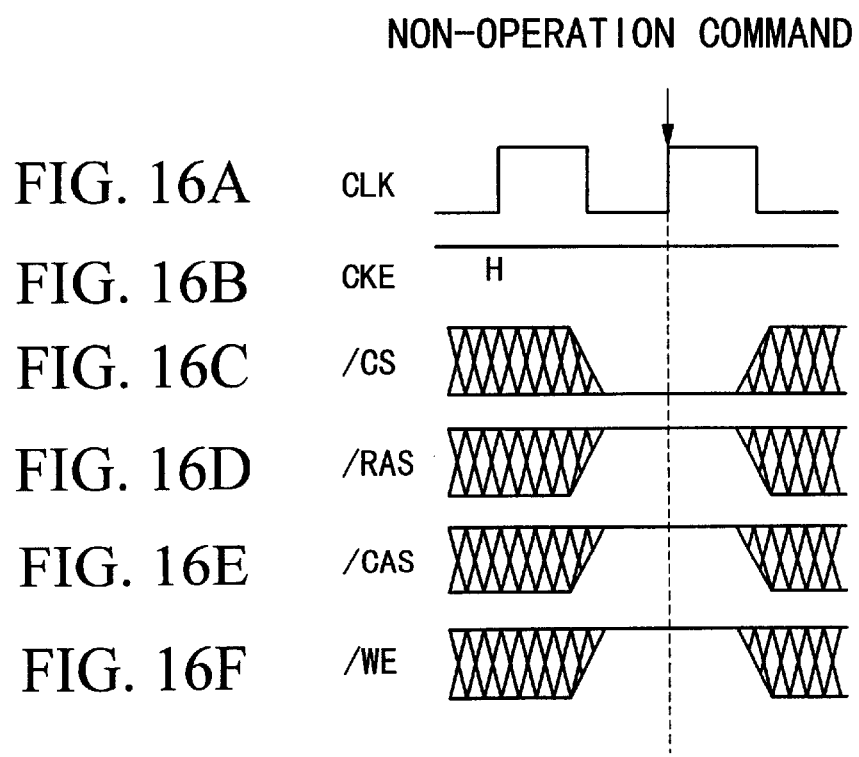

DEVICE NON-SELECTION COMMAND
FIG. 17A CLK 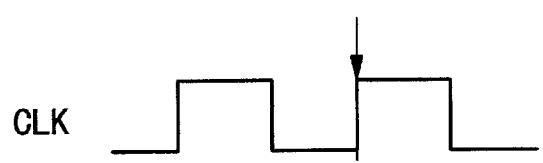
FIG. 17B CKE 
FIG. 17C /CS 
FIRST REGISTER SETTING COMMAND
FIG. 18A CLK 
FIG. 18B CKE 
FIG. 18C /CS 
FIG. 18D /RAS 
FIG. 18E /CAS 
FIG. 18F /WE 
FIG. 18G A0~A13 

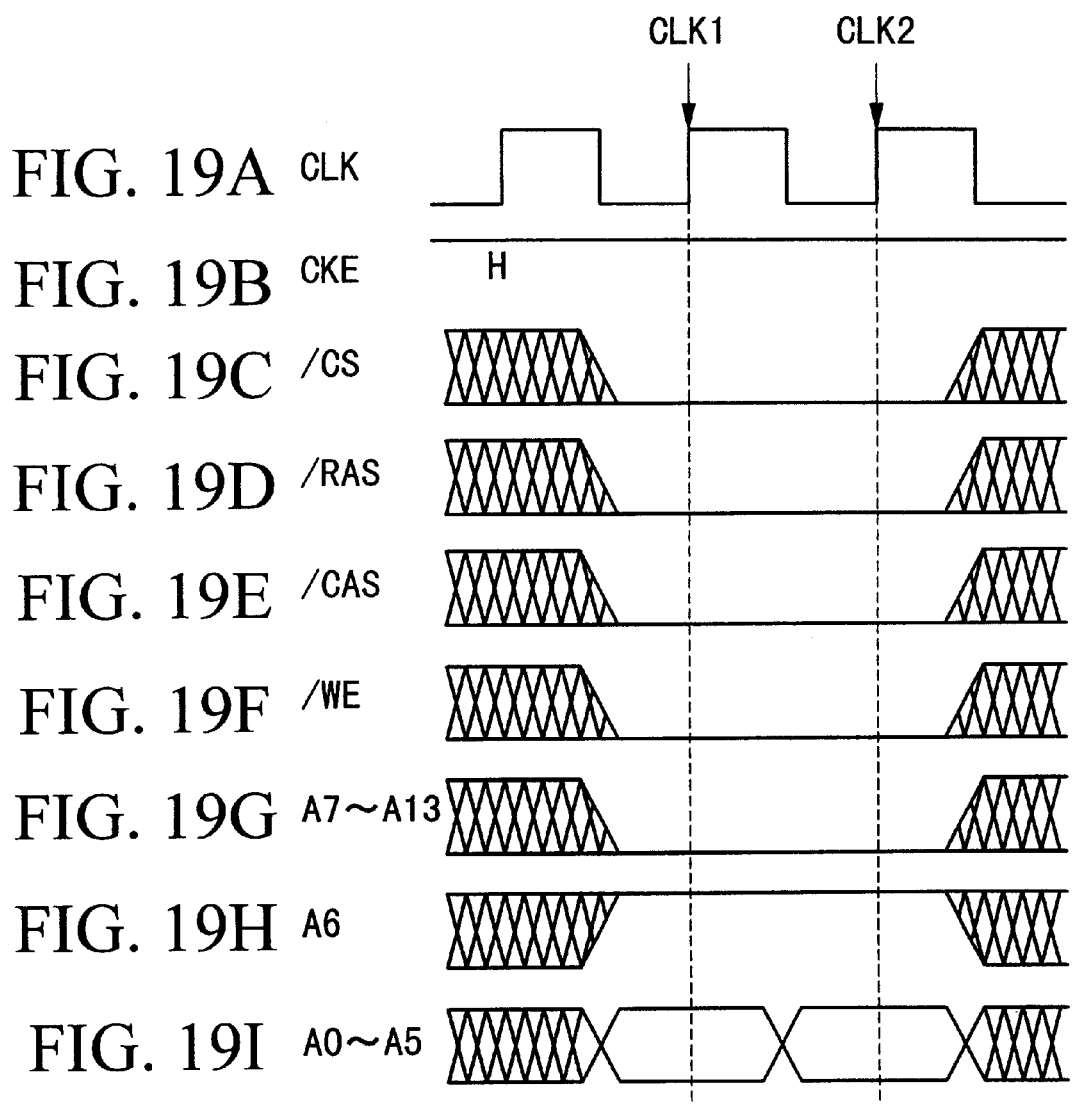
SECOND REGISTER SETTING COMMAND
FIG. 19A CLK
FIG. 19B CKE
FIG. 19C /CS
FIG. 19D /RAS
FIG. 19E /CAS
FIG. 19F /WE
FIG. 19G A7~A13
FIG. 19H A6
FIG. 19I A0~A5

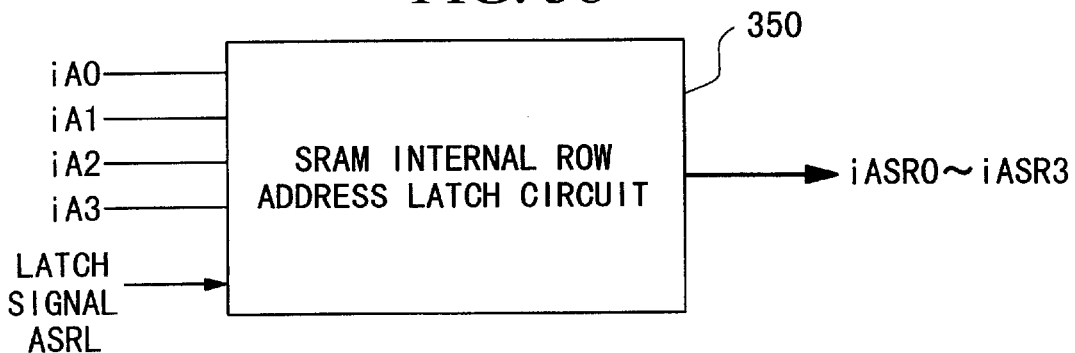
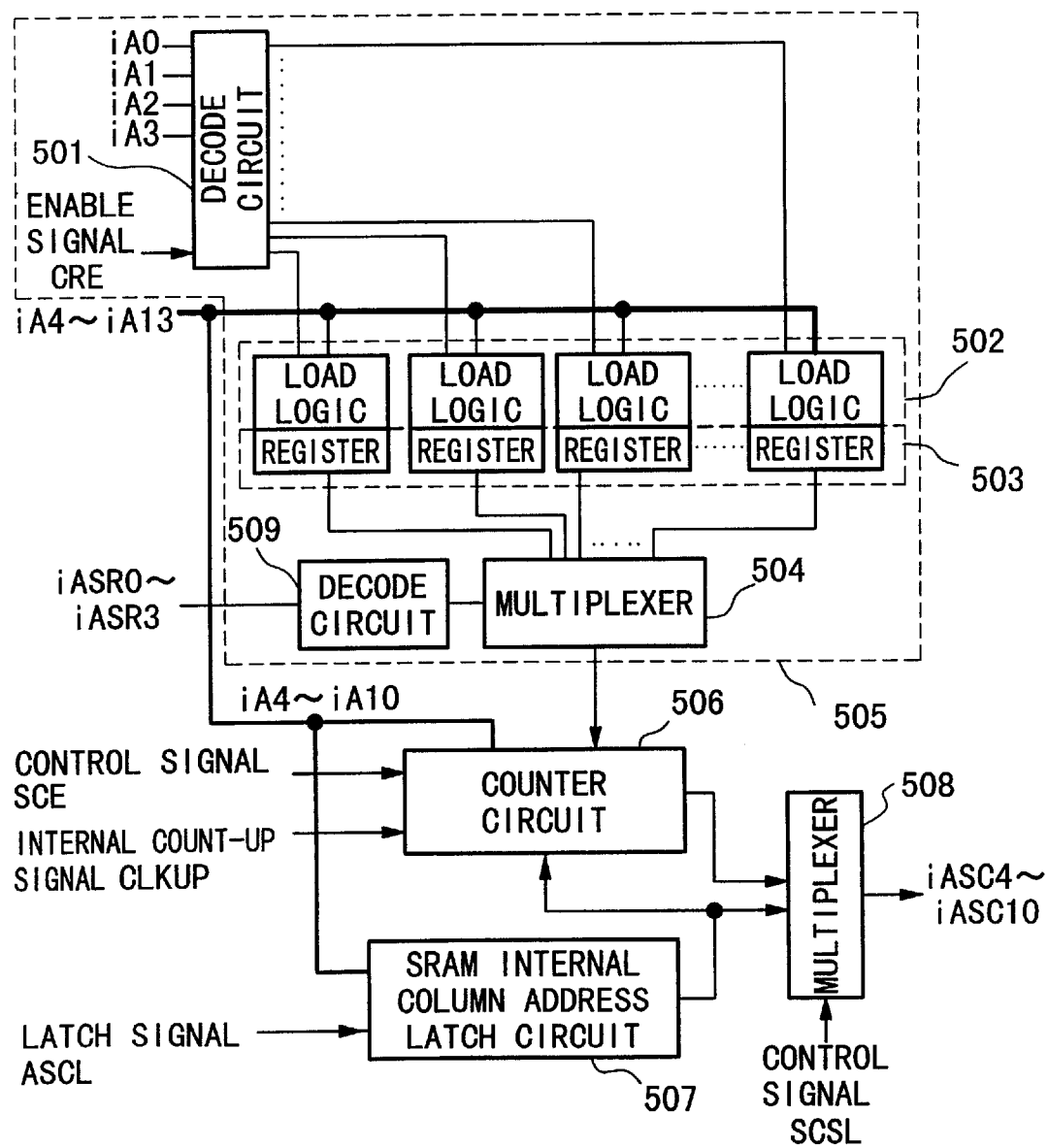

FIG. 41A iCLK
FIG. 41B EXTAi
FIG. 41C SCSL
FIG. 41D Yi
FIG. 41E /INTAi
FIG. 41F YiB
FIG. 41G /SCSL
FIG. 41H BURST CONTROL SIGNAL

FIG. 47
PRIOR ART

SOFT ERROR MODE

| | α RAY SER | NEUTRON SER |
|---|---|---|
| ELECTRIC CHARGES | 16fC/μm | 154fC/μm |
| ERROR MODE | SINGLE BIT | HIGH RATES OF MULTIPLE BITS |
| ECC CORRECTION | CORRECTABLE BY ECC (SINGLE BIT) | SOMETIMES INCORRECTABLE BY NORMAL ECC (MULTIPLE BITS) |

SEMICONDUCTOR INTEGRATED CIRCUIT DEVICE

BACKGROUND OF THE INVENTION

1. Field of the Invention

This invention relates to semiconductor integrated circuit devices having plenty of external I/O terminals for inputting and outputting data, and particularly to semiconductor integrated circuit devices in which data transfer circuits are provided between main storages and auxiliary storages being formed on same semiconductor substrates.

This application is based on Patent Application No. Hei 11-69308 filed in Japan, the content of which is incorporated herein by reference.

2. Description of the Related Art

In general, computer systems use semiconductor devices of large capacities, in which processing speeds are relatively slow and costs in manufacture are relatively low, as main storage devices. To suite requirements of the main storage devices, the computer systems frequently use general-purpose DRAMs (i.e., dynamic random-access memories).

In the computer systems in these days, engineers develop DRAMs, which construct main storage portions, to increase processing speeds to cope with high-speed performance of the systems (particularly, high-speed performance of MPUs or microprocessing units). However, increasing the speeds of the DRAMs do not sufficiently catch up with the high-speed performance of the MPUs. To compensate gaps between speeds of the DRAMs and MPUs, the engineers design the computer systems to include high-speed memories between the main storages and MPUs as auxiliary storages. Those auxiliary storages are generally called "cache memories", which correspond to high-speed SRAMs (static random-access memories), ECLRAM (where "ECL" stands for "Emitter-Coupled Logic"), etc.

In general, the cache memories are provided externally of the MPUs, or they are built in the MPUs. Recently, engineers pay attention to semiconductor storage devices, in which DRAMs constructing main storages and cache memories are formed on same semiconductor substrates. Related arts regarding the aforementioned semiconductor storage devices are disclosed by a variety of papers and documents, as follows:

Japanese Patent Application, First Publication No. Sho 57-20983 discloses an example of a memory chip, which is equipped with an internal port for connecting memory cells with a latch circuit to transfer data.

Japanese Patent Application, First Publication No. Sho 60-7690 discloses an example of a semiconductor memory, in which data of dynamic memory cells are transferred to static memory cells by transfer gates with respect to rows.

Japanese Patent Application, First Publication No. Sho 62-38590 discloses an example of a semiconductor memory device, in which data transfer is made between a DRAM and an SRAM with respect to rows.

Japanese Patent Application, First Publication No. Hei 1-146187 discloses an example of a semiconductor memory device incorporating a cache memory, in which data of memory cells are transferred to data registers by units of blocks by way of transfer gates, which are selected by a block decoder.

The semiconductor storage devices of the aforementioned related arts are sometimes called "cache DRAMs" because they contain DRAMs and cache memories. Or, they may be described in connection with "CD-RAMs", for example. They are configured to enable bidirectional transfer data between SRAMs, functioning as cache memories, and DRAMs constructing main storages.

The aforementioned related arts suffer from drawbacks such as operational delays in data transfer due to cache mishit events, for example. So, engineers propose a variety of techniques regarding improvements to the semiconductor storage devices, as follows:

Japanese Patent Application, First Publication No. Hei 4-252486 discloses an example of a semiconductor memory device, in which data blocks are transferred from a DRAM array to an SRAM array as a cache memory.

Japanese Patent Application, First Publication No. Hei 4-318389 discloses an example of a data transfer device applied to a semiconductor storage device, in which data transfer is performed between a DRAM and an SRAM, wherein transfer data are rewritten as write data to allow access to the SRAM after completion of the data transfer to the DRAM to cope with a cache miswrite event.

Japanese Patent Application, First Publication No. Hei 5-2872 discloses an example of a semiconductor storage device, in which data transfer is performed between a DRAM and an SRAM by way of a bidirectional transfer gate circuit, wherein different paths are provided for the DRAM in writing and reading data respectively in a non-multiplex manner to allow data transfer from the DRAM to the SRAM at a high speed even in a cache-miss event.

The aforementioned techniques are characterized by incorporating bidirectional data transfer circuits, which are used to perform data transfer between DRAMs and SRAMs and which contain functions of latches and registers. So, each semiconductor storage device incorporating the aforementioned technique is designed such that first transfer of data being transferred from the SRAM to the DRAM can be performed simultaneously with second transfer of data being transferred from the DRAM to the SRAM. This enables data transfer (or copy-back) to be made faster in a cache mishit event.

However, the aforementioned techniques are disadvantageous in that an area of the bidirectional data transfer circuit is large enough to occupy an overall area of the semiconductor substrate. So, there is a limit in a number of the circuits being installed on the semiconductor substrate. As a result, there is a limit in a number of transfer bus lines being provided with respect to the semiconductor storage device. For this reason, a number of bits being transferred between a DRAM array and an SRAM array at once is limited to sixteen (bits). Generally speaking, a cache hit rate is reduced as a number of bits being transferred at once becomes small.

FIG. 46 shows a recent example of a memory system being equipped with multiple processing devices. Such a memory system of FIG. 46 suffers from a drawback in which a cache hit rate is reduced upon receipt of access requests from the multiple processing devices. The multiple access requests given from the multiple processing devices (or memory masters) are frequently connected with address requests with regard to different sets (or rows). If a CD-RAM or ED-RAM (where "ED" stands for "Exchangeable Disk") is used as a main memory (9115) shown in FIG. 46, the cache hit rate is reduced, so that the memory system as a whole is limited in high-speed performance. To cope with an increasing number of systems each having multiple processing devices (or memory masters) in these days, main memories should be designed to respond to multiple kinds of access requests rather than a single kind of memory access, which is conventionally made.

In addition to the aforementioned problems, engineers should consider other problems such as soft errors, which are caused to occur due to neutrons being introduced into very fine structures of memory cells in these days.

Conventionally, as a main course of occurrence of soft errors, scientists and engineers name alpha (α) rays being produced by decays that occur on very small amounts of radioactive isotopes being contained in packages and wiring materials inside of semiconductor chips. As another cause, Dr. J. F. Ziegler names cosmic rays in 1979, which is discussed in a paper entitled "Effect of cosmic rays on computer memories" in Science, vol. 206, pp. 776–788, November 1979. However, scientists and engineers do not show interests on such a cause for a long time.

Recently, rapid developments of fine structures of memory cells press the scientists and engineers to observe modes regarding defectiveness of memory cells in which data of multiple bits are inverted due to soft errors, which are considered to be caused by cosmic rays. As a result, they show great interests in soft errors due to neutrons. A mechanism in occurrence of the soft errors due to neutrons is described as follows:

Cosmic rays collide with atoms of the atmosphere of the Earth to produce neutrons. When the neutrons being produced in the atmosphere collide with silicon (Si) atoms within a chip, recoil nucleuses of Si nucleuses are being produced, or charged particles are being produced due to nuclear transformation reactions. The charged particles exert influences on stored charges of the memory cell, so that soft errors are being caused to occur.

Influences and effects of neutrons on semiconductor memories are described in detail by several papers, as follows:

A paper entitled "Impact of Neutron flux on Soft Errors in MOS Memories"0 written by M. Akira Eto and members for IEDM 98 (or 1998 IEEE, which stands for Institute of Electrical and Electronics Engineers); and an article entitled "Soft Error of Memory LSI, Actual Measurement of Effects on Cosmic Rays" written in pp. 145–155 of a journal called "NIKKEI ELECTRONICS", no. 672 published on Oct. 7, 1996 in Japan.

FIG. 47 shows comparison between a soft error made due to α rays and a soft error mode due to neutrons, wherein "SER" stands for "Soft Error Rate". As shown in FIG. 47, remarkable differences are found in amounts of charges being produced with respect to soft errors due to α rays and soft errors due to neutrons. That is, an amount of charges being produced due to neutrons is approximately ten times greater than an amount of charges being produced due to α rays, which is described in a paper entitled "Cosmic Ray Neutron Induced Upsets as a Major Contributor to the Soft Error Rate of Current and Future Generation DRAMS" for IEEE IRPS, 1996. Herein, comparison is made between the soft errors due to α rays and neutrons with respect to an error mode representative of an emergence manner of bit defectiveness. That is, bit defectiveness due to α rays tend to emerge by a unit of a single bit, while bit defectiveness due to neutrons tend to emerge by a unit of multiple bits. In addition, comparison is made between them with respect to possibility of corrections to be performed using error correct codes (or error correcting codes, ECC). That is, the bit defectiveness due to α rays can be corrected because it corresponds to a single bit. However, it is difficult to correct the bit defectiveness due to neutrons because there is a tendency to increase frequencies in emergence of the bit defectiveness corresponding to multiple bits. So, a more complicated ECC system will be required to correct the bit defectiveness due to neutrons.

Because of needs of applications of personal computers, engineers design memories such as DRAMs to have large capacities and capabilities of processing plenty of bits. In other words, as developments in large capacities of the memories progress, the memories tend to have complicated configurations dealing with plenty of bits, wherein a number of external I/O terminals for inputting and outputting data is increased from eight to sixteen and is further increased to thirty-two, for example. In general, in order to reduce electric power being consumed or increase access speeds, memory cell arrays are reduced in sizes and dimensions, so that each memory (e.g., DRAM) is being configured by multiple memory cell arrays. A best method in efficiency to read out data of plenty of bits from memory cell arrays is to select much data using a single select line, so that data are to be readout from the memory cell arrays at once. Normally, this is achieved by assignment of a same address on the memory cell arrays. That is, 4-bit data are read from each memory cell array, for example, so that read data are simultaneously output from different external I/O terminals respectively.

FIG. 48 shows a typical example of a layout of memory cells, which correspond to different external I/O terminals and which are mixed and arranged within memory cell arrays. This example has sixteen external I/O terminals in total. So, memory cells are arranged in each memory cell array in connection with sixteen external I/O terminals, respectively. Namely, the layout of FIG. 48 is mainly configured by four blocks or memory cell arrays being designated by reference numerals 1010, 1020, 1030 and 1040 respectively. Each block consists of four blocks, which are designated by reference numerals 1001, 1002, 1003 and 1004 respectively. In addition, each block contains memory cells corresponding to four external I/O terminals. For example, memory cells are arranged in a block 1001 in connection with different external I/O terminals I/O0 to I/O3 respectively.

FIG. 49 shows a memory cell array of the block 1001 (see FIG. 48) and its peripheral circuit configurations. In FIG. 49, the memory cell array consists of rows and columns, which are arranged regularly in an array form. Herein, each column corresponds to a unit being partitioned by dotted lines in the memory cell array and consists of two bit lines (e.g., BL0, BL0b), while each row corresponds to a word line that crosses the bit lines with a right angle. Memory cells are appropriately arranged at points of intersection being formed between word lines and bit lines. In addition, circuitry corresponding to a row decoder and a word driver is arranged in periphery adjoining the memory cell array and is connected with the word lines. It activates a single word line in response to an external address.

Sense amplifiers SAMP0, SAMP1, SAMP2 and SAMP3 are also arranged in periphery adjoining the memory cell array. Herein, each sense amplifier is connected with a pair of bit lines to amplify signals being read from corresponding memory cells. Concretely, the sense amplifier SAMP0 is connected with a pair of bit lines BL0, BL0b; the sense amplifiers SAMP1 is connected with a pair of bit lines BL1, BL1b; the sense amplifier SAMP2 is connected with a pair of bit lines BL2, BL2b; and the sense amplifier SAMP3 is connected with a pair of bit lines BL3, BL3b. In addition, paired data I/O lines (i.e., DL0, DL1, DL2, DL3) are wired in periphery of the memory cell array in parallel with the rows. Further, transfer gate (i.e., TG1, TG2, TG3, TG4) are appropriately inserted between the paired data I/O lines and the paired bit lines. Those transfer gates are controlled by a single select line YSW. The select line YSW is wired in parallel with the column of the memory cell array. For example, it is formed by a metal wiring layer of an uppermost layer in a semiconductor chip.

FIG. 49 merely shows four columns of the memory cell array. Actually, however, 1,024 columns are arranged in the memory cell array. For convenience' sake, FIG. 49 omits illustration of detailed circuit configurations, in which the data I/O lines DL0–DL3 are connected with the external I/O terminals by way of write circuits and read circuits. To read out data of plenty bits from memory cells of one memory cell array, the aforementioned layout has a variety of advantages, as follows:

The data I/O lines are arranged outside of the memory cell array. So, it is possible to freely wire a necessary number of data I/O lines. In addition, the layout requires a minimal number of lines being required as the select line YSW. As a result, the layout is reduced in load capacity and is superior in operation speed and consumption of electric power.

The aforementioned layout inevitably concentrates columns to adjoin each other in connection with different external I/O terminals. So, relatively large charges being produced due to neutrons influence stored data of memory cells, which are read out different external I/O terminals within a same cycle. Thus, there is a high likelihood in which bit defectiveness is caused to occur due to the neutrons. As a result, the conventional system suffers from a problem in which probability in occurrence of bit defectiveness is extremely high with respect to adjoining columns.

In the aforementioned layout, columns containing memory cells corresponding to four different external I/O terminals are arranged to adjoin each other. This shows a high probability in occurrence of bit defectiveness in which four bits simultaneously become defective within sixteen bits corresponding to the external I/O terminals I/O0 to I/O15. As described above, if a number of defective bits increases on the external I/O terminals, read data should be greatly changed in content information. This may greatly affect processing of the processing device(s) inputting the data. A degree in changing the information becomes remarkably high as a number of defective bits increases on the external I/O terminals.

SUMMARY OF THE INVENTION

It is an object of the invention to provide a semiconductor integrated circuit device which is capable of promptly responding to access requests given from multiple memory masters without reducing a cable hit rate.

It is another object of the invention to provide a semiconductor integrated circuit deice which is capable of minimizing a number of defective bits appearing on external I/O terminals due to neutrons.

According to a first aspect of the invention, a semiconductor integrated circuit device is basically configured by external I/O terminals and at least a memory cell array in which memory cells are arranged in mixture in connection with at least two external I/O terminals. Herein, the memory cells are arranged in an array form consisting of rows and columns in connection with word lines and bit lines respectively, so that data are read out from the memory cell array and are output to the external I/O terminals. In addition, columns whose memory cells store data being read out to the external I/O terminals within a same cycle are arranged to be apart from each other. Further, bit lines respectively belonging to the columns are connected with data I/O lines by way of switching elements, which are controlled in conduction by select signal lines which are wired to extend in parallel with the rows, while the data I/O lines are wired to extending parallel with the columns. Furthermore, the data I/O lines are respectively connected with the bit lines of the columns which adjoin each other by way of the switching elements, which are controlled in conduction by different select signal lines.

According to the first aspect of the invention, the memory cells corresponding to different external I/O terminals are arranged not in a concentrated manner but in a dispersed manner. For this reason, even if charged particles are produced locally due to neutrons, there is a small probability in that the memory cells which are simultaneously subjected to read operations within a same cycle exist within a range of an area under influence of the charged particles. Therefore, even if data of the memory cells which are concentrated at a certain region are simultaneously placed under influence of the charged particles, it is possible to remarkably reduce a number of chances in which multiple bits of data being read out to the external I/O terminals go defective simultaneously.

According to a second aspect of the invention, a semiconductor integrated circuit device is configured by external I/O terminals, a main storage having at least a memory cell array in which memory cells are arranged in mixture in connection with at least two external I/O lines and in which the memory cells are arranged in an array form consisting of rows and columns in connection with word lines and bit lines respectively, and an auxiliary storage that functions as a cache memory for the main storage, so that bidirectional data transfer is allowed between the main storage and auxiliary storage. Herein, data are read out from the main storage and are output to the external I/O terminals by way of the auxiliary storage. In addition, columns whose memory cells store data being read out to the external I/O terminals within a same cycle are arranged to be apart from each other.

It is possible to configure the semiconductor integrated circuit device such that the memory cell array of the main storage includes columns which are arranged to adjoin each other in space in connection with the external I/O terminals respectively and each of which is commonly assigned with a first address. Herein, the columns are equipped with switching elements respectively. By selectively conducting the switching element in response to a second address, data are read out from any one of the columns and are output to any one of the external I/O terminals.

In the above, each of the memory cells belonging to each column is selected in response to the first address, while each column is being selected in response to the second address. That is, data of only one memory cell is selectively read out from among memory cells which are arranged to adjoin each other in space within a same cycle. In addition, memory cells belonging to columns which adjoin each other are not simultaneously subjected to read operations within the same cycle. Relationships between the external I/O terminals and columns are set in such a way that columns storing data which are read out to the external I/O terminals within the same cycle are not arranged to adjoin each other. For this reason, even if charged particles are produced locally due to neutrons, it is possible to remarkably reduce a number of chances in which multiple bits of data being read out to the external I/O terminals go defective simultaneously.

Incidentally, it is possible to configure the semiconductor integrated circuit device in such a way that columns which are not subjected to read operations within the same cycle are arranged to adjoin each other in the memory cell array. Thus, columns respectively containing memory cells which are simultaneously subjected to read operations within a same cycle are arranged to be apart from each other by intervention of another column containing memory cells which are subjected to read operations within another cycle. So, it is possible to provide some interval of distance between columns respectively containing memory cells which are subjected to read operations within the same cycle without reduction of integration in arrangement of memory cells.

Moreover, it is possible configure the semiconductor integrated circuit device in such a way that a parity bit is provided for error correction on each unit of data being read out to the external I/O terminals within the same cycle. Herein, a distance being formed between memory cells which are simultaneously subjected to read operations is set to exceed a range of an area under influence of charged particles due to neutrons. Thus, it is possible to suppress a number of bits whose data are simultaneously read out to the external I/O terminals and whose data go defective simultaneously to a single bit. In this case, it is possible to correct an error of the data due to neutrons by using the parity bit.

BRIEF DESCRIPTION OF THE DRAWINGS

These and other objects, aspects and embodiment of the present invention will be described in more detail with reference to the following drawing figures, of which:

FIG. 4 is a schematic illustration showing a pin layout of a package encapsulating the semiconductor storage device;

FIG. 5 is a table showing relationships between commands and conditions of input control signals;

FIG. 6A shows a waveform of a clock signal CLK in connection with a read command;

FIG. 6B shows a clock enable signal CKE for the read command

FIG. 6C shows a chip select signal /CS for the read command;

FIG. 6D shows a control signal /RAS for the read command;

FIG. 6E shows a control signal /CAS for the read command;

FIG. 6F shows a write enable signal /WE for the read command;

FIG. 6G shows address signals Add. for the read command;

FIG. 7A shows a waveform of a clock signal CLK in connection with a write command;

FIG. 7B shows a clock enable signal CKE for the write command;

FIG. 7C shows a chip select signal /CS for the write command;

FIG. 7D shows a control signal /RAS for the write command;

FIG. 7E shows a control signal /CAS for the write command;

FIG. 7F shows a write enable signal /WE for the write command;

FIG. 7G shows address signals Add. for the write command;

FIG. 8A shows a waveform of a clock signal CLK in accordance with a pre-fetch command;

FIG. 8B shows a clock enable signal CKE for the pre-fetch command;

FIG. 8C shows a chip select signal /CS for the pre-fetch command;

FIG. 8D shows a control signal /RAS for the pre-fetch command;

FIG. 8E shows a control signal /CAS for the pre-fetch command;

FIG. 8F shows a write enable signal /WE for the pre-fetch command;

FIG. 8G shows an address signal A13 for the pre-fetch command;

FIG. 8H shows address signals Add. for the write command;

FIG. 9A shows a waveform of a clock signal CLK in connection with a pre-fetch command with auto precharge;

FIG. 9B shows a clock enable signal CKE for the pre-fetch command;

FIG. 9C shows a chip select signal /CS for the pre-fetch command;

FIG. 9D shows a control signal /RAS for the pre-fetch command;

FIG. 9E shows a control signal /CAS for the pre-fetch command;

FIG. 9F shows a write enable signal /WE for the pre-fetch command;

FIG. 9G shows an address signal A13 for the pre-fetch command;

FIG. 9H shows address signals Add. for the pre-fetch command;

FIG. 10A shows a waveform of a clock signal CLK in connection with a restore command;

FIG. 10B shows a clock enable signal CKE for the restore command;

FIG. 10C shows a chip select signal /CS for the restore command;

FIG. 10D shows a control signal /RAS for the restore command;

FIG. 10E shows a control signal /CAS for the restore command;

FIG. 10F shows a write enable signal /WE for the restore command;

FIG. 10G shows an address signal A13 for the restore command;

FIG. 10H shows address signals Add. for the restore command;

FIG. 11A shows a waveform of a clock signal CLK in connection with a restore command with auto precharge;

FIG. 11B shows a clock enable signal CKE for the restore command;

FIG. 11C shows a chip select signal /CS for the restore command;

FIG. 11D shows a control signal /RAS for the restore command;

FIG. 11E shows a control signal /CAS for the restore command;

FIG. 11F shows a write enable signal /WE for the restore command;

FIG. 11G shows an address signal A13 for the restore command;

FIG. 11H shows address signals Add. for the restore command;

FIG. 12A shows a waveform of clock signal CLK in connection with an active command;

FIG. 12B shows a clock enable signal CKE for the active command;

FIG. 12C shows a chip select signal /CS for the active command;

FIG. 12D shows a control signal /RAS for the active command;

FIG. 12E shows a control signal /CAS for the active command;

FIG. 12F shows a write enable signal /WE for the active command;

FIG. 12G shows an address signal A13 for the active command;

FIG. 12H shows address signals Add. for the active command;

FIG. 13A shows a waveform of a clock signal CLK in connection with a precharge command;

FIG. 13B shows a clock enable signal CKE for the precharge command;

FIG. 13C shows a chip select signal /CS for the precharge command;

FIG. 13D shows a control signal /RAS for the precharge command;

FIG. 13E shows a control signal /CAS for the precharge command;

FIG. 13F shows a write enable signal /WE for the precharge command;

FIG. 13G shows an address signal A13 for the precharge command;

FIG. 13H shows address signals Add. for the precharge command;

FIG. 14A shows a waveform of a clock signal CLK in connection with a full bank precharge command;

FIG. 14B shows a clock enable signal CKE for the full bank precharge command;

FIG. 14C shows a chip select signal /CS for the full bank precharge command;

FIG. 14D shows a control signal /RAS for the full bank precharge command;

FIG. 14E shows a control signal /CAS for the full bank precharge command;

FIG. 14F shows a write enable signal /WE for the full bank precharge command;

FIG. 14G shows address signals Add. for the full bank precharge command;

FIG. 15A shows a waveform of a clock signal CLK in connection with a CBR refresh command;

FIG. 15B shows a clock enable signal CKE for the CBR refresh command;

FIG. 15C shows a chip select signal /CS for the CBR refresh command;

FIG. 15D shows a control signal /RAS for the CBR refresh command;

FIG. 15E shows a control signal /CAS for the CBR refresh command;

FIG. 15F shows a write enable signal /WE for the CBR refresh command;

FIG. 16A shows a waveform of a clock signal CLK in connection with a non-operational command;

FIG. 16B shows a clock enable signal CKE for the non-operation command;

FIG. 16C shows a chip select signal /CS for the non-operation command;

FIG. 16D shows a control signal /RAS for the non-operation command;

FIG. 16E shows a control signal /CAS for the non-operation command;

FIG. 16F shows a write enable signal /WE for the non-operation command;

FIG. 17A shows a waveform of a clock signal CLK in connection with a device non-selection command;

FIG. 17B shows a clock enable signal CKE for the device non-selection command;

FIG. 17C shows a chip select signal /CS for the device non-selection command;

FIG. 18A shows a waveform of a clock signal CLK in connection with first register setting commands;

FIG. 18B shows a clock enable signal CKE for the first register setting commands;

FIG. 18C shows a chip select signal /CS for the first register setting commands;

FIG. 18D shows a control signal /RAS for the first register setting commands;

FIG. 18E shows a control signal /CAS for the first register setting commands;

FIG. 18F shows a write enable signal /WE for the first register setting commands;

FIG. 18G shows address signals A0–A13 for the first register setting commands;

FIG. 19A shows a waveform of a clock signal CLK in connection with second register setting commands;

FIG. 19B shows a clock enable signal CKE for the second register setting commands;

FIG. 19C shows a chip select signal /CS for the second register setting commands;

FIG. 19D shows a control signal /RAS for the second register setting commands;

FIG. 19E shows a control signal /CAS for the second register setting commands;

FIG. 19F shows a write enable signal /WE for the second register setting commands;

FIG. 19G shows address signals A7–A13 for the second register setting commands;

FIG. 19H shows an address signal A6 for the second register setting commands;

FIG. 19I shows address signals A0–A5 for the second register setting commands;

FIG. 33 is a block diagram showing details of a DRAM column control circuit and a DRAM column decoder shown in FIG. 28;

FIG. 34 is a block diagram showing connections between an SDRAM, DRAM bit line select circuits and a pair of data transfer bus lines in connection with the layout of FIG. 25;

FIG. 35A shows level variations of data transfer bus lines TBLA for a bank A shown in FIG. 34;

FIG. 35B shows level variations of data transfer bus lines TBLB for a bank B shown in FIG. 34;

FIG. 35C shows a control signal SLA supplied to a data transfer bus control circuit shown in FIG. 34;

FIG. 35D shows a control signal SLB supplied to a data transfer bus control circuit shown in FIG. 34;

FIG. 35E shows level variations of data transfer bus lines TBLS for the SRAM shown in FIG. 34;

FIG. 36 is a block diagram showing circuit configurations with regard to the SRAM and its peripheral circuits for an external I/O terminal DQ;

FIG. 37 is a block diagram showing a static memory cell and its peripheral circuits;

FIG. 38 is a block diagram showing an internal configuration of an SRAM row control circuit shown in FIG. 36;

FIG. 39 is a block diagram showing an internal configuration of an SRAM column control circuit shown in FIG. 36;

FIG. 40 is a logical circuit diagram showing details of an SRAM internal column address latch circuit and a multiplexer shown in FIG. 39;

Figure 26:
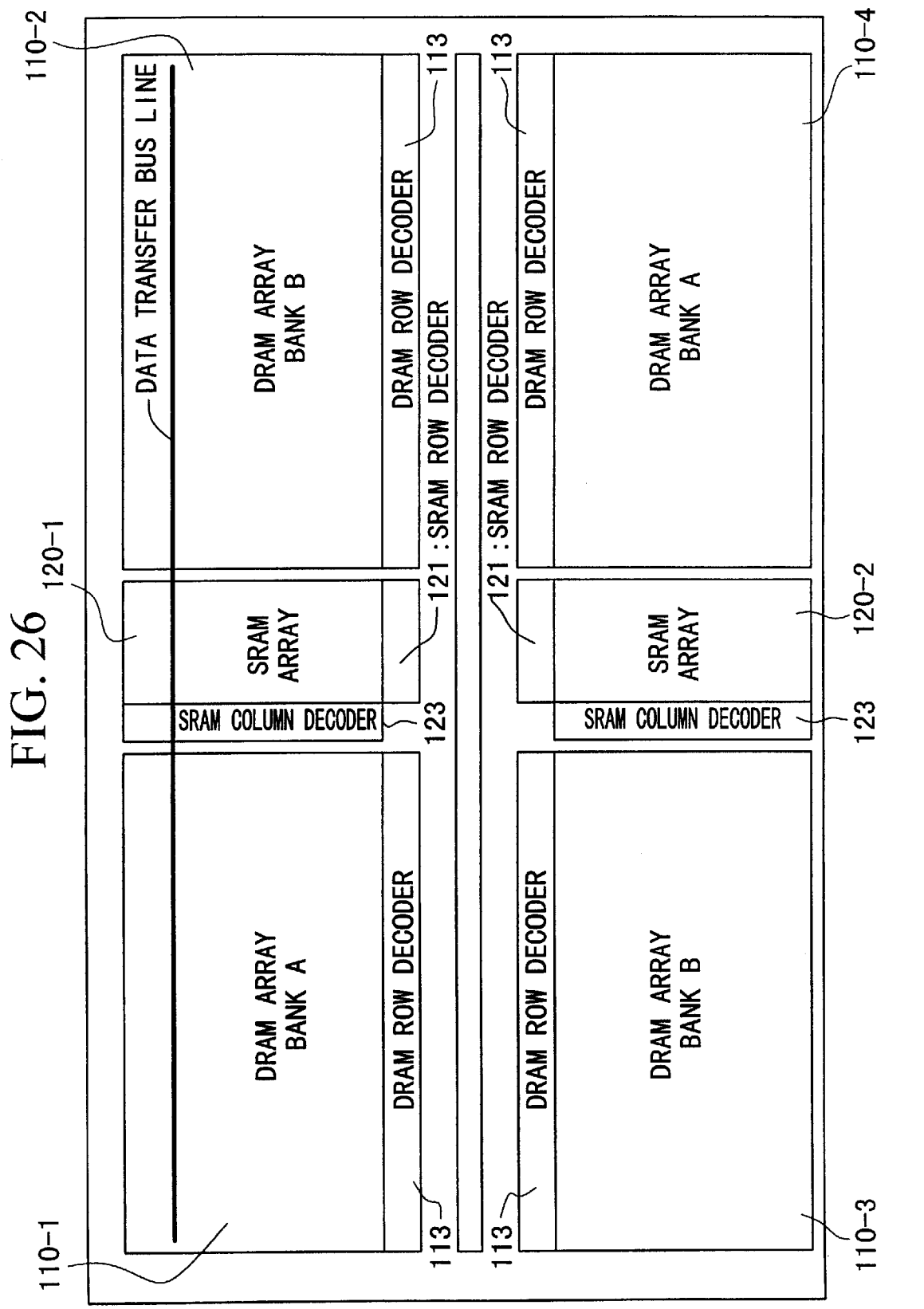
FIG. 26 diagrammatically shows another example of an overall layout of a chip incorporating a semiconductor storage device in accordance with the embodiment of the invention.
Figure 40:
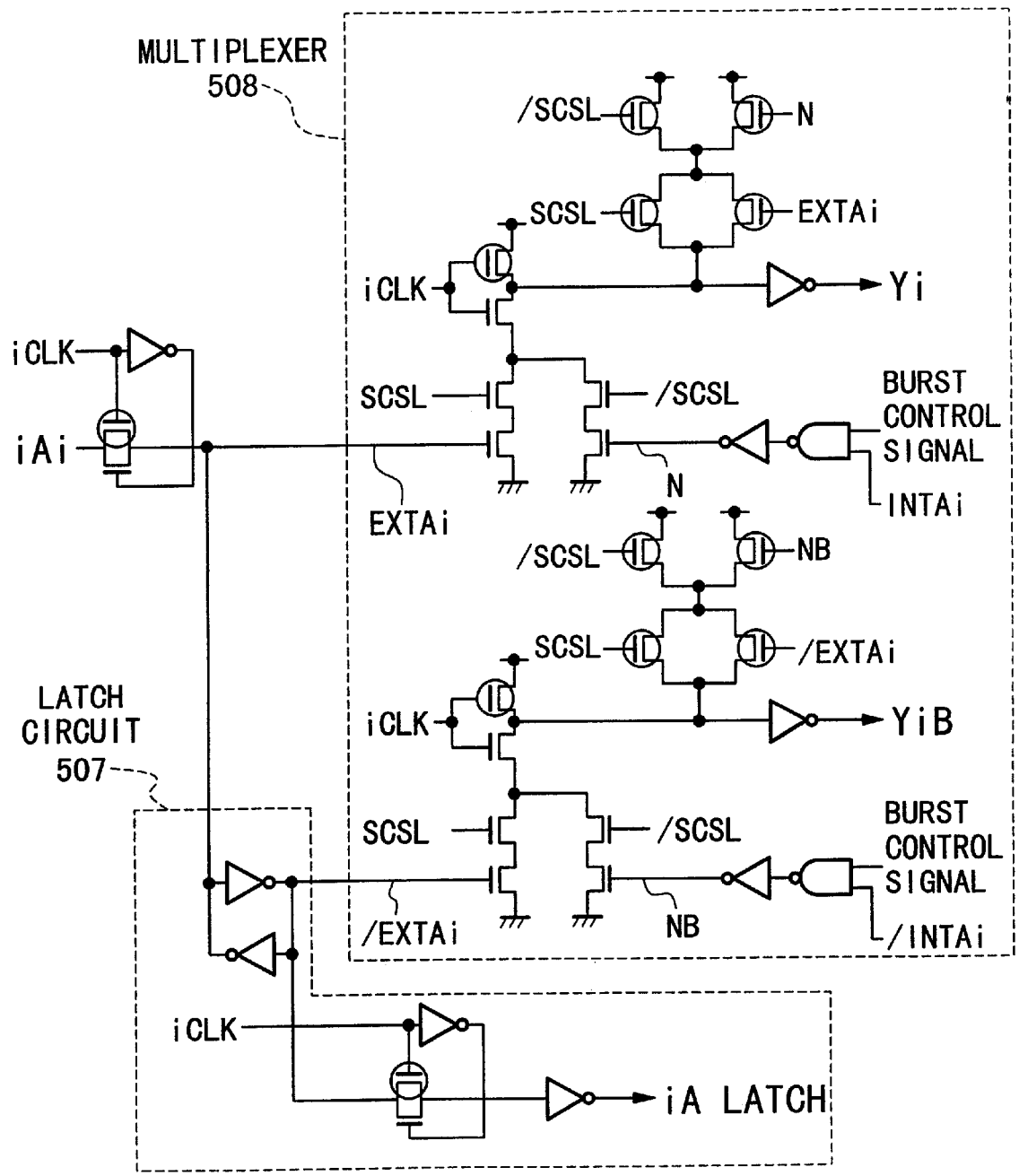
Figure 41:
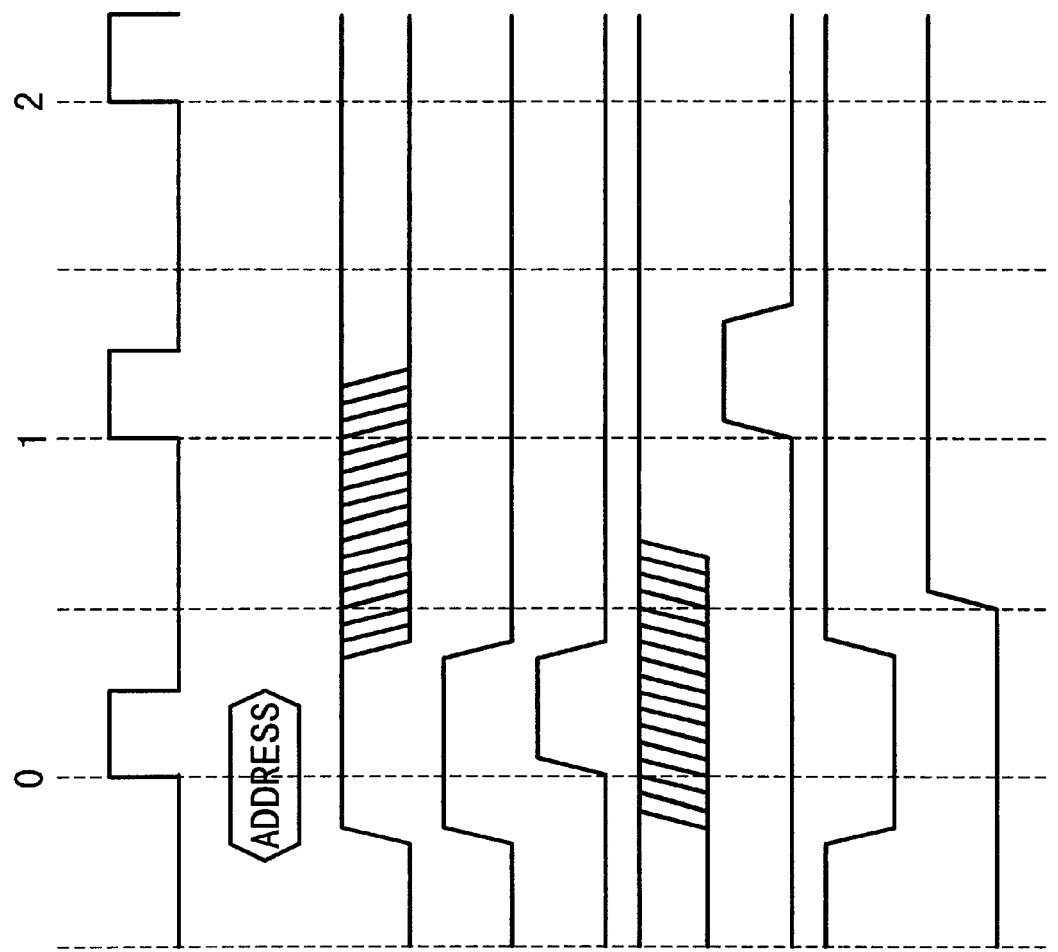
Figure 42:
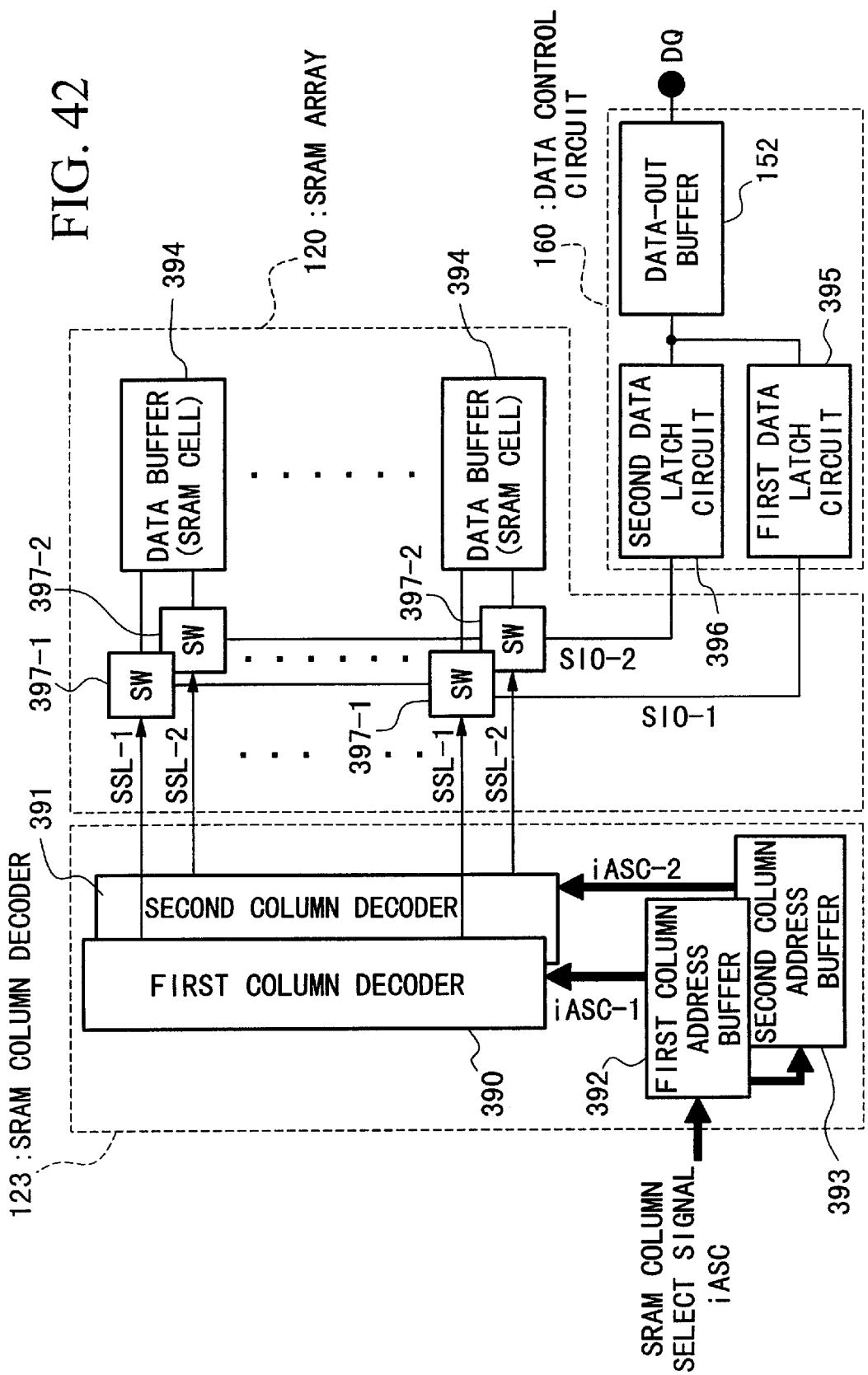
Figure 43:
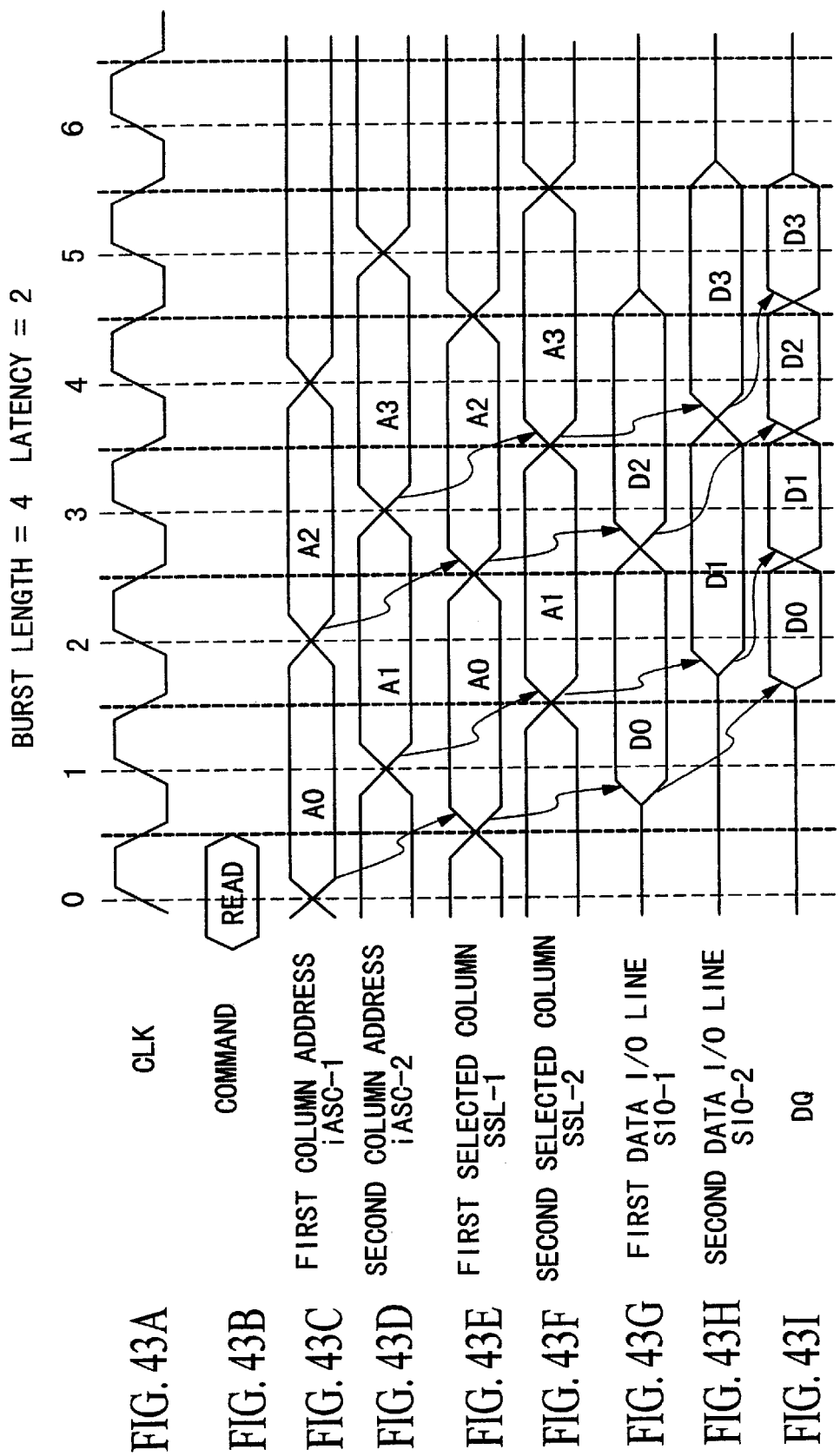
Figure 44:
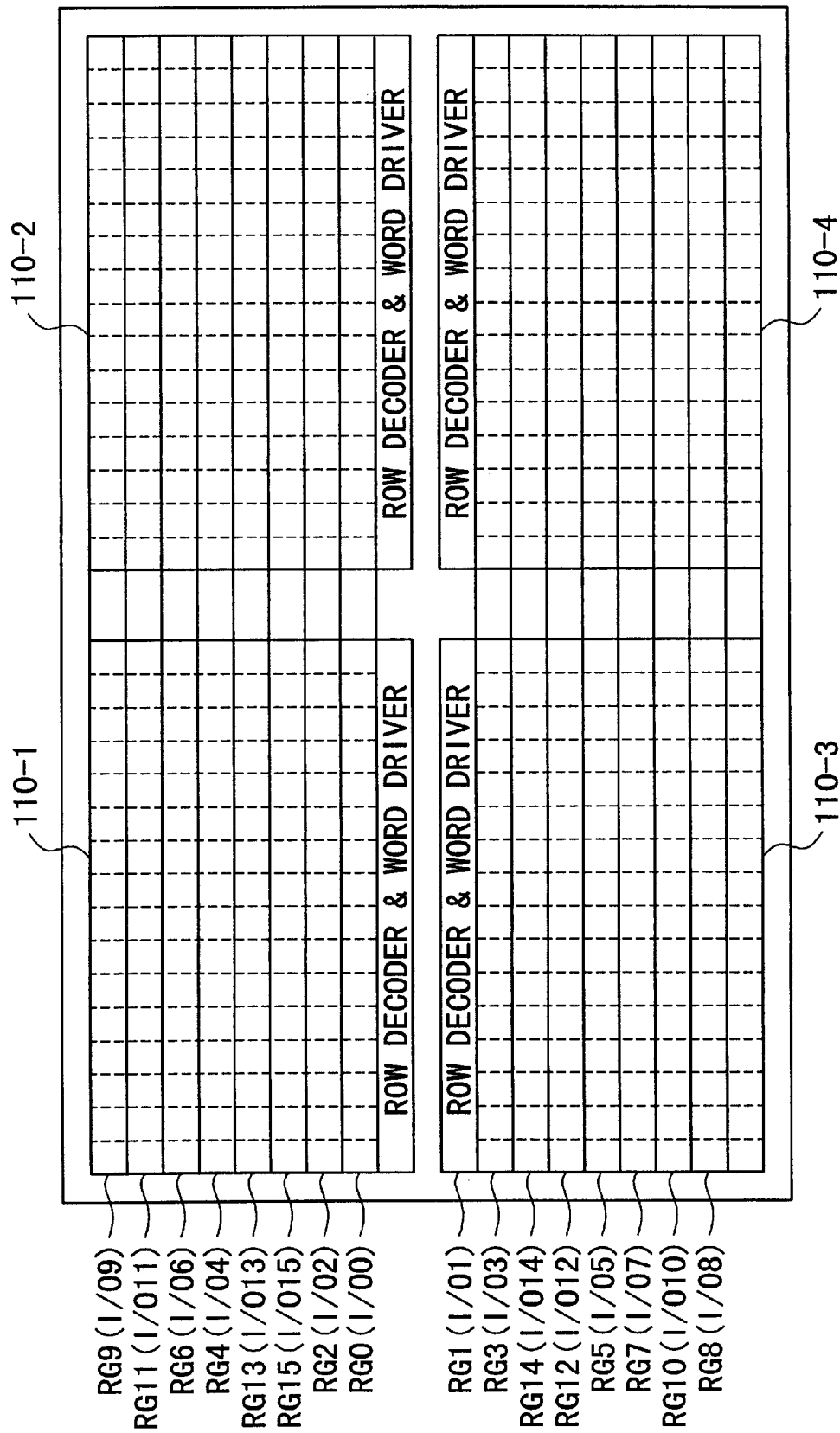
Figure 45:
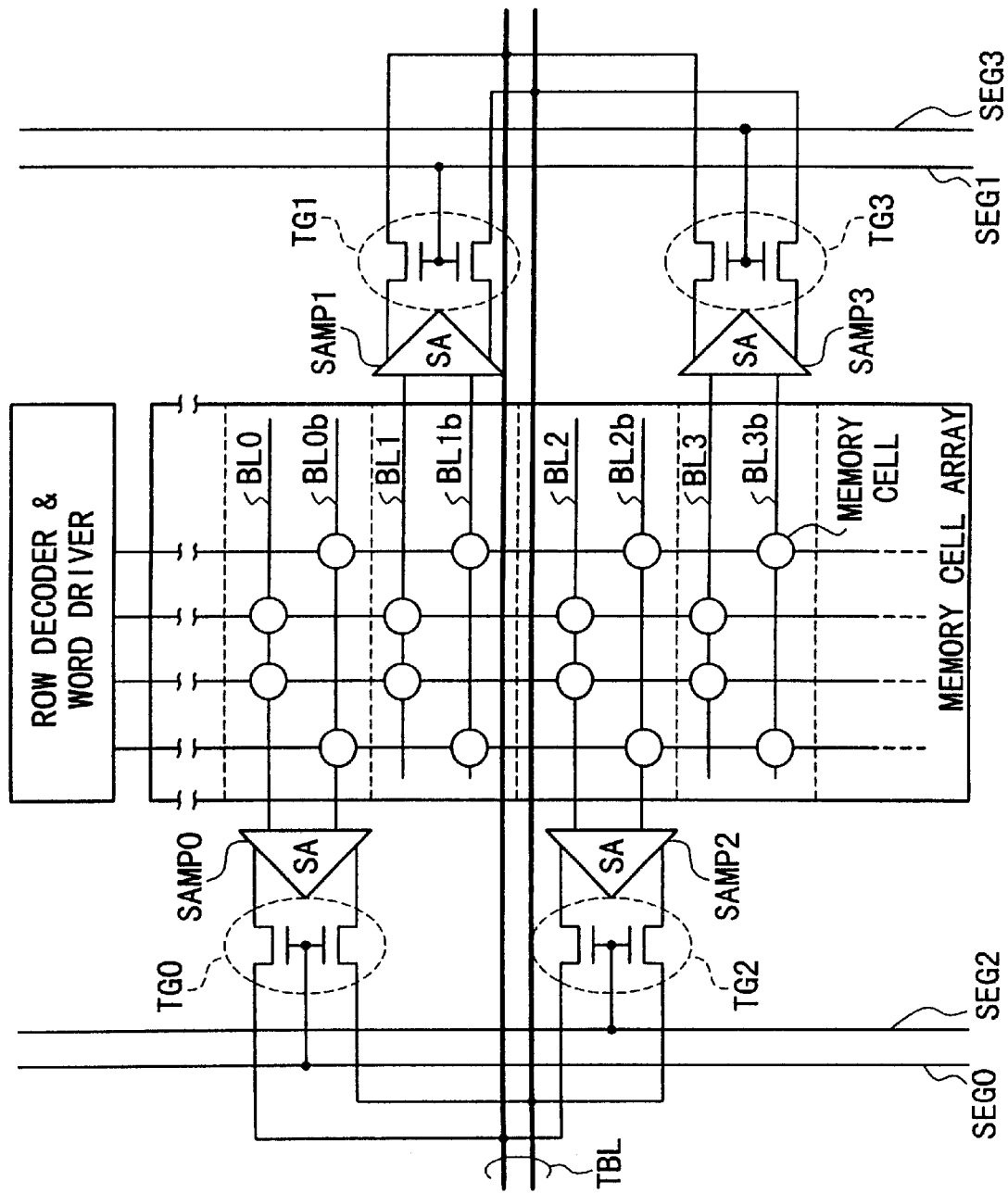
Figure 46:
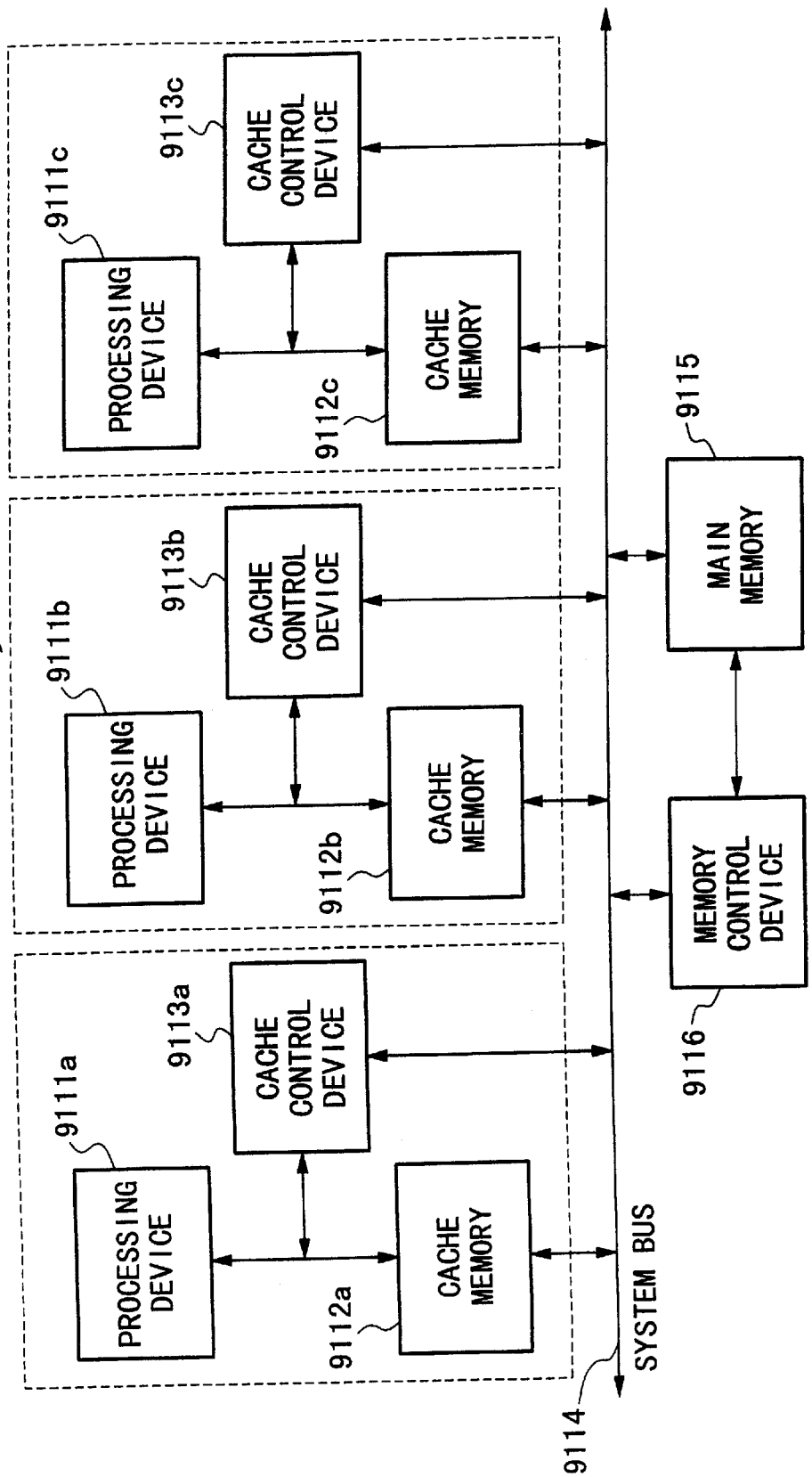
Figure 48:
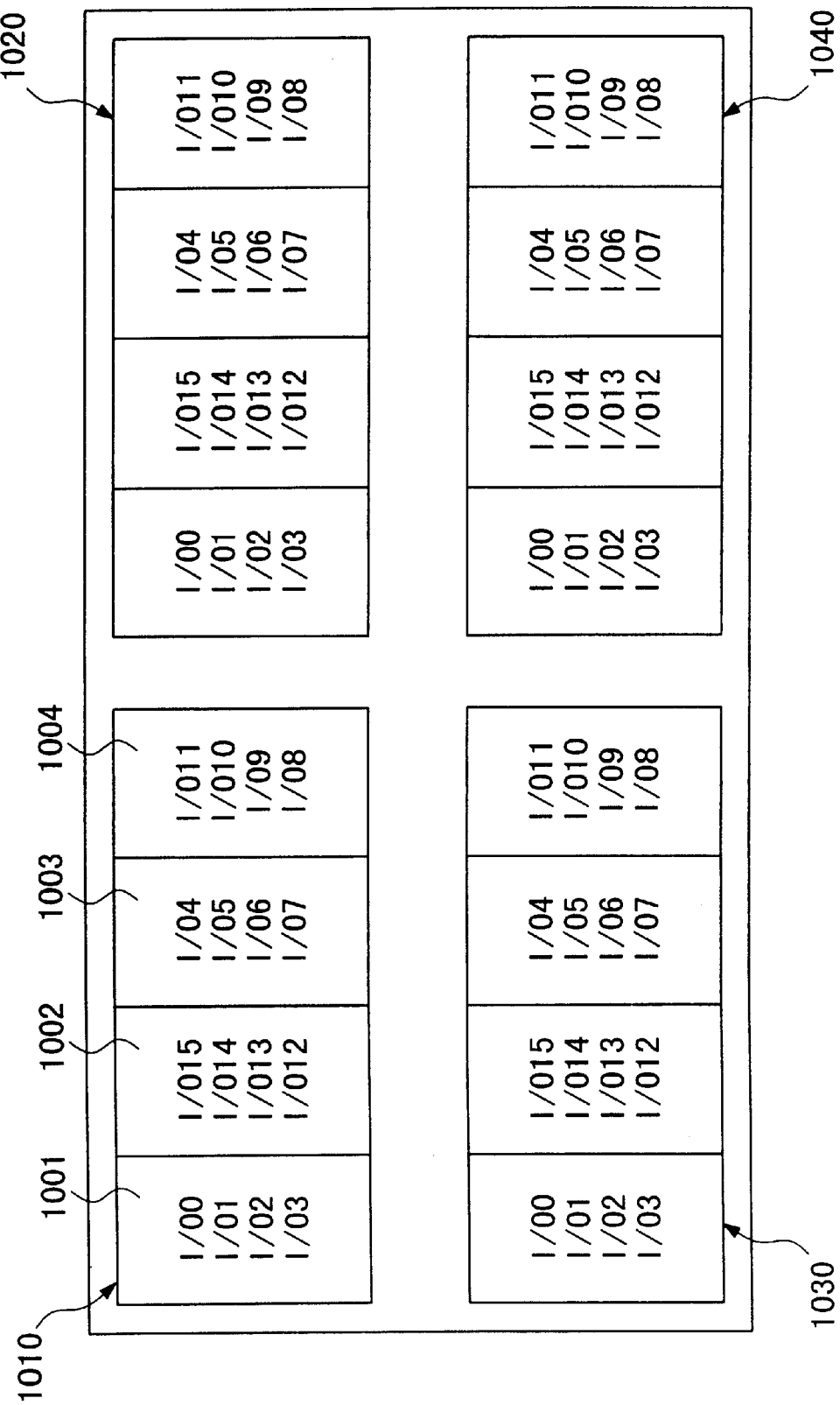
Figure 49:
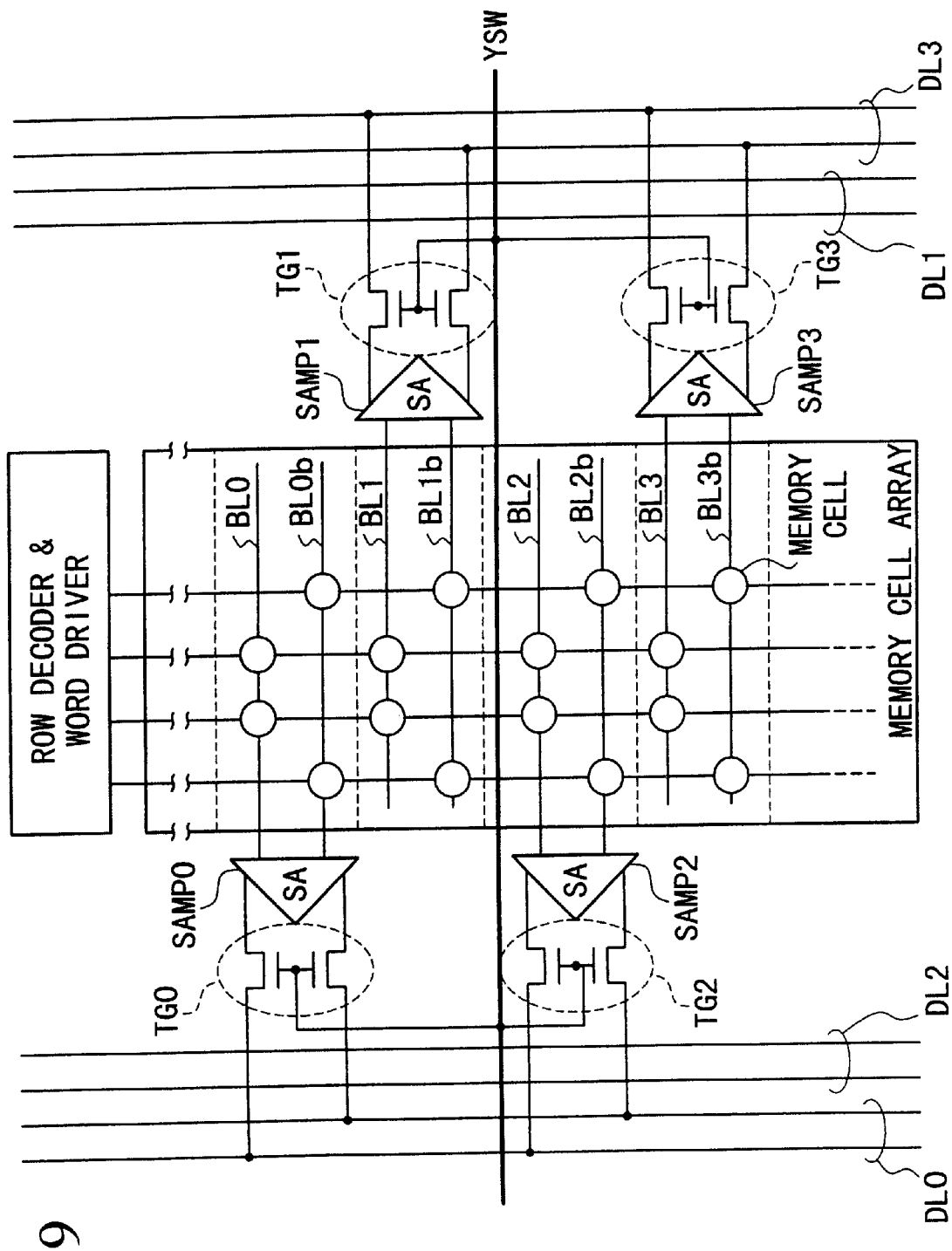

FIG. 41A shows a waveform of an internal clock signal iCLK shown in FIG. 40;

FIG. 41B shows an address being issued;

FIG. 41C shows a signal EXTAi shown in FIG. 40;

FIG. 41D shows a control signal SCSL shown in FIG. 40;

FIG. 41E shows an output Yi of the multiplexer shown in FIG. 40;

FIG. 41F shows an address signal /INTAi shown in FIG. 40;

FIG. 41G shows an output YiB of the multiplexer shown in FIG. 40;

FIG. 41H shows an inverse control signal /SCSL shown in FIG. 40;

FIG. 41I shows a burst control signal input to the multiplexer shown in FIG. 40;

FIG. 42 is a block diagram showing internal configurations with regard to an SRAM column decoder, an SRAM array and a data control circuit;

FIG. 43A shows a waveform of a clock signal CLK in connection with internal operations of circuits shown in FIG. 42;

FIG. 43B shows a command "READ", which is issued;

FIG. 43C shows first column addresses iASC-1 being consecutively output;

FIG. 43D shows second column addresses iASC-2 being consecutively output;

FIG. 43E shows first column SSL-1 being consecutively selected;

FIG. 43F shows second columns SSL-2 being consecutively selected;

FIG. 43G shows data being consecutively output on a first data I/O line SIO-1;

FIG. 43H shows data being consecutively output on a second data I/O line SIO-2;

FIG. 43I shows data being consecutively output to an external I/O terminal DQ;

FIG. 44 shows an I/O map in connection with the layout shown in FIG. 26;

FIG. 45 is a circuit diagram showing a DRAM array and its peripheral circuits in connection with the I/O map of FIG. 44;

FIG. 46 is a block diagram showing an outline configuration of a memory system having multiple processing devices;

FIG. 47 shows comparison between softer error modes due to α rays and neutrons;

FIG. 48 is a schematic illustration showing a layout of memory cell arrays in which memory cells are arranged in connection with different I/O terminals respectively; and FIG. 49 is a circuit diagram showing an internal configuration of a memory cell array and its peripheral circuits.

DESCRIPTION OF THE PREFERRED EMBODIMENT

This invention will be described in further detail by way of examples with reference to the accompanying drawings.

(1) Fundamental Configuration

Basically, a semiconductor integrated circuit device of this invention contains a semiconductor storage device and its control device(s). Herein, the semiconductor storage device has a main storage and an auxiliary storage. It is designed to enable bidirectional data transfer between the main storage and auxiliary storage. The auxiliary storage is configured by a number of memory cells, each of which is capable of functioning as an independent cache. Incidentally, the semiconductor storage device can be actualized using control terminals and address terminals, numbers of which are required to control the main storage.

This invention will be described with respect to the preferred embodiment, in which the semiconductor storage device has synchronous interfaces corresponding to configurations of two banks×8 bits, wherein the main storage has a DRAM array of 64 Megabit, while the auxiliary storage has an SRAM array of 16 Kilobit. Of course, this invention is not necessarily limited to the aforementioned embodiment.

(2) Block Diagram

Figure 1:
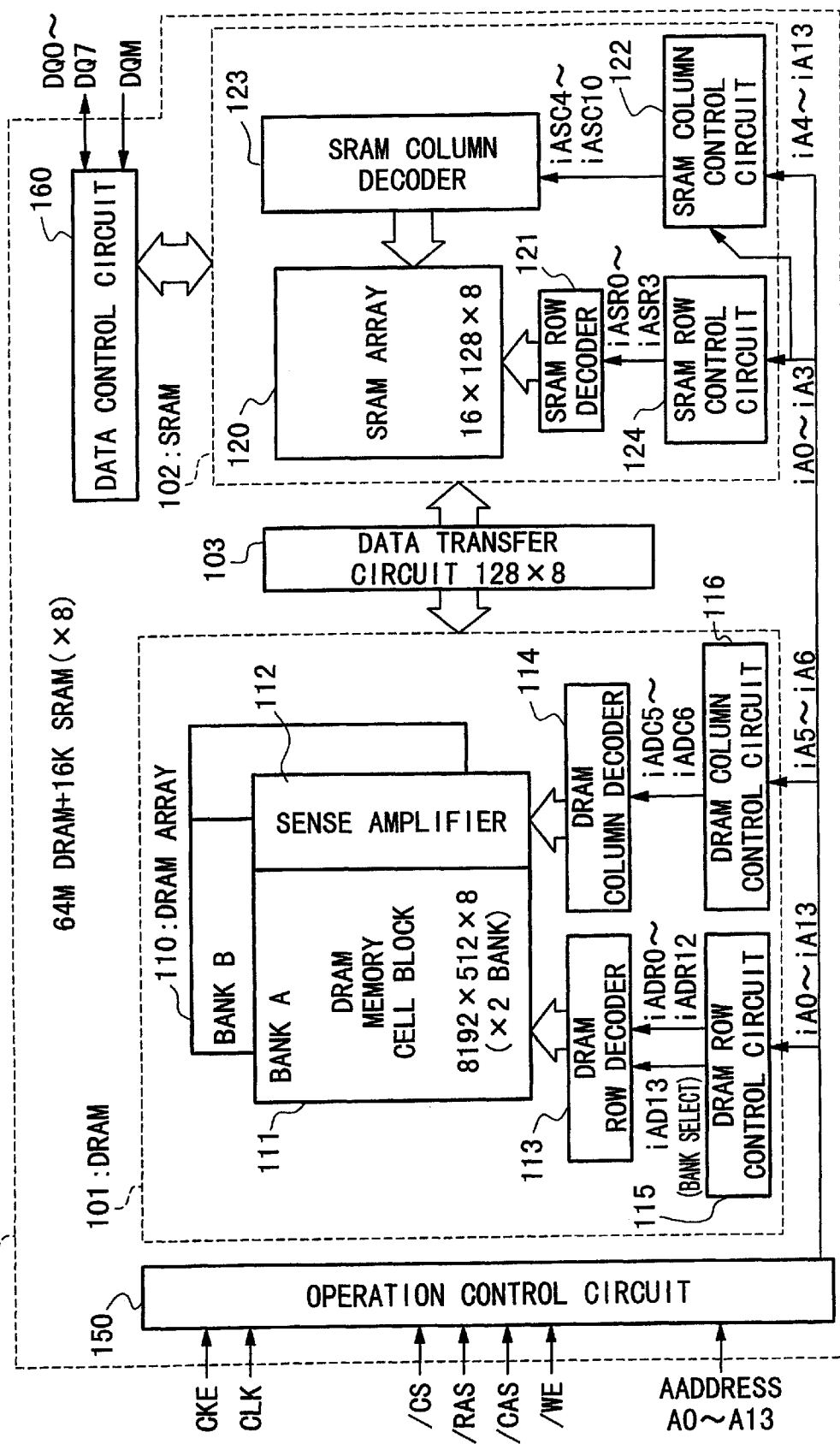
FIG. 1 is a block diagram showing an overall configuration of a semiconductor storage device in accordance with embodiment of the invention.

FIG. 1 is a block diagram diagrammatically showing an overall configuration of a semiconductor storage device 100 in accordance with the embodiment of the invention. In FIG. 1, the semiconductor storage device 100 has a main storage corresponding to a DRAM 101 and an auxiliary storage corresponding to an SRAM 102 as well as a bidirectional data transfer circuit 103. Herein, the bidirectional data transfer circuit 103 performs bidirectional data transfer between the DRAM 101 and the SRAM 102.

In the DRAM 101, a DRAM array 110 contains a number of dynamic memory cells, which are arranged in a matrix form consisting of rows and columns. A DRAM row control circuit 115 outputs a DRAM row select signal and a bank select signal based on internal address signals iA0 to iA13. Specifically, it outputs DRAM row select signals iADR0 to iADR12 and a bank select signal iAD13 to a DRAM row decoder 113. Upon receipt of those signals, the DRAM row decoder 113 selects a corresponding row of the DRAM array 110. A DRAM column control circuit 116 outputs DRAM column select signals iADC5, iADC6 to a DRAM column decoder 114 on the basis of internal address signals iA5, iA6. Upon receipt of the DRAM column select signal, the DRAM column decoder 114 selects a corresponding column of the DRAM array 110.

The DRAM array 110 contains memory cell blocks 111 and sense amplifiers 112. Herein, the sense amplifier 112 detects and amplifies data of dynamic memory cells being selected. The DRAM array 110 as a whole is divided into multiple block each called a bank. In the present embodiment, the DRAM array 110 has two banks A and B, each of which is selected by the bank select signal iAD13.

The SRAM 102 contains an SRAM array 120, in which a number of static memory cells are arranged in a matrix form consisting of rows and columns. In the SRAM 102, an SRAM row control circuit 124 produces SRAM row select signals iASR0 to iASR3 based on internal address signals iA0 to iA3. The SRAM array 120 is divided into a number of static cell blocks in connection with rows respectively. An SRAM row decoder 121 selects the static cell blocks in response to the SRAM row select signals iASR0 to iASR3 respectively. An SRAM column control circuit 122 produces SRAM control select signals iASC4 to iASC10 based on the internal address signals iA0 to iA3 and internal address signals iA4 to iA13. An SRAM column decoder 123 selects columns of the SRAM array 120 in response to the SRAM column select signals iASC4 to iASC10 respectively.

In addition, the semiconductor storage device 100 is equipped with an operation control circuit 150 and a data control circuit 160. Herein, the operation control circuit 15 receives external input signals to control operations of the semiconductor storage device 100, while the data control circuit 160 controls input and outputs of data being effected between the semiconductor storage device 100 and an external device (not shown).

The present embodiment is described such that the DRAM is used as the main storage while the SRAM is used as the auxiliary storage. Of course, this invention is not necessarily limited to the embodiment. As the main storage, it is possible to use an SRAM, mask ROM, PROM (i.e., Programmable ROM), EEPROM (i.e., Erasable Programmable ROM), EEPROM (i.e., Electrically Erasable Programmable ROM), flash EEPROM, ferroelectric memory other than the DRAM. It is preferable that a memory of the main storage is constructed to effectively use its type and specific functions. In the case where the DRAM is used as the main storage, for example, it is preferable to adequately use a general-purpose DRAM, EDODRAM (where "EDO" stands for "Extended Data Out"), synchronous DRAM, synchronous GRAM, burst EDODRAM, DDR synchronous DRAM, DDR synchronous GRAM, SLDRAM and Rambus DRAM, for example. As the auxiliary storage, it is possible to use other memories, equivalent to random-access memories of high-speed access whose speed is higher than the foregoing memory of the main storage. In the case where the main storage is configured using a flash EEPROM, it is preferable to configure the auxiliary storage to have a memory capacity, which is a half or more of capacity of one erasable sector unit of the flash EEPROM.

(3) System

The semiconductor storage device has a specific function in which it is possible to change SRAM column control modes with respect to each of the static cell blocks of the SRAM array 120 by means of the SRAM column control circuit 122, details of which will be described later. Such a function allows the setting of data input/output styles, which give a general name to wrap types, burst lengths and latencies, with respect to each of the static cell block of the SRAM array 120. So, if the data input/output styles are set to the static cell blocks in advance, the semiconductor storage device is capable of automatically designating specific data input/output style therein in response to the static cell block being selected. This eliminates necessity in data control to change over the data input/output style from the external outside of the semiconductor storage device. Or, this eliminates necessity in data processing control being performed by the external outside of the semiconductor storage device.

Figure 2:
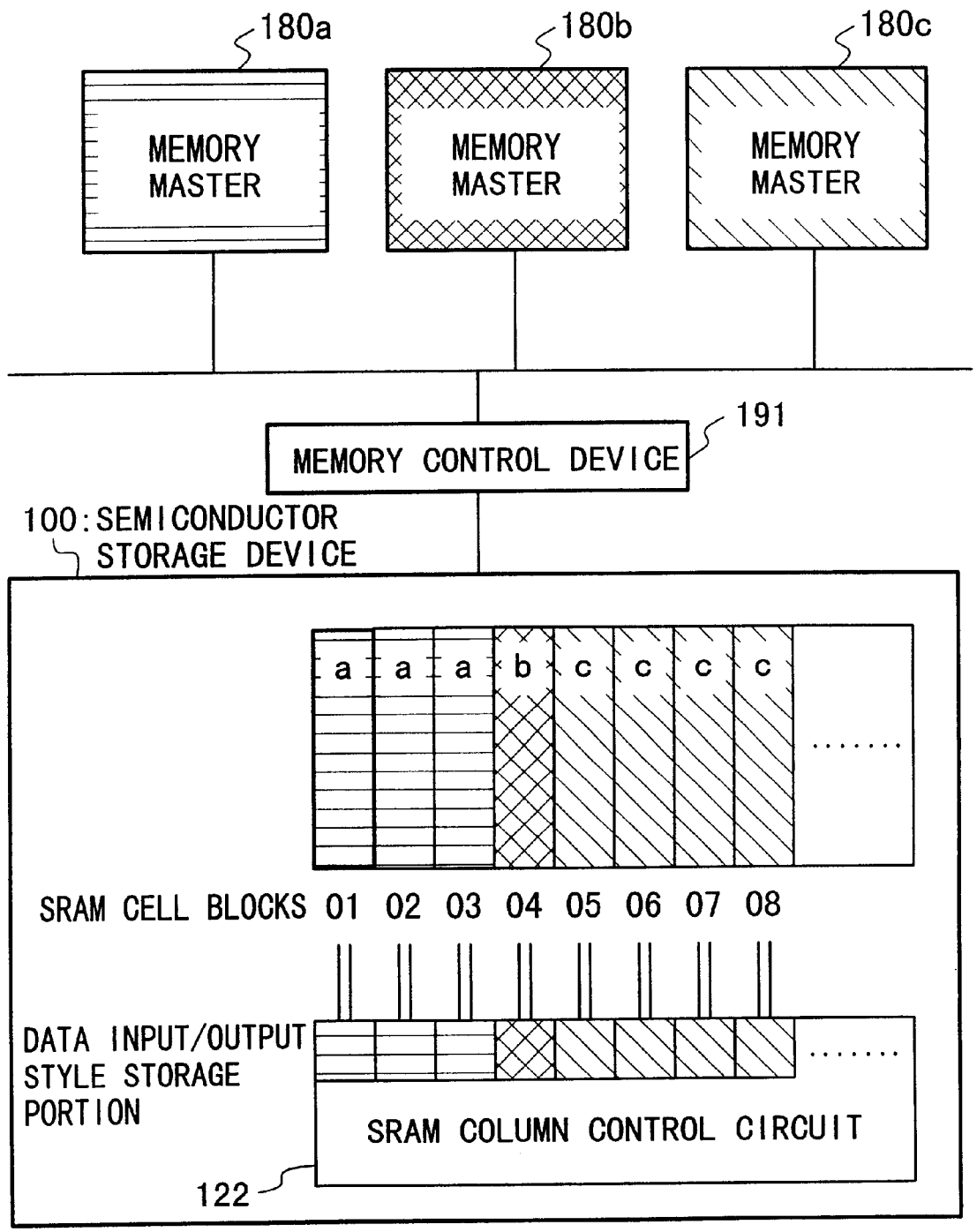
FIG. 2 is a block diagram showing an example of a memory system having memory masters for accessing the semiconductor storage device of FIG. 1.

According to this invention, the semiconductor storage device has functions to perform allocation, designation and re-designation with respect to each static cell block by each of multiple access requests. FIG. 2 shows a memory system having multiple memory masters (i.e., 180a, 180b, 180c) for performing access requests with respect to the semiconductor storage device 100 shown in FIG. 1. Incidentally, FIG. 2 shows only selected parts of the semiconductor storage device, which contain the SRAM column control circuit 122 and a number of static cell blocks. Herein, the static cell blocks are numbered as 01, 02, 03, 04, 05, 06, 07, 08 . . . . In response to an access request given from the memory master 180a, the semiconductor storage device 100 designates the static cell blocks 01, 02 and 03. In response to an access request given from the memory master 180b, the semiconductor storage device 100 designates the static cell block 04. In response to an access request given from the memory 180c, the semiconductor storage device 100 designates the static cell blocks 05, 06, 07 and 08. Incidentally, it is possible to change designation of the static cell block(s) in response to the access requests respectively. The designation can be changed at all times.

Figure 3:
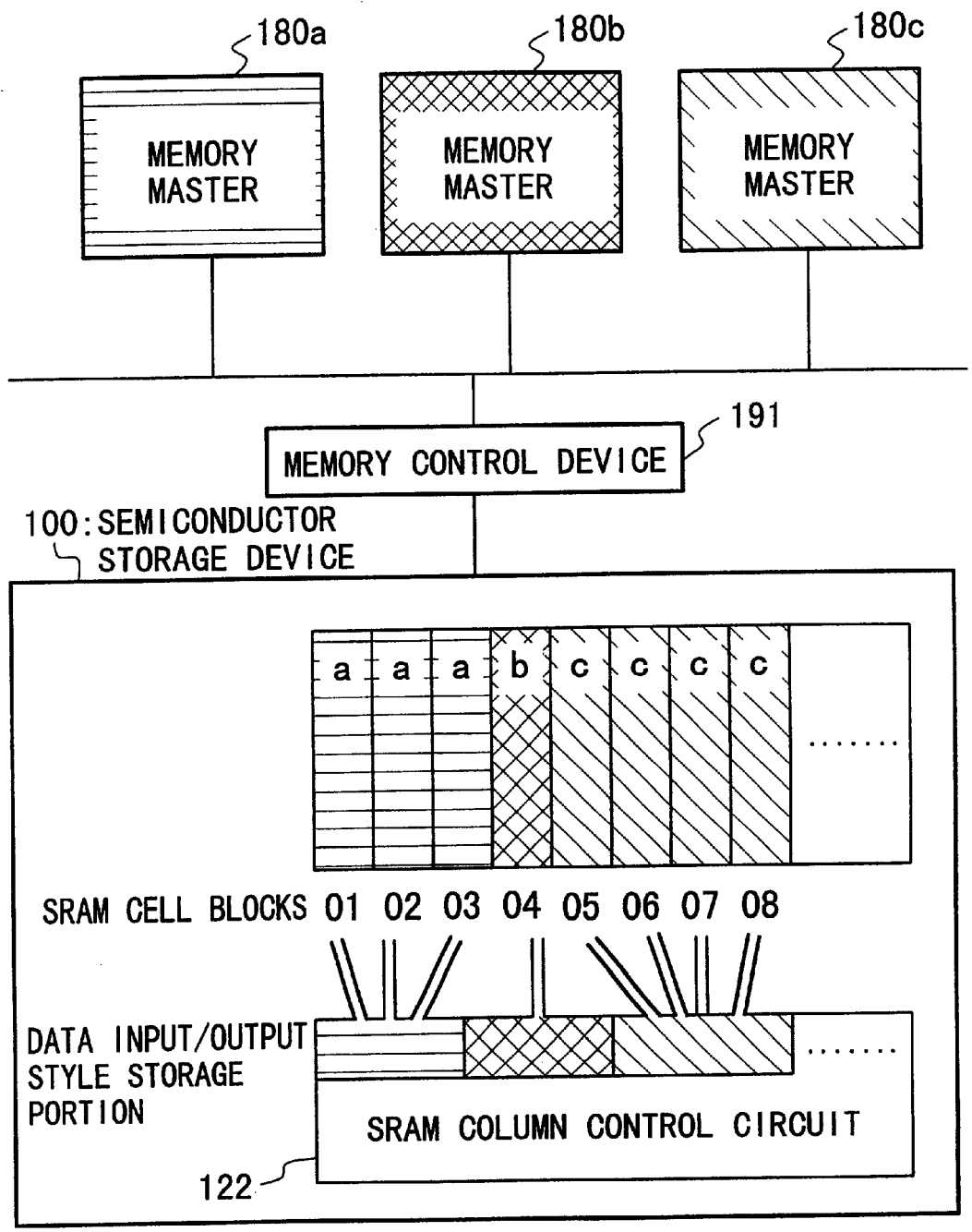
FIG. 3 is a block diagram showing another example of the memory system having memory masters for accessing the semiconductor storage device of FIG. 1.

The present embodiment is capable of coping with a situation where a data input/output style requested by the memory master 180a differs from a data input/output style requested by the memory master 180b with respect to the semiconductor storage device 100. In such a situation, it is possible to continuously perform operations with regard to input and output of data for the memory 180a as well as input and output of data for the memory master 180b without using special control signals being input. To enable the aforementioned operations, the SRAM column control circuit 122 of the semiconductor storage device 100 is equipped with data input/output style storage portions. Incidentally, the data input/output style storage portions can be provided in connection with the static cell blocks respectively in a one-by-one manner. Or, each of them is provided in connection with multiple static cell blocks as shown in FIG. 3.

(4) Pin Layout

FIG. 4 shows an example of a pin layout of a package being employed by the semiconductor storage device in accordance with the embodiment. The package is provided for the semiconductor storage device which has synchronous interfaces corresponding to configurations of two banks×8 bits together with the DRAM array of 64 Megabit and SRAM array of 16 Kilobit. Specifically, the semiconductor storage device is stored in a plastic package of TSOP type 2 of 400 mil×875 mil, wherein fifty four pins are arranged with a lead pitch of 0.8 mm. Such a pin configuration (i.e., number of pins, and a layout of pins) is identical to one normally employed by the synchronous DRAM of 64 Megabit. It is possible to employ other pin configurations in response to bit configurations of other synchronous DRAMs. In that case, the package employs a same pin configuration normally employed by the synchronous DRAM of the specific bit configuration.

The package of FIG. 4 has pins being connected with signals, definitions of which are described in connection with FIG. 1, as follows:

CLK: a (basic) clock signal, which is a reference signal for all of input signals and output signals. That is, the clock signal CLK defines timings to input signals and timings to output signals. Each of external input signals is defined in setup/hold time based on leading edges of pulses of the clock signal CLK.

CKE: a clock enable signal, which determines whether an incoming pulse of the clock signal CLK is valid or invalid. That is, if the clock enable signal CKE is High at a leading edge of a pulse of the clock signal CLK, it determines a next pulse of the clock signal CLK to be valid. If the clock enable signal CKE is Low at a leading edge of a pulse of the clock signal CLK, it determines a next pulse of the clock signal CLK to be invalid.

/CS: a chip select signal, which determines whether to accept external input signals /RAS (i.e., row address strobe), /CAS (i.e., column address strobe) and /WE (i.e., write enable). If the chip select signal /CS is Low at a leading-edge timing of a pulse of the clock signal CLK, the operation control circuit (see FIG. 1) reads in signals /RAS, /CAS and /WE being supplied thereto at the same timing. If the chip select signal /CS is High at a leading-edge timing of a pulse of the clock signal CLK, the operation control circuit 150 neglects signals /RAS, /CAS and /WE being supplied thereto at the same timing.

/RAS, /CAS, /WE: control signals, which are combined together to determine operations of the semiconductor storage device.

A0–A13: address signals, which are input to an address control circuit in response to the clock signal CLK. They are delivered to the DRAM row decoder, DRAM column decoder, SRAM row decoder and SRAM column decoder, so that they are used for selection of memory cells within the DRAM array and SRAM array. In response to internal command signals, the control signals are also input to a mode register, which will be described later. So, they are used for the setting of data input/output styles with respect to internal operations of the semiconductor storage device. In addition, they are also used for the setting of the SRAM column control circuit. Incidentally, the address signal A13 acts as a bank select signal for the DRAM array.

DQM: a data mask signal, which invalidates (or masks) input and output of data by each byte.

DQ0–DQ7: data signals, which are signals representative of input data and output data.

(5) Basic Operations

Next, a description will be given with respect to basic operations of the semiconductor storage device in accordance with the embodiment of the invention. Incidentally, the embodiment merely shows examples of commands and data (or number of data). So, it is possible to arbitrarily combine the commands and data according to needs.

FIG. 5 is a table showing an example of relationships between control signals being input from the external and commands for determining operations and functions of the semiconductor storage device in accordance with the embodiment of the invention. Herein, the table of FIG. 5 merely shows an example, so it is possible to employ any other combinations arbitrarily made of the commands and input control signals.

Specifically, FIG. 5 shows a variety of operations which are determined in connection with levels (or conditions) of the input control signals at leading-edge timings of pulses of the basic clock signal CLK. Herein, a reference symbol "H" designates a logical high level, while "L" designates a logical low level. In addition, a reference symbol "x" designates an arbitrary level, which is high or low. Within a column regarding the clock enable signal CKE, "n" denotes a present period of the basic clock signal CLK, while "n-1" denotes a preceding period of the basic clock signal CLK. So, a column of "n-1" of "CKE" shows levels of the clock enable signal CKE in the preceding period of the basic clock signal CLK with respect to commands respectively. Incidentally, the following description will refer to only the levels of the clock enable signals CKE in the preceding period "n-1" of the basic clock signal in connection with the commands respectively.

Next, the commands shown in FIG. 5 will be described below.

1. Read Command

A read command designates an operation to read out data from a static memory cell of the SRAM array 120. As shown in FIGS. 6A to 6F, levels of input control signals at a leading-edge timing of a clock pulse of the clock signal CLK are as follows:

CKE=H, /CS=L, /RAS=H, /CAS=L, /WE=H where "H" denotes a High level, while "L" denotes a Low level. At a time to input the read command, the operation control circuit 150 of the semiconductor storage device 100 inputs address signals A0 to A3 as addresses for selecting rows of the SRAM array 120 while inputting address signals A4 to A10 as addresses for selecting columns of the SRAM array 120. Then, the semiconductor storage device 100 outputs data DQ0 to DQ7 at a timing which is delayed from the timing to input the read command by a prescribed latency. However, if a data mask signal DQM is High with respect to the clock pulse corresponding to the read command, the semiconductor storage device 100 masks the data DQ0 to DQ7, which are inhibited from being output to the external.

Figure 20:
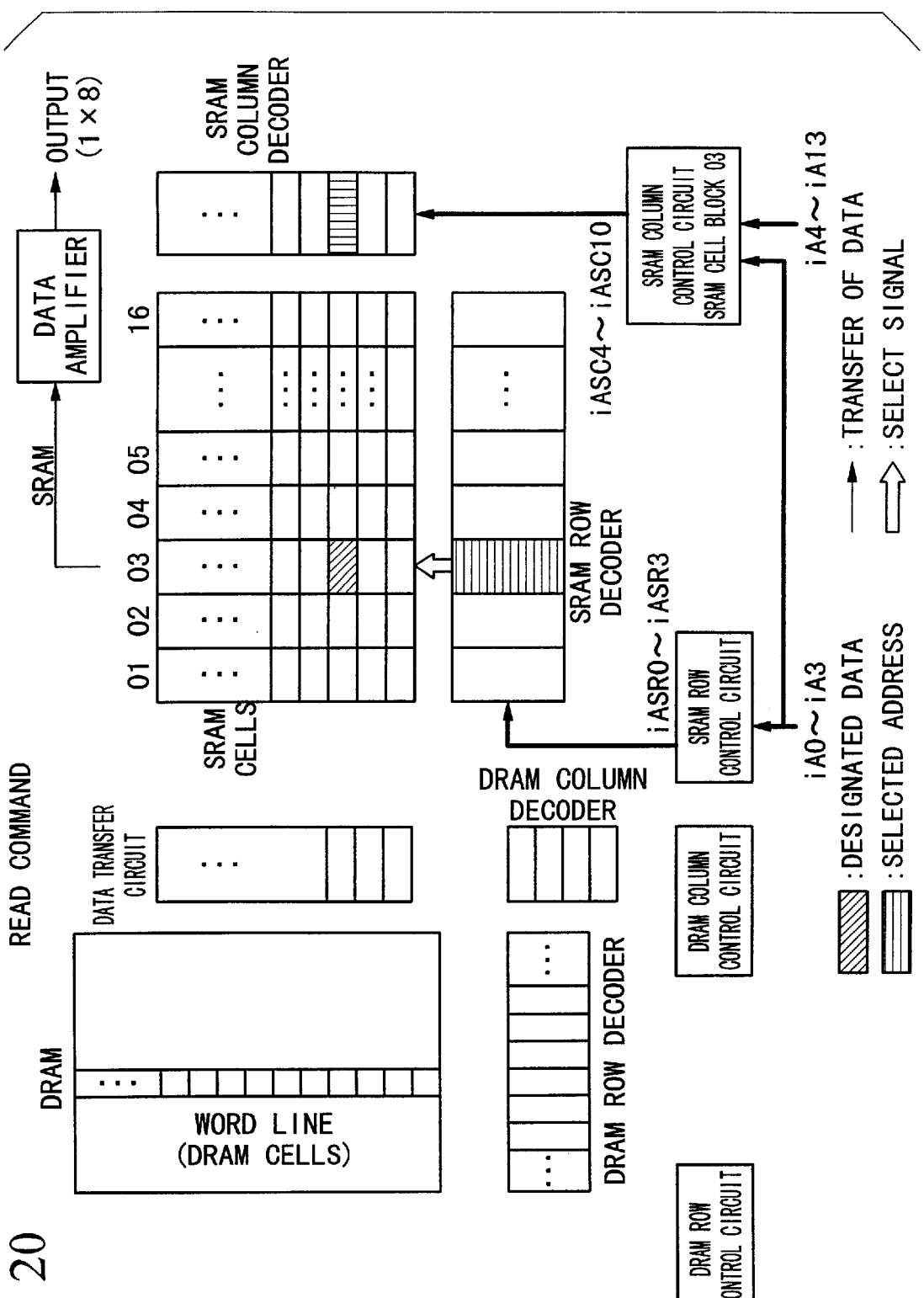
FIG. 20 is a schematic diagram showing address signals and flows of data in accordance with the read command.

FIG. 20 shows address signals and flows of data with regard to internal operations of the semiconductor storage device 100 in accordance with the read command. In response to the read command, the SRAM row decoder 121 selects rows of the SRAY array 120 based on internal address signals iA0 to iA3. In addition, the SRAM column control circuit 122 produces SRAM column select iASC4 to iASC10 based on the internal address signals iA0 to iA3 and internal address signals iA4 to iA13, so that the SRAM column decoder 123 selects columns of the SRAM array 120. Thus, static memory cells of the SRAM array 120 are selected in response to the selected rows and columns. Then, data of the static memory cells being selected are output to the external in a designated data input/output style by way of a data amplifier (not shown).

2. Write Command

A write command designates an operation to write data to a static memory cell of the SRAM array 120. As shown in FIGS. 7A to 7F, levels of input control signals at a leading-edge timing of a clock pulse of the clock signal CLK are as follows:

CKE=H, /CS=L, /RAS=H, /CAS=L, /WE=L

At a timing to input the write command, the operation control circuit 150 of the semiconductor storage device 100 inputs address signals A0 to A3 as addresses for selecting rows of the SRAM array 120 while inputting address signals A4 to A10 as addresses for selecting columns of the SRAM array 120. As writing data being written to the SRAM array 120, the semiconductor storage device 100 inputs data DQ0 to DQ7 at a timing which is delayed from the timing of the write command by a prescribed latency. However, if a data mask signal DQM is High with respect to the clock pulse for inputting the writing data, the data DQ0 to DQ7 are masked and are inhibited from being input to the semiconductor storage device 100.

Figure 21:
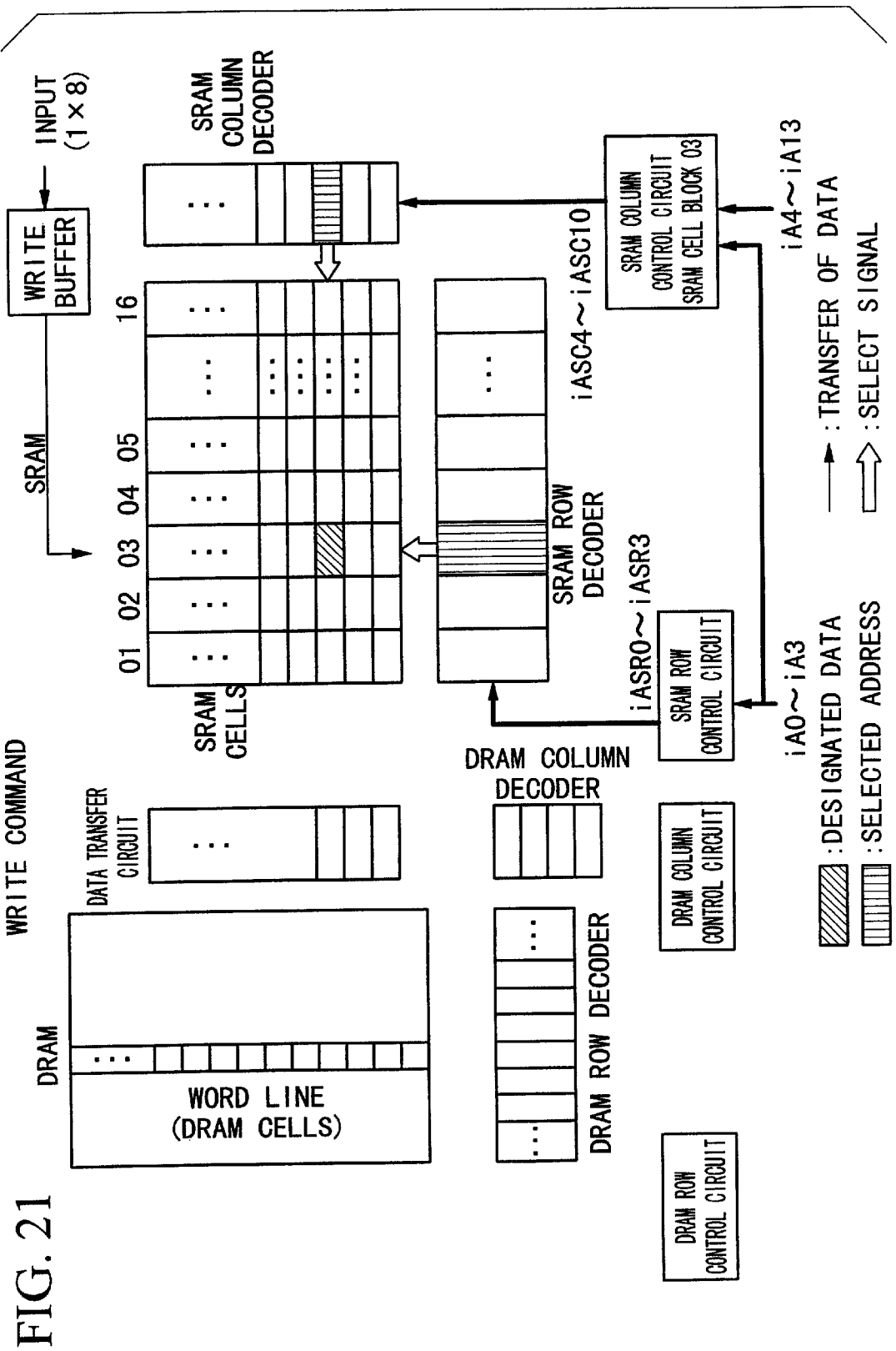
FIG. 21 is a schematic diagram showing address signals and flows of data in accordance with the write command.

FIG. 21 shows address signals and flows of data with regard to internal operations of the semiconductor storage device 100 in accordance with the write command. That is, the SRAM row control circuit 124 produces SRAM row select signals iASR0 to iASR3 based on internal address signals iA0 to iA3, so that the SRAM row decoder 121 selects rows of the SRAM array 120. In addition, the SRAM column control circuit 122 produces SRAM column select signals iASC4 to iASC10 based on the internal address signals iA0 to iA3 and internal address signals iA4 to iA13, so that the SRAM column decoder 123 selects columns of the SRAM array 120. Thus, static memory cells of the SRAM array 120 being selected in response to the selected rows and columns. Then, writing data extracted from the data DQ0 to DQ7 are written to the selected static memory cells of the SRAM array 120 by way of a write buffer (not shown).

As shown in FIGS. 20 and 21, the DRAM 101 and the data transfer circuit 103 are not at all related to read operations and write operations which are performed on the SRAM 102 in accordance with the read command and write command respectively. Therefore, the semiconductor storage device 100 is capable of performing other operations, such as internal operations of the DRAM 101 and data transfer operations between the DRAM array 110 and other static memory cells of the SRAM array 120 other than the selected static memory cells of the selected rows (and columns), during execution of the read command and write command. That is, it is possible to execute operations for the read command and write command, regardless of the other operations. In other words, the semiconductor storage device 100 is capable of performing the data transfer operations between the DRAM array 100 and the other static memory cells other than the selected static memory cells of the selected rows, or it is capable of inputting commands to operate the DRAM 101, during execution of the operations for the read command and write command.

3. Pre-Fetch Command

A pre-fetch command is a command designating transfer of data from dynamic memory cells of the DRAM array 110 to static memory cells of the SRAM array 120. As shown in FIGS. 8A to 8F, levels of input control signals at a leading-edge timing of a clock pulse of the clock signal CLK are as follows:

CKE=H, /CS=L, /RAD=H, /CAS=H, /WE=L

In addition, both of address signals A10 and A9 are Low (i.e., A10=L, A9=L). At a timing to input a pre-fetch command, the operation control circuit 150 of the semiconductor storage device 100 inputs address signals A0 to A3 as addresses for selecting rows of the SRAM array 120 while inputting address signals A5, A6 as addresses for selecting columns of the DRAM array 110. In addition, it inputs an address signal A13 as an address for selecting a band of the DRAM array 110.

Figure 22:
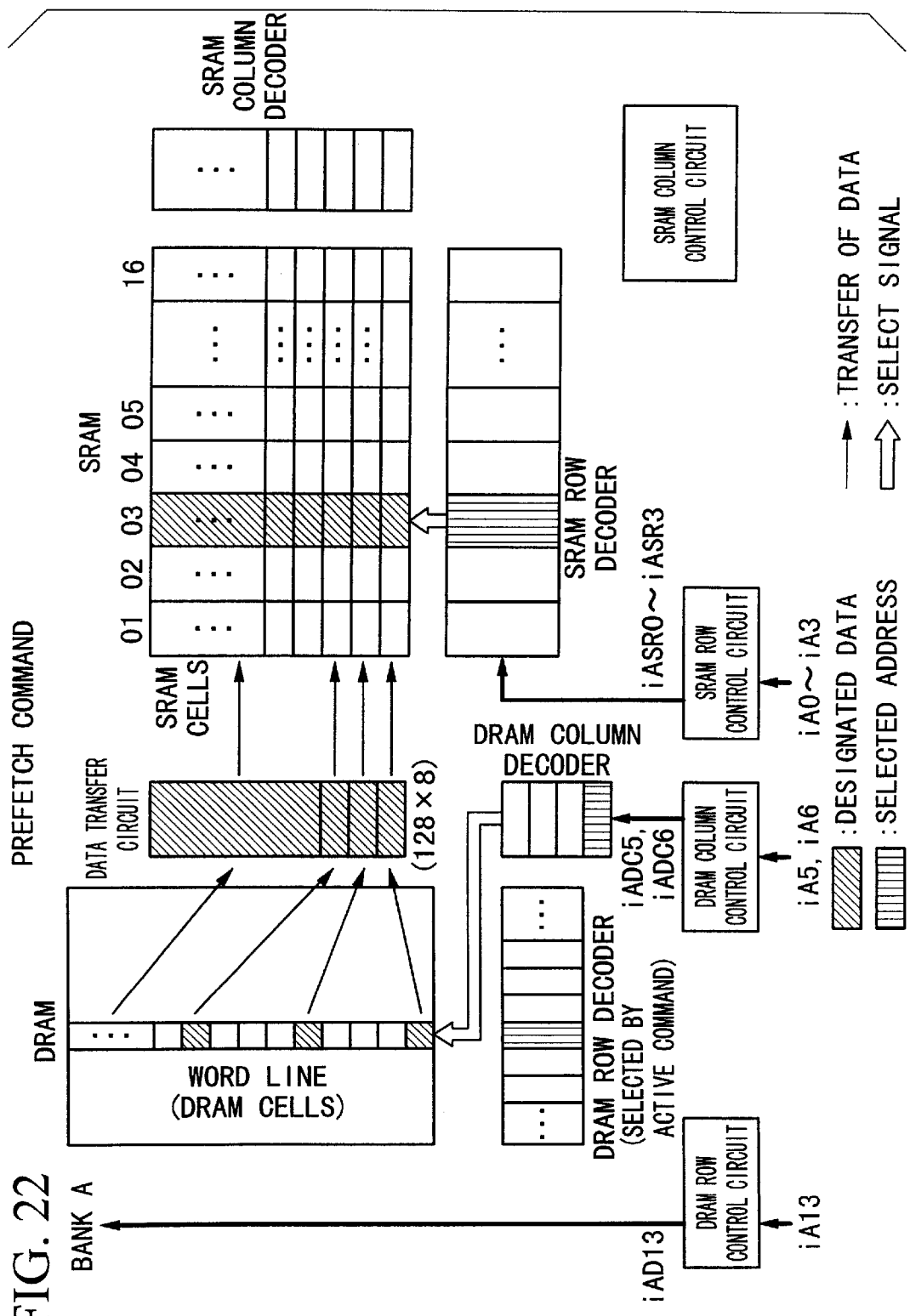
FIG. 22 is a schematic diagram showing address signals and flows of data in accordance with the pre-fetch command.

FIG. 22 shows address signals and flows of data with regard to internal operations of the semiconductor storage device 100 in accordance with the pre-fetch command. Within dynamic memory cells which have been already selected in accordance with an active command (which will be described later), the semiconductor storage device 100 selects dynamic memory cells belonging to a bank designated by an internal address signal iA13. For example, the internal address signal iA13 selects a bank A of the DRAM array 110. In addition, internal address signals iA5, iA6 selects bit lines with respect to the designated bank A of the DRAM array 110. Herein, data of bit lines are amplified by the sense amplifier 112 at the active command. Thus, data of the selected bit lines are transmitted onto a data transfer bus by way of the data transfer circuit 103. In the SRAM array 120, static memory cells of rows being selected by internal address signals iA0 to iA3 stop retaining previous data thereof, so that they read in data transmitted thereto from the data transfer bus. Then, they store the transmitted data. Herein, the data are output from the sense amplifier 112 onto the data transfer bus by way of the data transfer circuit 103. Outputting the above data onto the data transfer bus is terminated when data transfer is completed. Incidentally, the present embodiment is capable of transferring multiple data, a number of which is 128×8, at once in accordance with the pre-fetch command.

4. Pre-Fetch Command Accompanied with Auto Pre-charge

This pre-fetch command is a command designating transfer of data from dynamic memory cells of the DRAM array 110 to the static memory cells of the SRAM array 120, wherein after completion of data transfer, precharge to the DRAM 101 is automatically carried out. As shown in FIGS. 9A to 9F, levels of input controls signals at a leading-edge timing of a clock pulse of the clock signal CLK are as follows:

CKE=H, /CS=L, /RAS=H, /CAS=H, /WE=L

In addition, address signals A10 and A9 are High and Low respectively (i.e., A10=H, A9=L). A similar to the aforementioned pre-fetch command, at a timing to input a pre-fetch command with auto precharge, the operation control circuit 150 of the semiconductor storage device 100 inputs address signals A0 to A3 as addresses for selecting rows of the SRAM array 120 while inputting address signals A5, A6 as addresses for selecting columns of the DRAM array 110. In addition, it inputs an address signal A13 as an address for designating a bank of the DRAM array 110.

Next, a description will be given with respect to address signals and flows of data with regard to internal operations of the semiconductor storage device 100 in accordance with the pre-fetch command with auto precharge. Within dynamic memory cells of the DRAM array 110 which have been already selected by an active command (which will be described later), the semiconductor storage device 100 selects dynamic memory cells belonging to a bank which is designated by an internal address signal iA13. In addition, internal address signals iA5, iA6 select bit lines with respect to the designated bank of the DRAM array 110. Data of bit lines are amplified by the sense amplifier 112 at the active command. So, data of the selected bit lines are transmitted to the data transfer bus by way of the data transfer circuit 103. In the SRAM array 120, static memory cells of the rows selected by the internal address signals iA0 to iA3 stop retaining previous data thereof, but they read in the data transmitted thereto by way of the data transfer circuit 103. Then, they store the transmitted data. Herein, the data are output from the sense amplifier 112 onto the data transfer bus by way of the data transfer circuit 103. Outputting the data is terminated when data transfer is completed. Then, after a lapse of a prescribed time, the semiconductor storage device 100 stops selecting word lines of the DRAM array 110. Thus, the semiconductor storage device 100 performs internal operations (i.e., equalization of electric potentials between bit lines and sense amplifiers), contents of which will be described later in connections with a precharge command. After a lapse of a predetermined time from a timing to input the precharge command, the DRAM 101 is automatically placed in a precharge condition (or non-selection condition).

5. Restore Command

A restore command is a command designating transfer of data from static memory cells of the SRAM array 120 to dynamic memory cells of the DRAM array 110. The restore command is a continuously input command in a duration between leading edges CLK1 and CLK2 of the clock signal CLK, which is shown in FIG. 10A. As shown in FIGS. 10A to 10F, levels of input control signals at leading-edge timings of the clock signal CLK are as follows:

CKE=H, /CS=L, /RAS=H, /CAS=H, /WE=L

In addition, address signals A10 and A9 are Low and High respectively (i.e., A10=L, A9=H).

At a first leading-edge timing CLK1, the operation control circuit 150 of the semiconductor storage device 100 inputs address signals A0 to A3 as addresses for selecting rows of the SRAM array 120 while inputting address signals A5, A6 as addresses for selecting columns of the DRAM array 110. At a second leading-edge timing CLK2, the operation control circuit 150 of the semiconductor storage device 100 inputs address signals A0 to A12 as addresses for selecting rows of the DRAM array 110, which match with transfer destinations. At each of the leading-edge timings CLK1, CLK2, the operation control circuit 150 inputs an address signal A13 as an address for selecting a bank of the DRAM array 110. Incidentally, an address of A13 being input at CLK1 should coincide with an address of A13 being input at CLK2.

Figure 23:
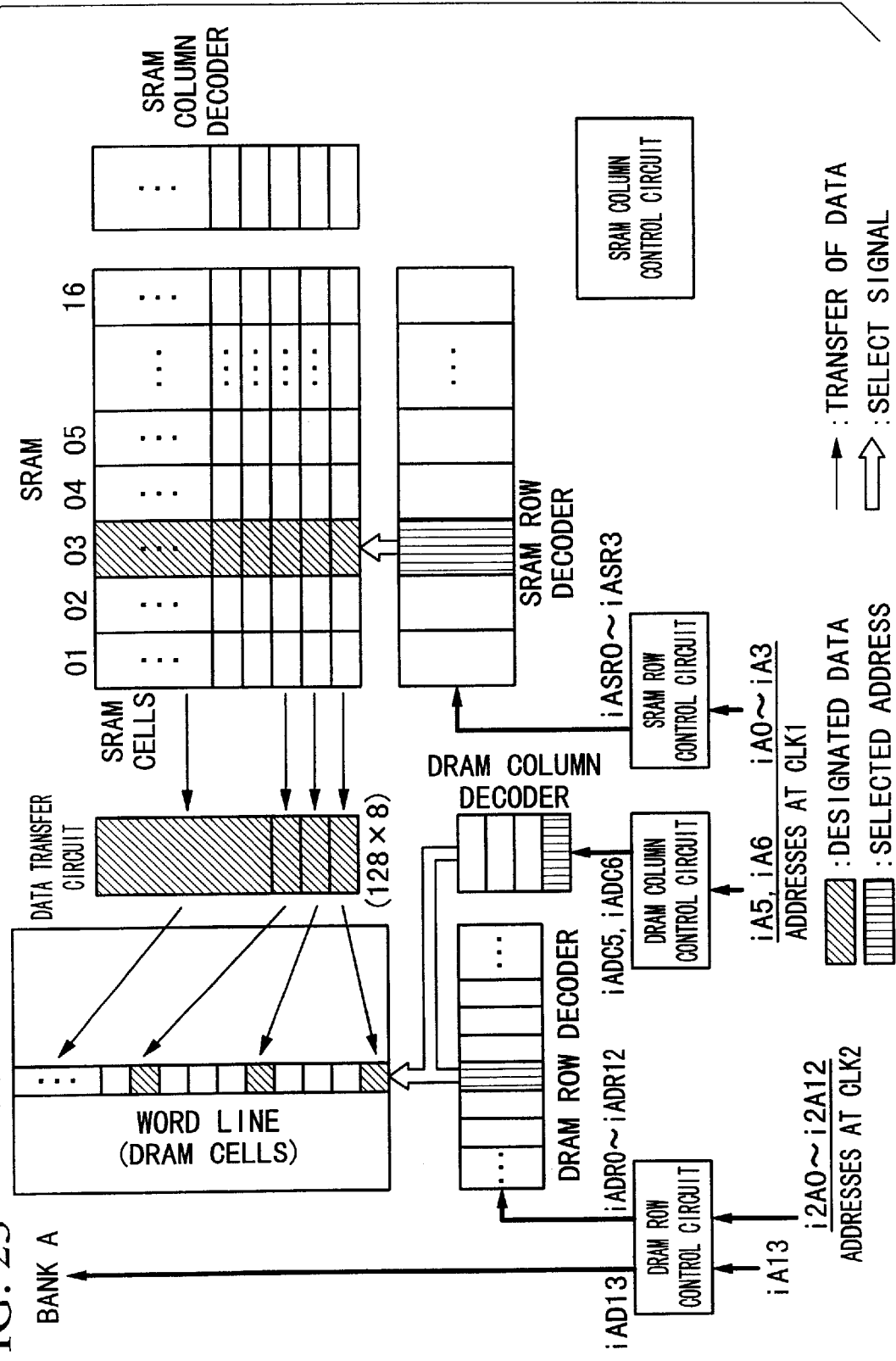
FIG. 23 is a schematic diagram showing address signals and flows of data in accordance with the restore command.

FIG. 23 shows address signals and flows of data with regard to internal operations of the semiconductor storage device 100 in accordance with the restore command. FIG. 23 shows that same internal address signals are designated by different reference symbols with respect to the clock pulses CLK1, CLK2 respectively. That is, reference symbols i1A0 to i1A12 designate internal address signals with respect to the first clock pulse CLK1, while reference symbols i2A0 to i2A12 designate internal address signals with respect to the second clock pulse CLK2. Static memory cells of the SRAM array 120 are selected by the internal address signals i1A0 to i1A3, which the operation control circuit 150 produces based on addresses at the first clock pulse CLK1. So, data of the static memory cells being selected are transmitted onto a data transfer bus connected with a bank, which is selected by the internal address signal iA13. Then, the data are supplied to bit lines of the DRAM array 110, which are selected by the internal address signals i1A5, i1A6.

Thereafter, word lines of the DRAM array 110 are selected by the internal address signals i2A0 to i2A12, which the operation control circuit 150 produces based on addresses at the second clock pulse CLK2, as well as the internal address signal iA13. So, data of dynamic memory cells connected with the selected word lines are output onto corresponding bit lines. The sense amplifiers (112) respectively corresponding to the bit lines detect and amplify the data of the dynamic memory cells being output onto the bit lines respectively. Herein, the sense amplifiers corresponding to the bit lines selected by the internal address signals i1A5, i1A6 detect and amplify writing data being transmitted thereto by way of the data transfer bus. Herein, the writing data are output onto the bit lines of the DRAM array 110 by way of the data transfer bus. Outputting the writing data is stopped when word lines are increased in electric potentials. In accordance with the restore command, the present embodiment is capable of transferring multiple sets of data, a number of which is 128×8, at once.

6. Restore Command with Auto Precharge

A restore command accompanied with auto precharge is a command designating transfer of data from static memory cells of the SRAM array 120 to dynamic memory cells of the DRAM array 110, wherein after completion of data transfer, precharge to the DRAM array 110 is automatically performed. As shown in FIGS. 11A to 11F, levels of input control signals at leading-edge timings of clock pulses CLK1, CLK2 of the clock signals CLK are as follows:

CKE=H, /CS=L, /RAS=H, /CAS=H, /WE=L

In addition, both of address signals A10, A9 are High (i.e., A10=H, A9=H).

At the leading-edge timing of the first clock pulse CLK1, the operation control circuit 150 inputs address signals A0 to A3 as addresses for selecting rows of the SRAM array 120 while inputting address signals A5, A6 as addresses for selecting columns of the DRAM array 110. At the leading-edge timing of the second clock pulse CLK2, the operation control circuit 150 inputs address signals A0 to A12 as addresses for selecting rows of the DRAM array 110, which are transfer destinations. At each of the leading-edge timing of the clock pulses CLK1, CLK2, the operation control circuit 150 inputs an address signal A13 as an address for selecting a bank of the DRAM array 110. Incidentally, an address of A13 at CLK1 should coincide with an address of A13 at CLK2.

Next, address signals and flows of data will be described with regard to internal operations of the semiconductor storage device 100 in accordance with the restore command with auto precharge. Static memory cells of the SRAM array 120 are selected by internal address signals i1A0 to i1A3, which the operation control circuit 150 produces based on address signals at the first clock pulse CLK1. So, data of the static memory cells being selected are transmitted onto a data transfer bus connected with a bank being selected by an internal address signal iA13. Then, the data on the data transfer bus are sent onto bit lines of the DRAM array 110, which are selected by internal address signals i1A5, i1A6. Thereafter, word lines of the DRAM array 110 are selected by internal address signals i2A0 to i2A12, which are produced based on address signals at the second clock pulse CLK2, as well as the internal address signal iA13. So, data of dynamic memory cells being connected with the selected word lines are output onto corresponding bit lines.

Sense amplifiers respectively correspondingly to the bit lines detect and amplify the data of the dynamic memory cells being output onto the bit lines respectively. Sense amplifiers corresponding to the bit lines being selected by the internal address signals i1A5, i1A6 detect and amplify writing data, which are transmitted thereto by way of the data transfer bus. Herein, the writing data are output onto the bit lines of the DRAM array 110 by way of the data transfer bus. Outputting the writing data is stopped when the word lines are increased in electric potentials. Then, after a lapse of a predetermined time, the word lines are inactivated (or not selected). So, the semiconductor storage device 100 performs prescribed internal operations designated by a precharge command, which will be described later. That is, it performs equalization between the bit lines and sense amplifiers in electric potentials. After a lapse of a prescribed time from the precharge command, the DRAM 101 is automatically placed in a non-selection (or precharge) condition.

7. Active Command

An active command is a command designating activation of a designated bank in the DRAM array 110. As shown in FIGS. 12A to 12F, levels of input control signals at a leading-edge timing of a clock pulse of the clock signal CLK are as follows:

CKE=H, /CS=L, /RAS=L, /CAS=H, /WE=H

At a timing to input the active compound, the operation control circuit 150 inputs an address signal A13 as an address for designating a bank of the DRAM array 110 while inputting address signals A0 to A12 as addresses for selecting rows of the DRAM array 110.

Figure 24:
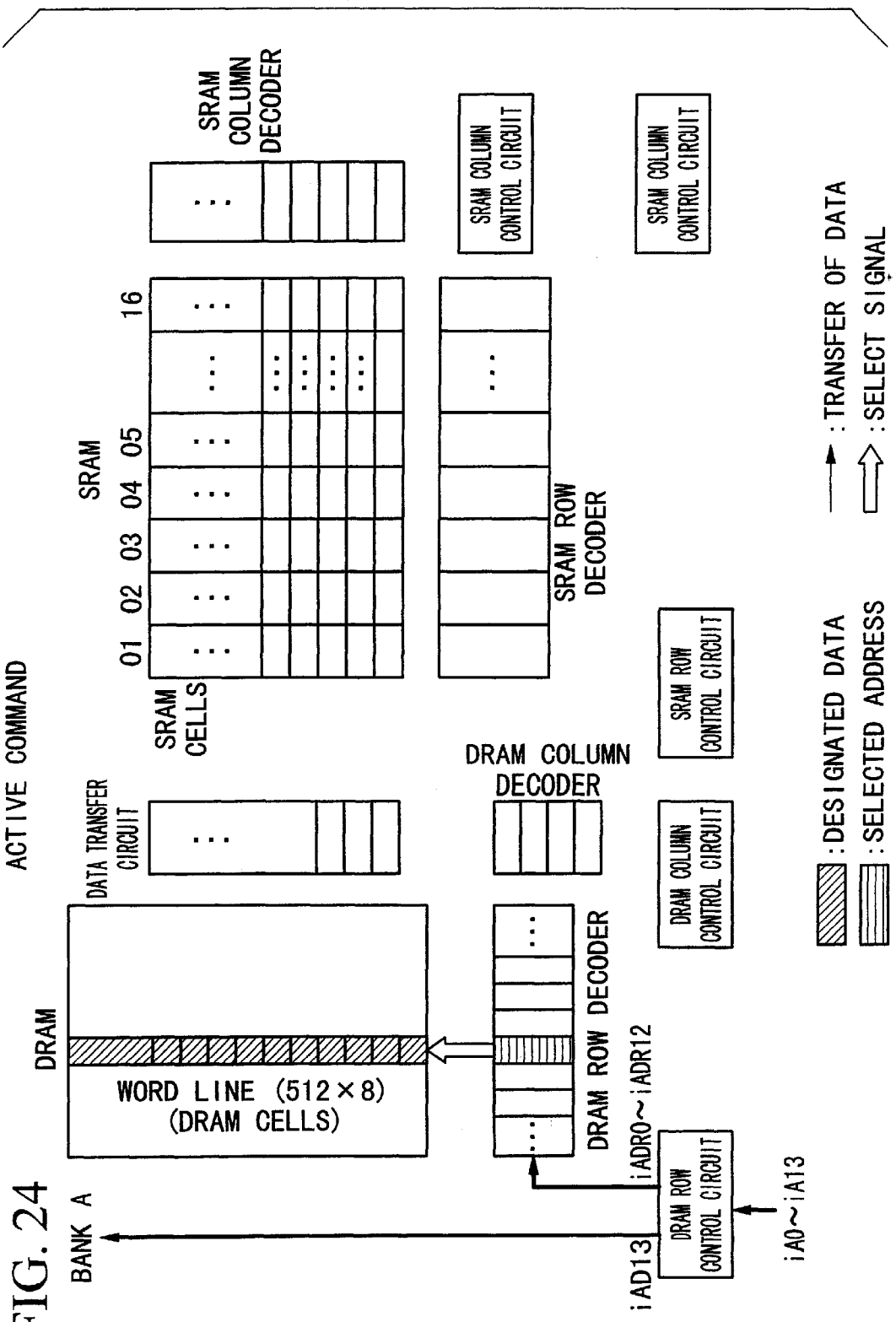
FIG. 24 is a schematic diagram showing address signals and flows of data in accordance with the active command.

FIG. 24 shows address signals and flows of data with regard to internal operations of the semiconductor storage device 100 in accordance with the active command. Herein, internal address signals iA0 to iA12 select word lines in the bank designated by an internal address signal iA13 within the DRAM array 110. So, data of dynamic memory cells being connected with the selected word lines are output onto corresponding bit lines. Sense amplifiers respectively corresponding to the bit lines detect and amplify the data of the dynamic memory cells being output onto the bit lines. In accordance with the active command, the present embodiment is capable of amplifying multiple sets of data, a number of which is 512×8, at once.

In order to perform selection of other word lines with respect to the bank which have been already activated (or designated), the semiconductor storage device 100 performs precharge to the bank to establish a precharge condition. So, it is necessary to enter a new active command with respect to the bank in the precharge condition. Incidentally, this command is equivalent to the control signal /RAS which is Low in the normal DRAM.

8. Precharge Command

A precharge command is a command designating precharge (or inactivation) to a bank being designated within the DRAM array 110. As shown in FIGS. 13A to 13F, levels of input control signals at a leading-edge timing of a clock pulse of the clock signal CLK are as follows:

CKE=H, /CS=L, /RAS=L, /CAS=H, /WE=L

At timing to input the precharge command, an address signal A10 is Low, and an address signal A13 is "valid data". In that case, the semiconductor storage device 100 performs precharge (or non-selection) to a bank being designated by an address signal A13. Herein, the bank to be designated coincides with one which has been already designated in response to an active command, which the semiconductor storage device 100 inputs before inputting the precharge command. Therefore, if the semiconductor storage device 100 does not input an active command before inputting the precharge command with respect to the bank being designated by the precharge command, the precharge command is invalidated.

Next, address signals and flows of data will be described with regard to internal operations of the semiconductor storage device 100 in accordance with the precharge command. Within the bank of the DRAM array 110 being selected by an internal address signal iA13, word lines originally being activated are subjected to non-selection condition. Then, the semiconductor storage device 100 performs equalization between bit lines and sense amplifiers in electric potentials. After completion of the internal operations for the precharge command, the designated bank is placed in a standby condition to wait for inputting a next active command. Incidentally, this command is equivalent to a control signal /RAS which is High in the normal DRAM.

9. Full Bank Precharge Command

A full bank precharge command is a command designating precharge (or inactivation) to all the banks of the DRAM array 110. By executing the command, the DRAM 101 as a whole is set in a full precharge condition to allow termination of activated conditions of all banks. As shown in FIGS. 14A to 14F, levels of input control signals at a leading-edge timing of a clock pulse of the clock signal CLK are as follows:

CKE=H, /CS=L, /RAS=L, /CAS=H, /WE=L

In addition, an address signal A10 is high.

Next, address signals and flows of data will be described with regard to internal operations of the semiconductor storage device 100 in accordance with the full bank precharge command. That is, all of selected word lines of the DRAM array 110 are subjected to non-selection conditions. Then, the semiconductor storage device 100 performs equalization between bit lines and sense amplifiers in electric potentials. After completion of the internal operations for the full bank precharge command, all of the banks are placed in standby conditions to wait for inputting a next active command. This command is equivalent to a control signal /RAS which is High in the normal DRAM.

10. CBR Refresh Command

A CBR refresh command is a command to refresh data of dynamic memory cells of the DRAM array 110. The semiconductor storage device 100 automatically generates address signals, which are required for refreshing the data, therein. As shown in FIGS. 15A to 15F, levels of input control signals at a leading-edge timing of a clock pulse of the clock signal CLK are as follows:

CKE=H, /CS=L, /RAS=L, /CAS=L, /WE=H

Next, address signals and flows of data will be described with regard to internal operations of the semiconductor storage device 100 in accordance with the CBR refresh command. Herein, the semiconductor storage device 100 automatically generates internal address signals iA0 to iA12 and iA13 therein. The internal address signal iA13 designates a bank of the DRAM array 110, while the internal address signals iA0 to iA12 select word lines of the DRAM array 110. Within the bank of the DRAM array 110, data of dynamic memory cells connected with the selected word lines are output onto corresponding bit lines respectively. Sense amplifiers respectively corresponding to the bit lines detect and amplify the data of the dynamic memory cells being output onto the bit lines. Then, amplified data are rewritten to the dynamic memory cells by way of the bit lines which are detected by the sense amplifiers. After a lapse of a predetermined time, the word lines are subjected to non-selection conditions. Then, the semiconductor storage device 100 performs equalization between bit lines and sense amplifiers in electric potential. Thus, a series of operations of the refresh command are completed.

11. Non-Operation Command

A non-operation command were CKE=H, /CS=L, /RAS=H, /CAS=H and /WE=H at a leading edge of a clock pulse of the clock signal CLK (see FIGS. 16A–16F) is not an executable command.

12. Device Non-Selection Command

A device non-selection command were CKE=H and /CS=H at a leading edge of a clock pulse of the clock signal CLK (see FIGS. 17A–17C) is not an executable command.

13. Register Setting Commands

Register setting commands are commands to set prescribed data to registers with respect to operation modes respectively. As shown in FIGS. 18A–18F and FIGS. 19A–19F, levels of input control signals at a leading-edge timing of a clock pulse of the clock signal CLK are as follows:

CKE=H, /CS=L, /RAS=L, /CAS=L, /WE=L

At a timing to input the register setting command, the semiconductor storage device 100 inputs valid data of A0 to A13 as setting data for a certain operation mode. For the purpose of initial setting of the semiconductor storage device 100 supplied with electric power, it is necessary to set prescribed data to registers in accordance with the register setting command.

Next, brief description will be given with respect to parts of operations of the semiconductor storage device in accordance with the present embodiment.

(a) Read operation of data from SRAM in response to designation made by the external As shown in FIG. 20, data are designated only by a read command and are output to the external by way of the data amplifier.

(b) Read operation of data from SRAM without designation made by the external

After completion of an active command as shown in FIG. 24, the device executes a pre-fetch command (see FIG. 22), so that data are transferred to the SRAM. Next, as shown in FIG. 20, the data are designated and are output to the external by way of the data amplifier in accordance with the read command.

(c) Read operation of data from SRAM without designation made by the external while write data remain being not restored As shown in FIG. 23, write data are transferred to DRAM by a restore command. Then, the device executes an active command (see FIG. 24) and a pre-fetch command (see FIG. 22), so that the data are transferred to the SRAM. Next, as shown in FIG. 20, the data are designated and are output to the external by way of the data amplifier in accordance with a read command.

(6) Layout

1. Overall Layout

FIG. 26 shows an overall layout of a chip employing the semiconductor storage device in accordance with the embodiment of the invention. The semiconductor storage device of FIG. 26 has configurations of two banks×8 bits, which contain a DRAM array of 64 Megabit and an SRAM array of 16 Kilobit, as well as synchronous interfaces. Of course, this invention is not necessarily limited to the aforementioned configurations.

As shown in FIG. 26, a cross-shaped area made of a longitudinal center portion and a lateral center portion is formed on the chip. That is, an overall area of the chip is divided into four sections by the cross-shaped area. Four DRAM arrays (i.e., 110-1, 110-2, 110-3, 110-4) are arranged in the four sections respectively. Each of the four DRAM arrays has a storage capacity of 16 Megabit, so there is provided a total storage capacity of 64 Megabit. Each of the DRAM arrays 110-1, 110-2 is equipped with a DRAM row decoder 113, which is arranged to adjoin a lower end of each DRAM array. Similarly, each of the DRAM arrays 110-3, 110-4 is equipped with a DRAM row decoder 113, which is arranged to adjoin an upper end of each DRAM array. A set of an SRAM array 120-1, and SRAM row decoder 121 and an SRAM column decoder 123 are arranged between the DRAM arrays 110-1 and 110-2. Herein, the SRAM array 120-1 is provided in connection with the DRAM arrays 110-1, 110-2. Similarly, a set of an SRAM array 120-2, an SRAM row decoder 121 and an SRAM column decoder 123 are arranged between the DRAM arrays 110-3 and 110-4. Herein, the SRAM array 120-2 is provided in connection with the DRAM arrays 110-3, 110-4. A data transfer bus that performs data transfer between selected dynamic memory cells and selected static memory cells is arranged in a lateral direction to traverse on the chip to enable data transfer among the DRAM array 110-1, SRAM array 120-1 and DRAM array 110-2. Similarly, another data transfer bus is arranged in a lateral direction to transverse on the chip to enable data transfer among the DRAM array 110-3, SRAM array 120-2 and DRAM array 110-4. Incidentally, the foregoing operation control circuit and other data control circuits are arranged in other areas of the chip of FIG. 26. In addition, input/output signal terminals for communicating with the external are arranged in a lateral center portion of the chip in the present embodiment. Of course, this invention is not necessarily limited to the present embodiment with respect to arrangement and locations of the terminals.

In case of FIG. 26, a main storage has two-bank configurations, so that two DRAM arrays are being simultaneously selected. That is, the DRAM arrays 110-1, 110-4 are simultaneously selected in response to a bank A being selected, while the DRAM arrays 110-2, 110-3 are simultaneously selected in response to a bank B being selected.

(7) Detailed Descriptions of Circuit Blocks

Next, detailed descriptions will be given with respect to circuit blocks shown in the block diagram of FIG. 1.

The following descriptions merely show examples, so this invention is not necessarily limited to those examples.

1. Operation Control Circuit

Figure 27:
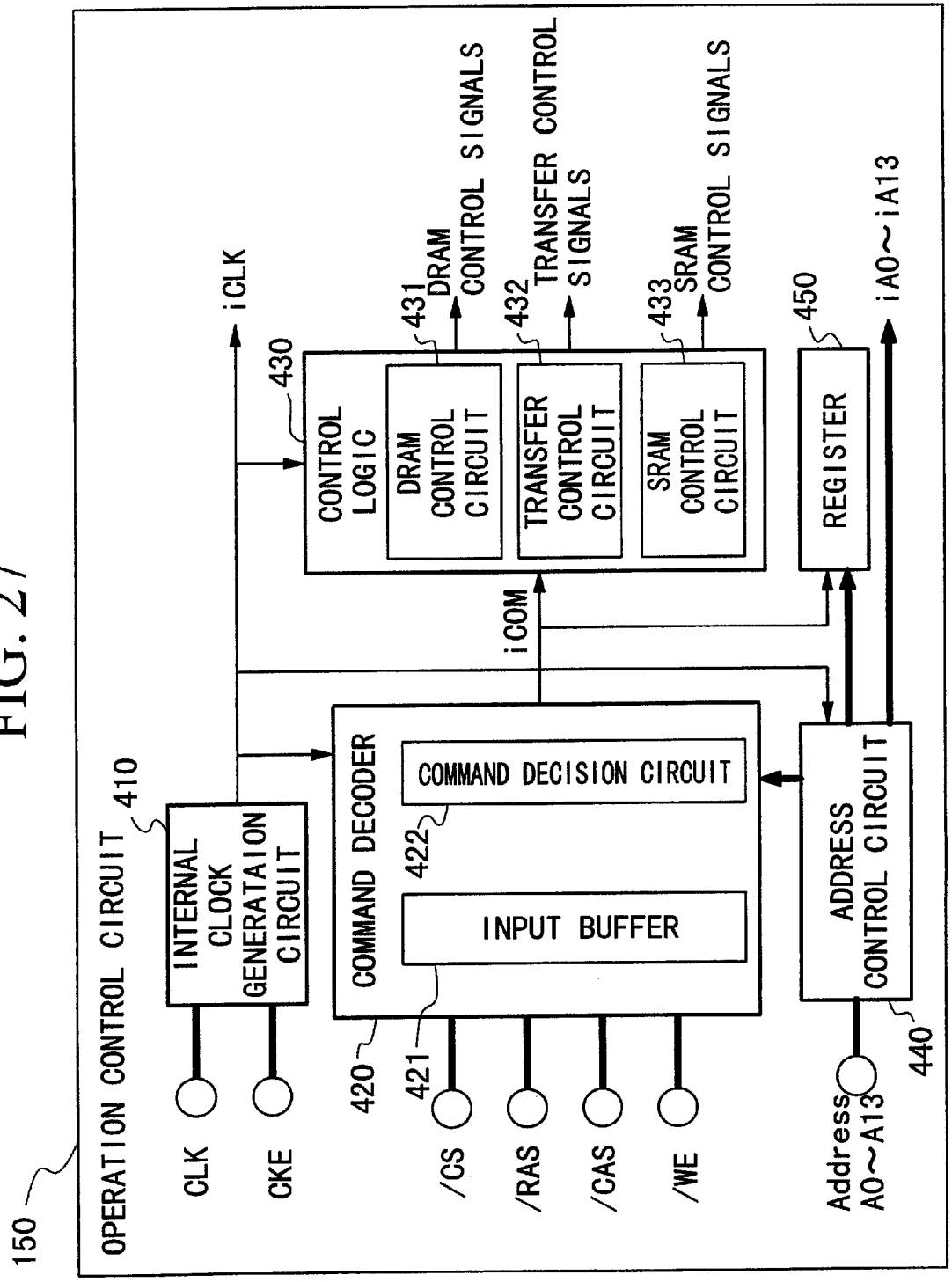
FIG. 27 is a block diagram showing an internal configuration of an operation control circuit shown in FIG. 1.

FIG. 27 is a block diagram showing an internal configuration of the operation control circuit 150 shown in FIG. 1. The operation control circuit 150 is basically configured by an internal clock generation circuit 410, a command decoder 420, a control logic 430, an address control circuit 440 and a mode register 450. The internal clock generation circuit 410 generates an internal clock signal iCLK based on the clock signal CLK and clock enable signal CKE which are given from the external. The internal clock signal iCLK is delivered to the command decoder 420, control logic 430, address control circuit 440 and other data control circuits so as to perform timing controls on them.

The command decoder 420 contains an input buffer 421 for inputting the foregoing input control signals and a command decision circuit 422. In synchronization with pulses of the internal clock signal iCLK, the command decision circuit 422 receives input control signals /CS, /RAS, /CAS, /WE and address signals so as to produce an internal command signal iCOM. Herein, the command decision circuit 422 responds to the aforementioned input signals to issue commands, which are shown in the foregoing table of FIG. 5. The control logic 430 receives the internal command signal iCOM and internal clock signal iCLK as well as a register signal iREG. So, the control logic 430 produces control signals, which are required to perform operations being designated by the aforementioned signals input thereto.

The control logic 430 is divided into three blocks, i.e., a DRAM control circuit 431, a transfer control circuit 432 and an SRAM control circuit 433, which produce control signals respectively. The register 450 has a function to store data being defined by a combination of specific addresses when it receives a specific register write signal being given from the command decision circuit 422. Therefore, the register 450 retains the stored data thereof until it receives a new register write signal. Incidentally, the operation control circuit 150 refers to the stored data of the register 450 when the control logic 430 operates.

2. DRAM (i) DRAM and Data Transfer Circuit

Figure 28:
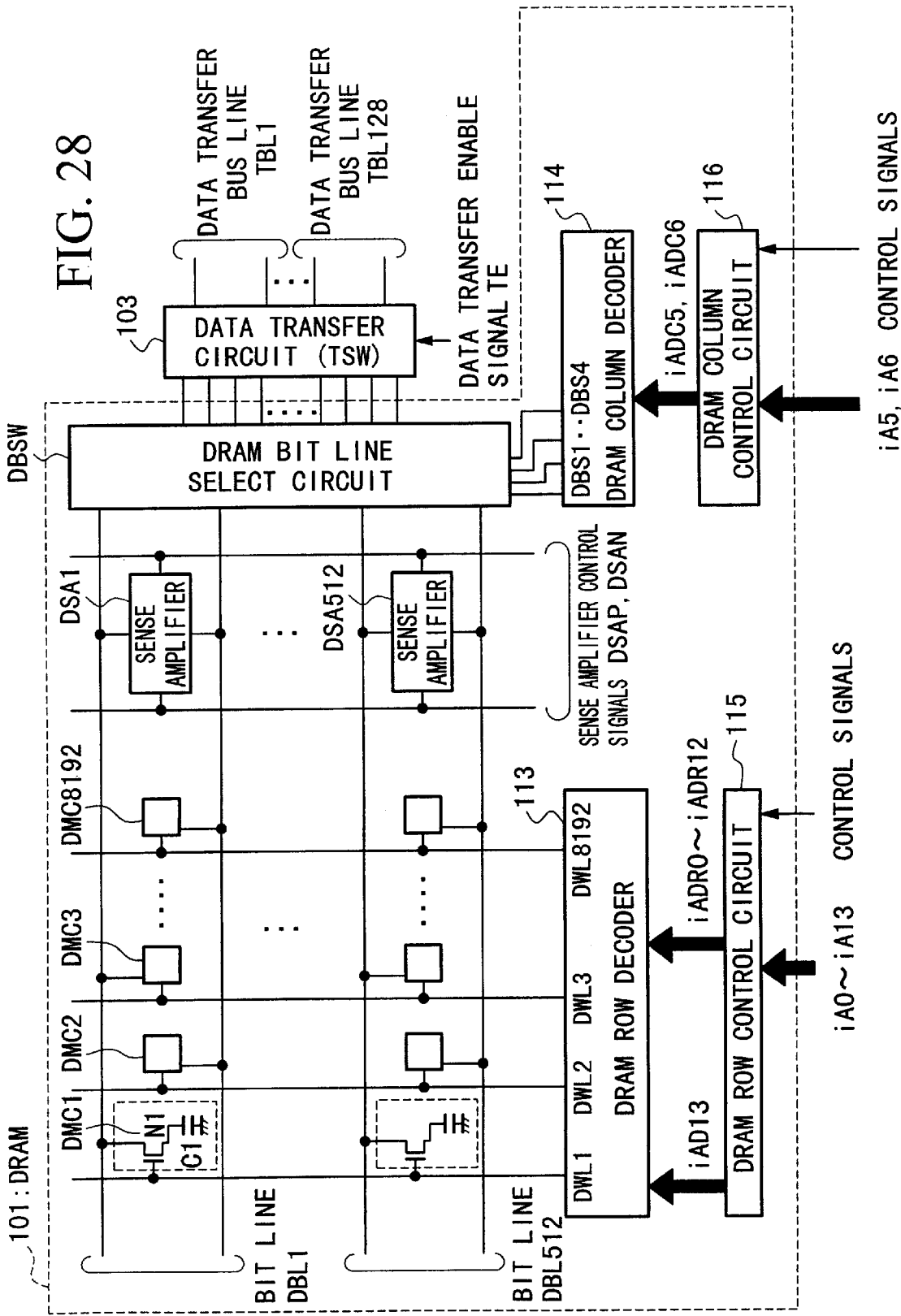
FIG. 28 is a block diagram showing a concrete example of an internal configuration of a DRAM connected with a data transfer circuit shown in FIG. 1.

FIG. 28 shows concrete configurations of the DRAM 101 and the data transfer circuit 103. As shown in FIG. 28, the DRAM 101 contains a number of dynamic memory cells, which are arranged in a matrix form consisting of rows and columns. Herein, each dynamic memory cell DMC contains a memory transistor N1 and a memory capacitor C1. The memory capacitor C1 is supplied with a certain electric potential Vgg(=½Vcc or else). In the DRAM 101, DRAM word lines (DWL) are wired and are connected with the dynamic memory cells (DMC) which are arranged in rows respectively. In addition, DRAM bit lines (DBL) are wired and are connected with the dynamic memory cells (DMC) which are arranged in columns respectively. Herein, each bit line corresponds to a pair of lines which are complementarily with each other. In addition, each dynamic memory cell DMC is located at a point of intersection between the DRAM word line DWL and the DRAM bit line DBL.

The DRAM 101 further contains DRAM sense amplifiers (DSA), each of which is arranged in connection with each of the DRAM bit lines (DBL). Herein, the sense amplifier DSA has functions to detect and amplify a potential difference between paired lines of the bit line DBL. The sense amplifier DSA is controlled by sense amplifier control signals DSAP, DSAN. As described before, the DRAM array 110 is of 64 Megabit having configurations of two banks×8 bits. So, there are provided 8192 word lines, which are designated by reference symbols DWL1 to DWL8192 respectively. In addition, there are provided 512 bit lines, which are designated by reference symbols DBL1 to DBL512 respectively. Further, there are provided 512 sense amplifiers, which are designated by reference symbols DSA1 to DSA512 respectively. All of the aforementioned word lines, bit lines an sense amplifiers merely correspond to a configuration of one bank×1 bit.

The DRAM 101 is equipped with a DRAM row decoder 113 for selecting the word lines DWL1 to DWL8192 and a DRAM row control circuit 115 for producing internal row address signals iADR0 to iADR12 and a bank select signal iAD13. In addition, the DRAM 101 is equipped with a DRAM bit line select circuit DBSW, which receives DRAM bit line select signals DBS1 to DBS4 produced by a DRAM column decoder 114. Based on the DRAM bit line select signals DBS1 to DBS4, the DRAM bit line select circuit DBSW selects one paired bit lines from among four paired bit lines, so that the paired bit lines being selected is being connected with a data transfer bus (TBL) by way of a data transfer circuit 103. Further, the DRAM 101 is equipped with a DRAM column control circuit 116 for producing internal column address signals iADC5, iADC6, which are used by a DRAM column decoder 114.

Figure 29:
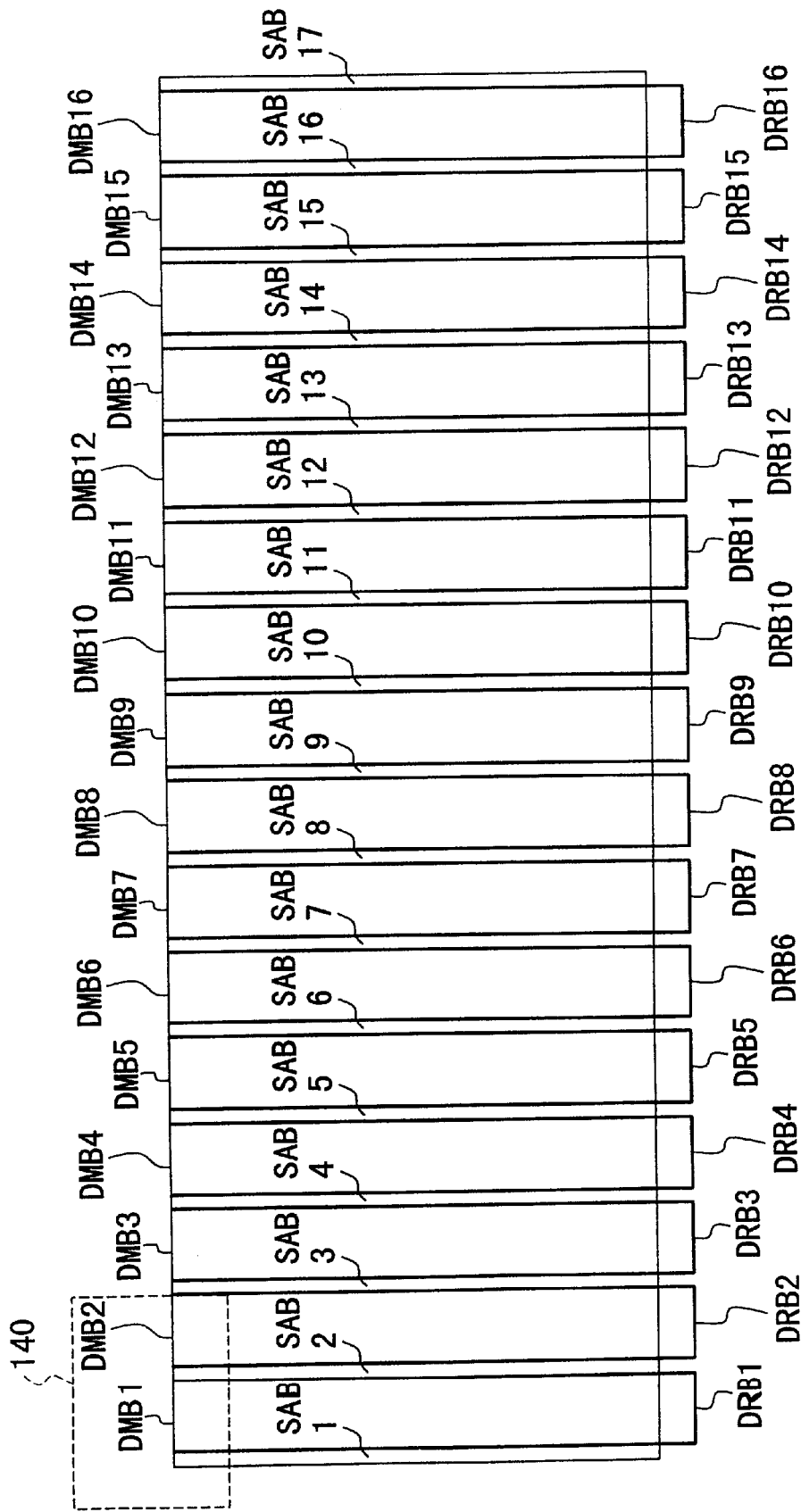
FIG. 29 is a schematic illustration showing an outline configuration of a DRAM array shown in FIG. 26.

FIG. 29 shows an example of a concrete array configuration of the DRAM array 110-1, which is included in the layout shown in FIG. 26. The DRAM array 110-1 is divided into sixteen memory cell blocks DMB1 to DMB16. In addition, sixteen DRAM row decoders DRB1 to DRB16 are provided in connection with the sixteen memory cell blocks DMB1 to DMB16 respectively. Further, blocks SAB1 to SAB17 (corresponding to the aforementioned sense amplifiers, DRAM bit line select circuit and data transfer circuit) are provided in connection with the memory cell blocks DMB1 to DMB16. Each of the memory cell blocks DMB1 to DMB16 consists of 512 rows×2048 columns and has a storage capacity of 1 Megabit. Of course, a number of memory cell blocks being divided is not necessarily limited to sixteen.

Dividing the DRAM array into multiple memory cell blocks reduce a length of each bit line. So, it is possible to reduce a capacity of each bit line. In other words, it is possible to increase a potential difference being caused to occur with respect to the bit lines at a data read mode. At an operation mode, the DRAM array activates only a sense amplifier corresponding to a memory cell block containing a word line being selected by the row decoder. Thus, it is possible to reduce electric power being consumed due to charging and discharging the bit line.

Figure 30:
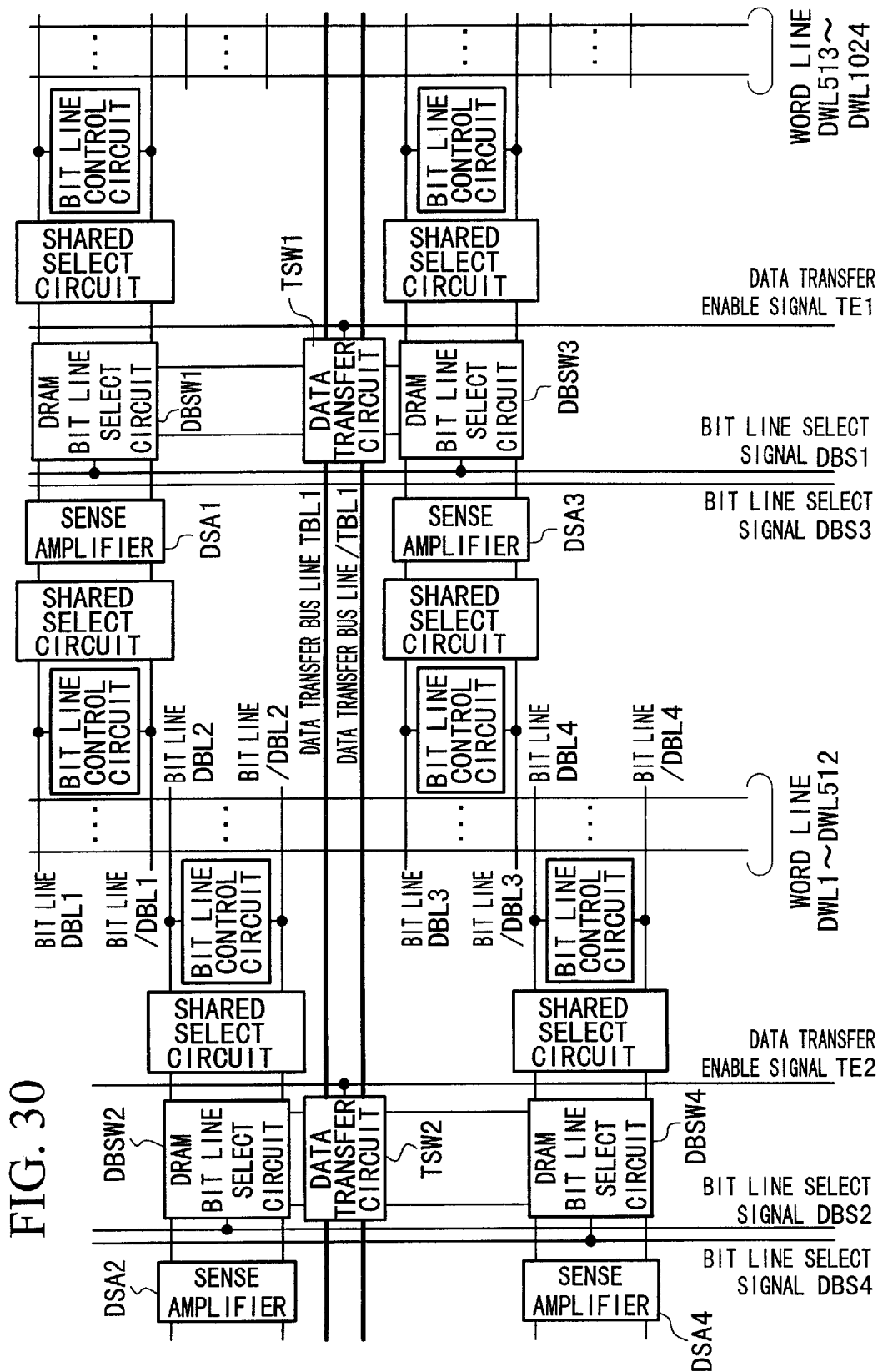
FIG. 30 is a block diagram showing connections between bit lines and data transfer bus lines with respect to a part of the DRAM array shown in FIG. 29.

FIG. 30 shows a selected part 140 of the DRAM array shown in FIG. 29. Specifically, FIG. 30 shows connections between transfer bus lines and (four paired) bit lines in detail. In FIG. 30, sense amplifiers (DSA) are arranged in a zigzag connection manner. For example, two sense amplifiers DSA1, DSA2 are respectively arranged at ends of one memory cell block, wherein DSA1 is provided for one column while DSA2 is provided to another column. This is because in the brand-new process in manufacture of semiconductor devices, each memory cell is reduced in size, while each sense amplifier is not reduced so much in size in proportion to size reduction of the memory cell. So, the aforementioned zigzag connection manner is needed when there is no extra room in arrangement of the sense amplifiers to suit to pitches of bit lines. For this reason, if the bit lines have relatively large pitches, it is possible to modify the arrangement of the sense amplifiers such that a sense amplifier is arranged only at one end of the memory cell block. Herein, the sense amplifier (DSA) is shared between two memory cell blocks by way of a shared select circuit. Incidentally, each of the bit lines is equipped with a bit line control circuit that performs potential equalization and precharge between paired lines. As similar to the aforementioned sense amplifier, the bit line control circuit can be shared between two memory cell blocks.

Figure 31:
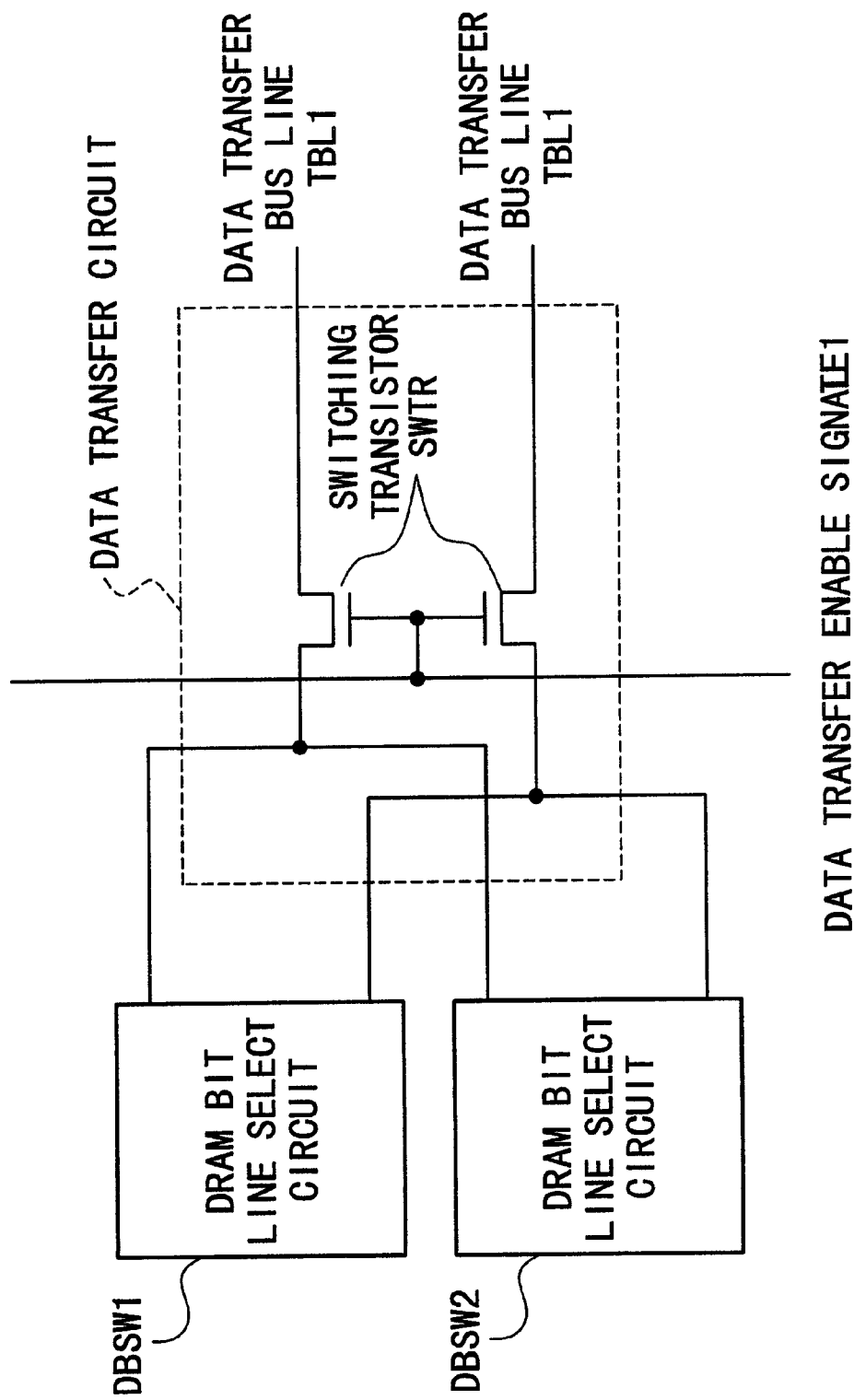
FIG. 31 is a circuit diagram showing an internal configuration of a data transfer circuit shown in FIG. 30.

In FIG. 30, the bit lines and data transfer bus lines are connected together by way of the DRAM bit line select circuits DBSW1 to DBSW4 being selected by the DRAM bit line select signals DBS1 to DBS4 and data transfer circuits TSW1, TSW2. FIG. 31 shows an example of a circuit configuration of the data transfer circuit (TSW) in detail, in which switching transistors SWTR are used. Herein, data transfer enable signals TE1, TE2 activate or enable the data transfer circuits TSW1, TSW2 to operate. Those signals are created by logic being effected between the transfer control signals (produced by the operation control circuit of FIG. 27) and address signals for selecting memory cell blocks. In FIG. 30, the data transfer bus lines are connected together by way of data transfer circuits (TSW). So, if the data transfer circuit of the memory cell block which is not activated is placed in a non-conduction condition, it is not apparently connected with loads of the DRAM bit line select circuits. Therefore, it is possible to reduce loads of the data transfer bus lines being extremely small at an operation mode.

Next, activation and column selection of the DRAM 101 and data transfer operations will be described with reference to FIGS. 28 and 30. At first, a description will be given with respect to activation of the DRAM 101. In FIG. 27, the aforementioned operation control circuit 150 produces the internal address signals iA0 to iA13 and a DRAM row select control signal, which is a part of the DRAM control signals. Upon receipt of the aforementioned signals, the DRAM row control circuit 115 (see FIG. 28) produces a bank select signal iAD13 and internal row address signals iADR0 to iADR12. So, the DRAM row decoder 113 selects word lines (DWL) of a bank being designated by the bank select signal iAD13, so that the selected word lines are increased in electric potential. Data of dynamic memory cells (DMC) connected with the selected word lines (DWL) are output onto bit lines (DBL). Herein, the sense amplifiers (DSA) are driven to operate by the following sense amplifier control signals DSAN, DSAP, so that they detect and amplify potential differences that emerge between paired lines of the bit lines due to the data of the dynamic memory cells. Incidentally, the DRAM 101 is capable of simultaneously driving 512 sense amplifiers. Since the DRAM 101 employs configuration of two banks×8 bits, it simultaneously drives an eight-times number of the sense amplifiers, which is 512×8=4096.

Next, a description will be given with respect to the column selection of the DRAM 101 and data transfer operations.

In FIG. 28, the DRAM column control circuit 116 inputs internal address signals iA5, iA6 and a control signal, which is a part of the DRAM control signals being produced by the operation control circuit 150 shown in FIG. 27. Thus, the DRAM column control circuit 116 produces internal column address signals iADC5, iADC6. The internal column address signals iADC5, iADC6 are supplied to the DRAM column decoder 114, which in turn produces DRAM bit line select signals DBS1 to DBS4 for selecting bit lines. A data transfer enable signal TE is created by logic being effected between an address signal for selecting a memory cell block and a transfer control signal, which is produced by the operation control circuit 150 shown in FIG. 27. So, data being sent onto the bit lines are transmitted onto data transfer bus lines TBL by way of the data transfer circuit 103 in response to the data transfer enable signal TE.

If the DRAM column decoder 114 selectively activates the DRAM bit line select signal DBS1 in FIG. 30, a signal synchronized with the transfer control signal is input to the DRAM bit line select circuit DBSW1, so that data of paired bit lines DBL1,/DBL1 are amplified by the sense amplifier DSA1 and are transmitted to data transfer bus lines TBL1,/TBL1 by way of the data transfer circuit TSW1, for example.

(ii) DRAM Row Control Circuit and DRAM Row Decoder

Figure 32:
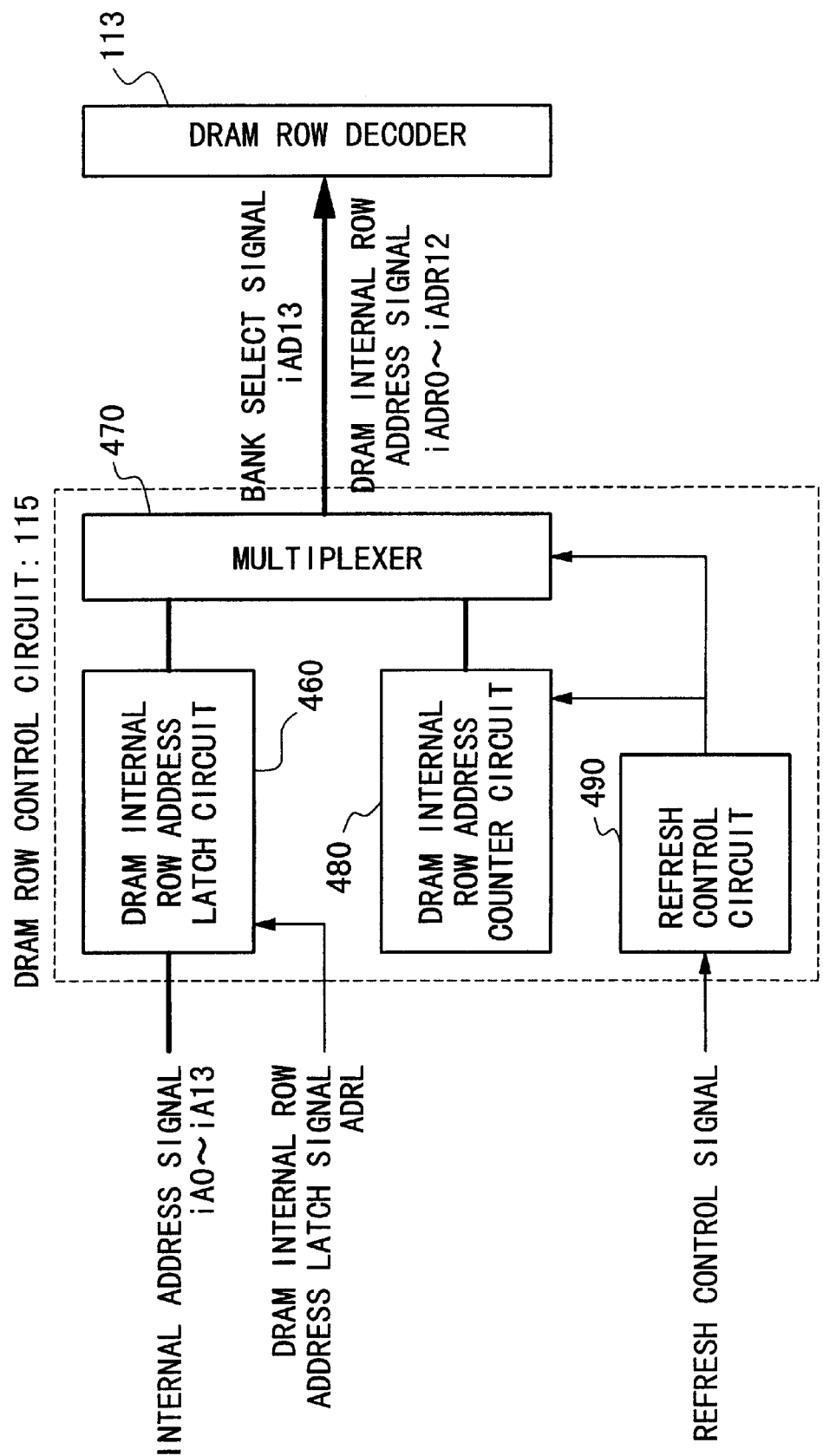
FIG. 32 is a block diagram showing an internal configuration of a DRAM row control circuit connected with a DRAM row decoder.

FIG. 32 shows an internal configuration of the DRAM row control circuit 115 connected with the DRAM row decoder 113. The DRAM row control circuit 115 contains a DRAM internal row address latch circuit 460, a multiplexer 470, a DRAM internal row address counter circuit 480 and a refresh circuit 490. In a normal activation mode of the DRAM 101, the DRAM internal row address latch circuit 460 of the DRAM row control circuit 115 inputs internal address signals iA0 to iA13 and a DRAM internal row address latch signal ADRL, and it controls the multiplexer 470 to output DRAM internal row address signals iADR0 to iADR12 and a bank select signal iAD13 to the DRAM row decoder 113.

In a refresh mode, the DRAM row control circuit 115 receives a refresh control signal, so that the refresh control circuit 490 starts the DRAM internal row address counter circuit 480 to control the multiplexer 470. Thus, the multiplexer 470 automatically outputs select signals from the DRAM internal row address counter circuit 480. As a result, without inputting the internal address signals, the DRAM row control circuit 115 is capable of automatically outputting DRAM internal row address signals iADR0 to iADR12 and a bank select signal iAD13 to the DRAM row decoder 113. Every time the DRAM internal row address counter circuit 480 performs a refresh operation, it automatically performs calculations regarding increments and decrements for addresses in accordance with preset methods, so that the DRAM row control circuit 115 is capable of automatically selecting all of rows of the DRAM 101.

(iii) DRAM Column Control Circuit and DRAM Column Decoder

Figure 33:
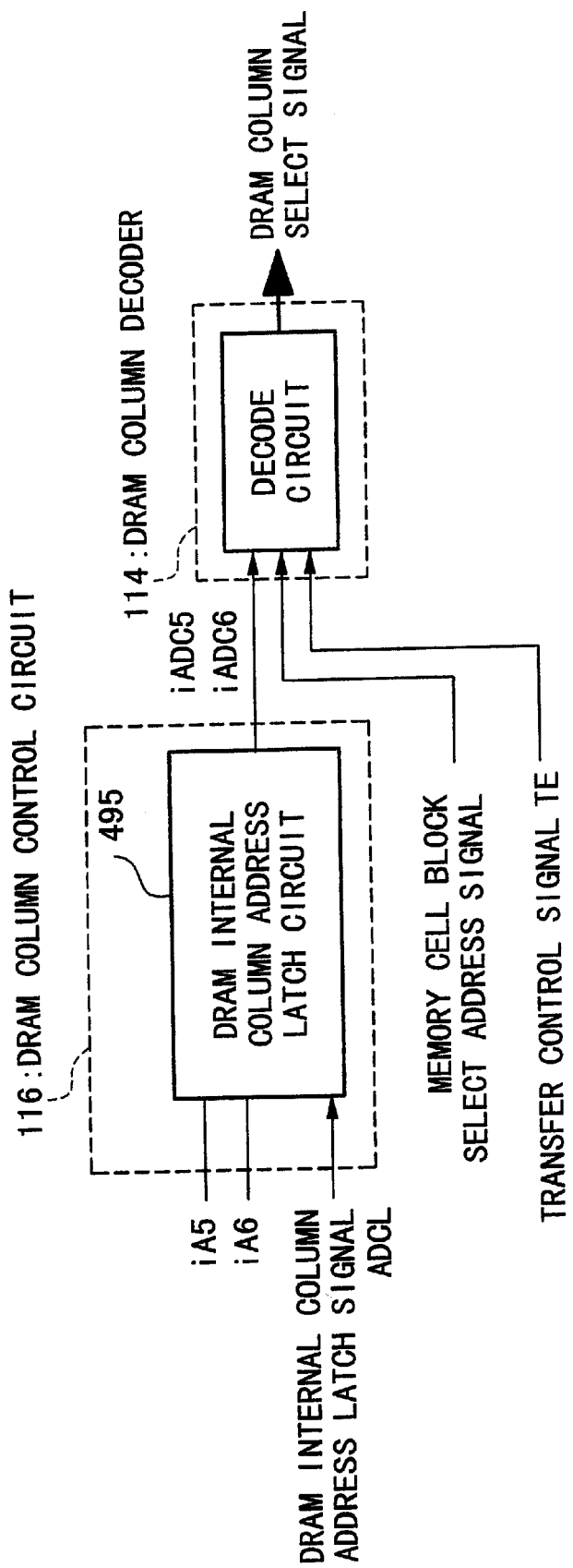

FIG. 33 shows internal configurations of the DRAM column control circuit 116 and DRAM column decoder 114, which are shown in FIG. 28. As shown in FIG. 33, the DRAM column control circuit 116 is configured by a DRAM internal column address latch circuit 495, which produces DRAM internal column address signals iADC5, iADC6 based on internal address signals iA5, iA6 and a DRAM internal column address latch signal ADCL. Herein, the DRAM internal column address latch signal ADCL designates the DRAM internal column address latch circuit 495 to input the internal address signals iA5, iA6 in clock cycles for inputting commands regarding transfer (i.e., prefetch transfer) of data from dynamic memory cells to static memory cells and transfer (i.e., restore transfer) of data from static memory cells to dynamic memory cells.

The aforementioned DRAM internal column address latch signal ADCL is a part of the foregoing transfer control signals, which are produced by the operation control circuit 150 shown in FIG. 27. The DRAM column decoder 114 is a decode circuit that decodes the DRAM internal column address signals iADC5, iADC6 output from the DRAM column control circuit 116. An output of the DRAM column decoder 114 corresponds to a DRAM column select signal, which is produced only when a memory block select address signal and a transfer control signal TE are both subjected to activation. Therefore, the output of the DRAM column decoder 114 shares functions of the foregoing data transfer enable signals TE1, TE2 for the data transfer circuits TSW1, TSW2 shown in FIG. 30. In addition, the DRAM bit line select circuits may share functions of the data transfer circuits as well.

(iv) DRAM Bit Line Select Circuit and Static Memory Cells of SRAM

Figure 25:
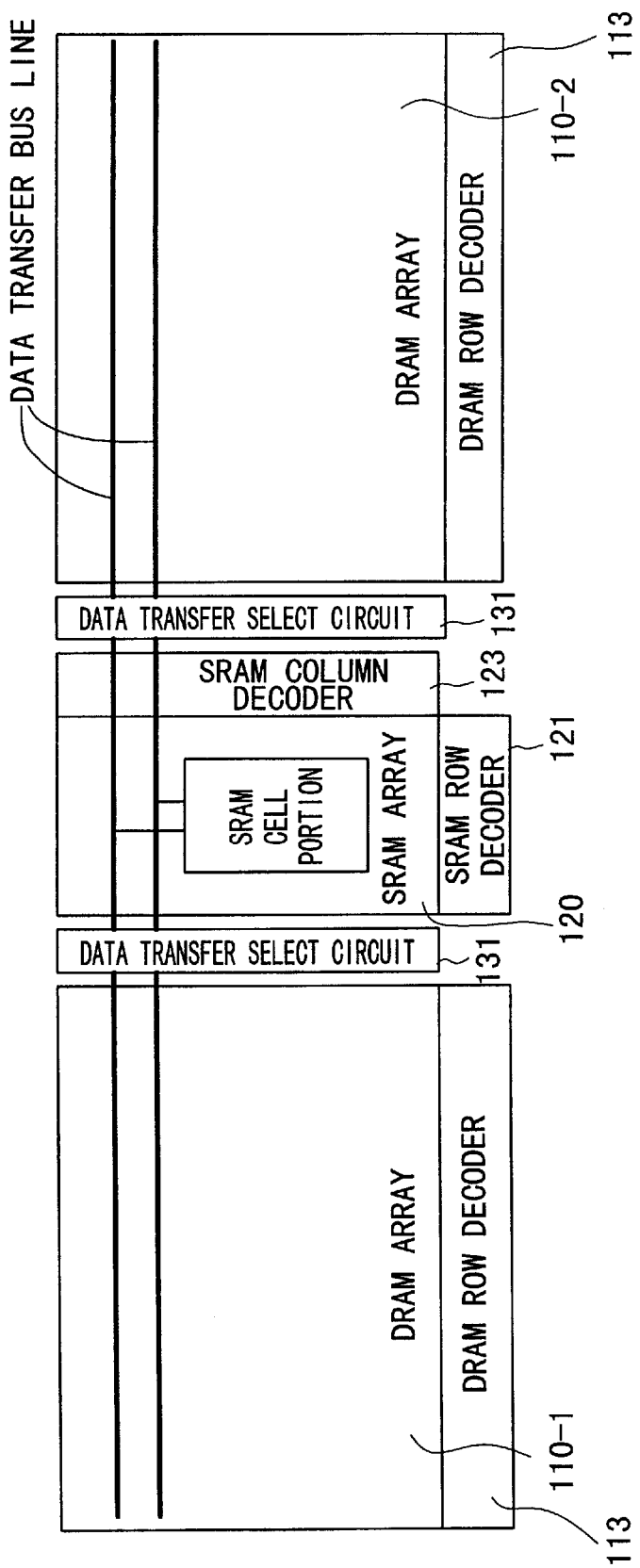
FIG. 25 diagrammatically shows an example of an overall layout of a chip incorporating a semiconductor storage device in accordance with the embodiment of the invention.
Figure 34:
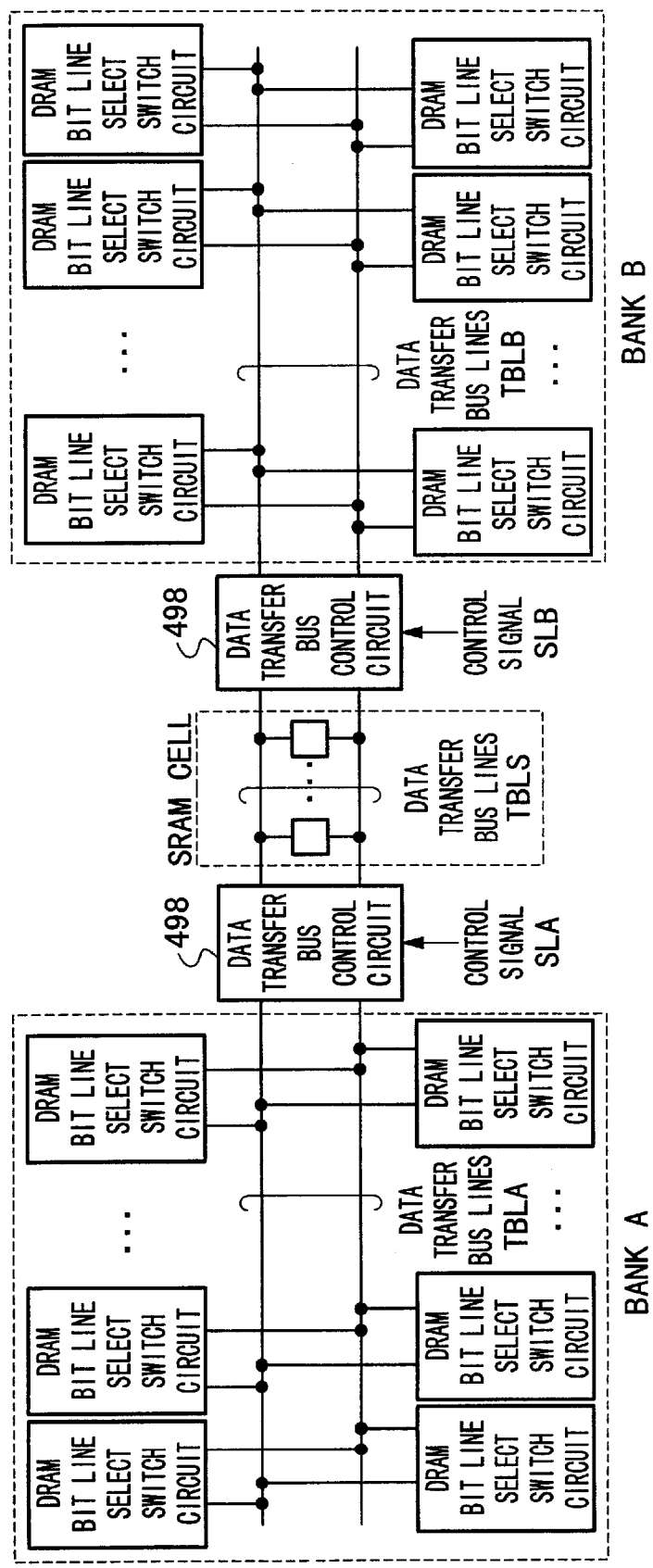
Figure 35:
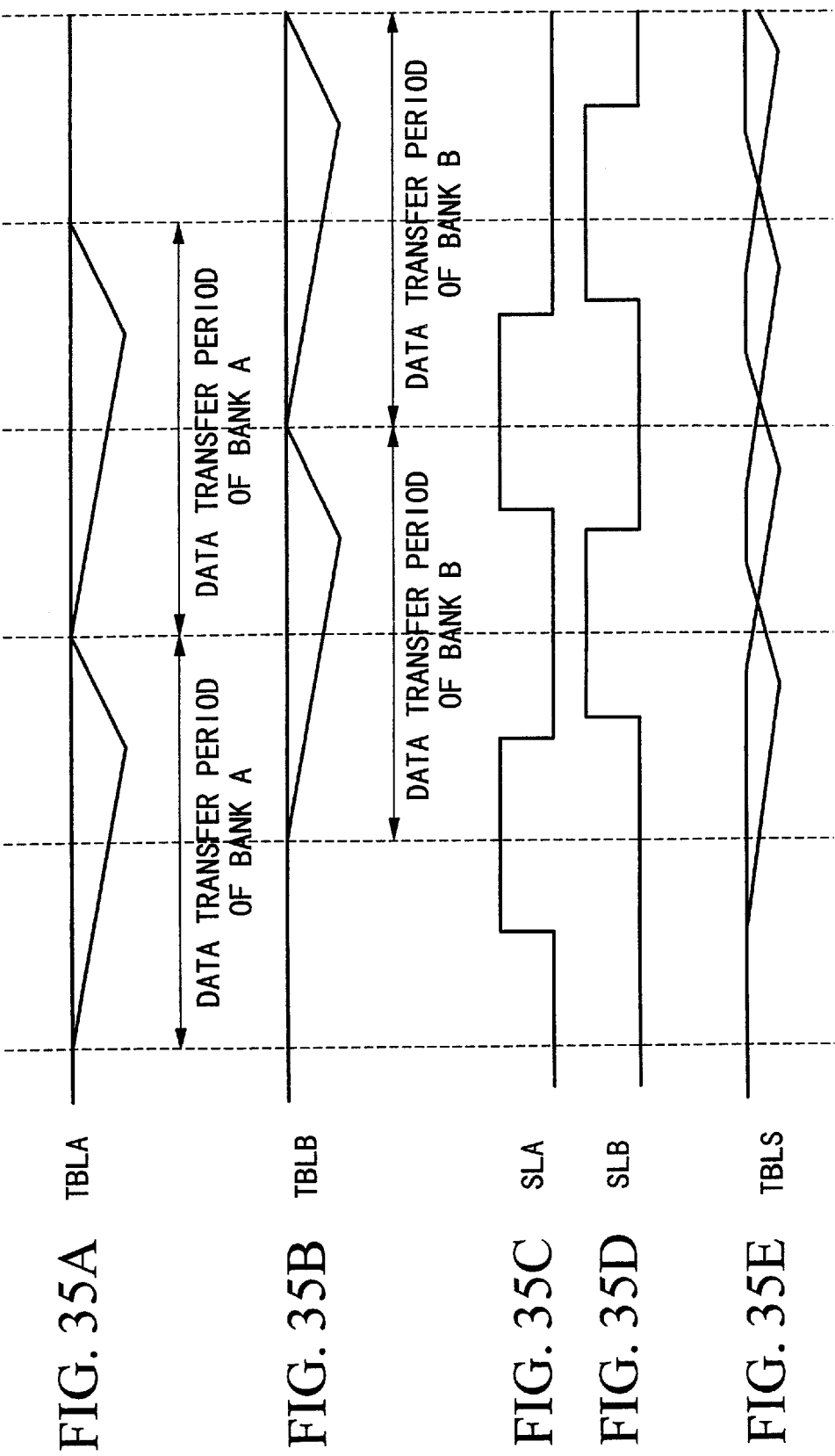

FIG. 34 shows a block diagram, which matches with an array layout of FIG. 25. That is, FIG. 34 shows relationships between DRAM bit line select circuits and static memory cells of the SRAM, which are connected together by way of a pair of data transfer bus lines. In FIG. 34, dynamic memory cells of the DRAM being disposed in a same column are connected with the data transfer bus lines by way of the DRAM bit line select circuit, so that it is possible to perform transfer of data between the dynamic memory cells and static memory cells of the SRAM which are disposed in a same column. In addition, the static memory cells are connected with the data transfer bus lines by way of data transfer bus control circuits 498. As shown in FIG. 25, DRAM arrays are arranged on both sides of the SRAM as banks A, B, for example. The data transfer bus control circuits 498 contain circuits for selecting the bank to establish connections with the SRAM. That is, it is possible to connect the SRAM with only the activated bank by way of the data transfer bus lines. This reduces loads of the data transfer bus lines, so that it is possible to actualize reduction of charge currents and discharge currents as well as high-speed performance of data transfer. As shown in FIGS. 35A to 35E, the circuitry of FIG. 34 executes data transfer operations alternatively with respect to the banks. This is called "bank ping-pong operations". In such bank ping-pong operations, it is possible to disconnect the data transfer bus lines from one bank, so it is possible to execute the data transfer operations with respect to the both banks in an overlapped manner. Thus, it is possible to reduce an "effective" data transfer period.

Incidentally, the semiconductor storage device of the present embodiment is designed to transfer 1024 bits of data at once, so loads to the data transfer bus lines are very large. For this reason, if all signals on the data transfer bus lines are subjected to full amplitudes up to source voltage levels, peak currents and consumed currents become very large. Therefore, it is necessary to prevent the signals on the data transfer bus lines from being subjected to full amplitudes. In order to do so, the signals are limited in amplitudes to a half or so of the source voltage at maximum. Thus, it is possible to remarkably reduce the peak currents and consumed currents.

3. SRAM (i) SRAM and Its Peripheral Configurations for an External I/O Terminal

Figure 36:
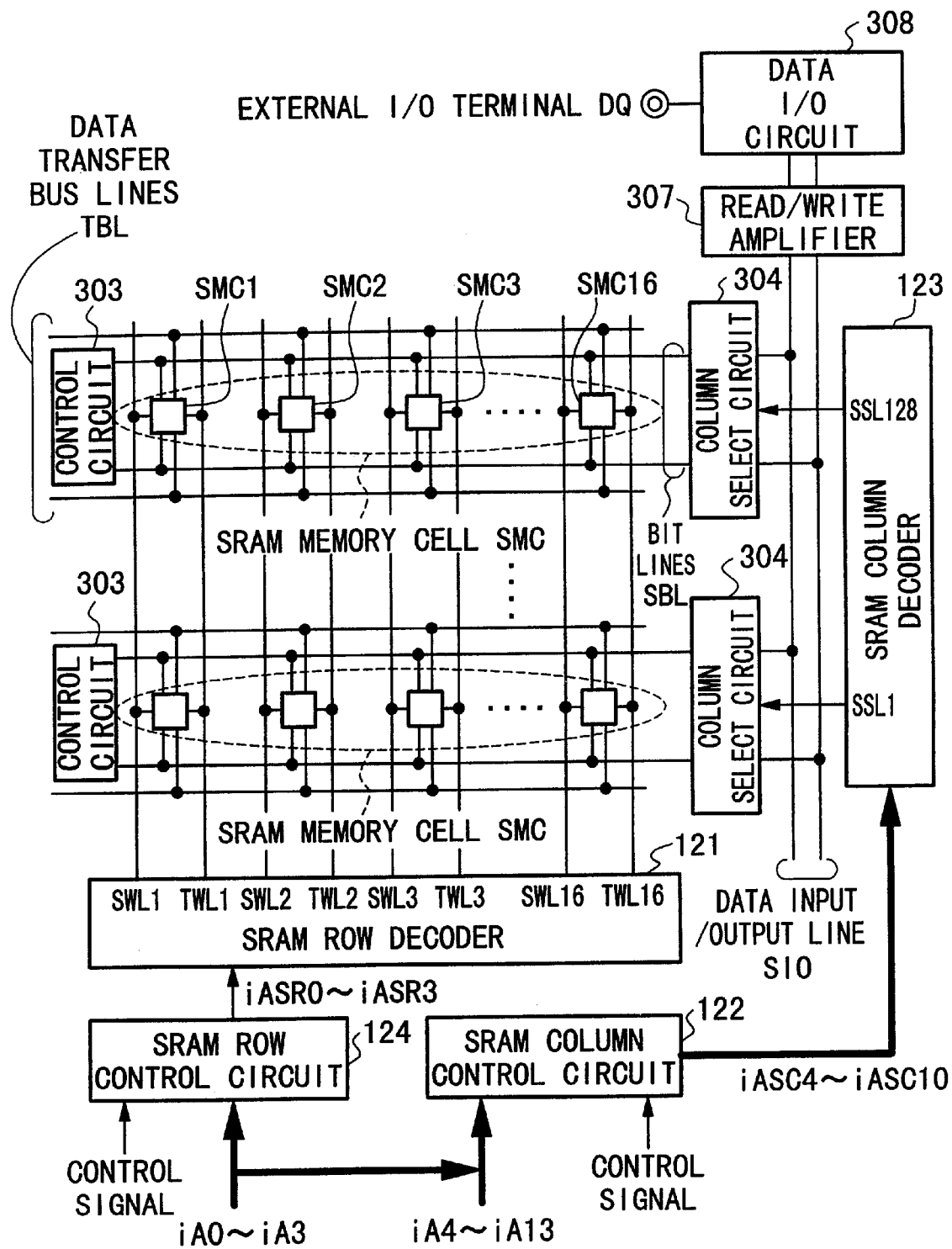

FIG. 36 shows static memory cells of the SRAM and its peripheral circuits for an external I/O terminal (DQ). Specifically, FIG. 36 shows a part of circuitry with regard to one bit of DQ for the external I/O terminal. The present embodiment uses an SRAM array of 16 Kilobit having a configuration×8 bits. Of course, this invention is not necessarily limited to the present embodiment. So, it is possible to modify the present embodiment in a variety of configurations using different combinations of main storages and auxiliary storages, for example.

Figure 37:
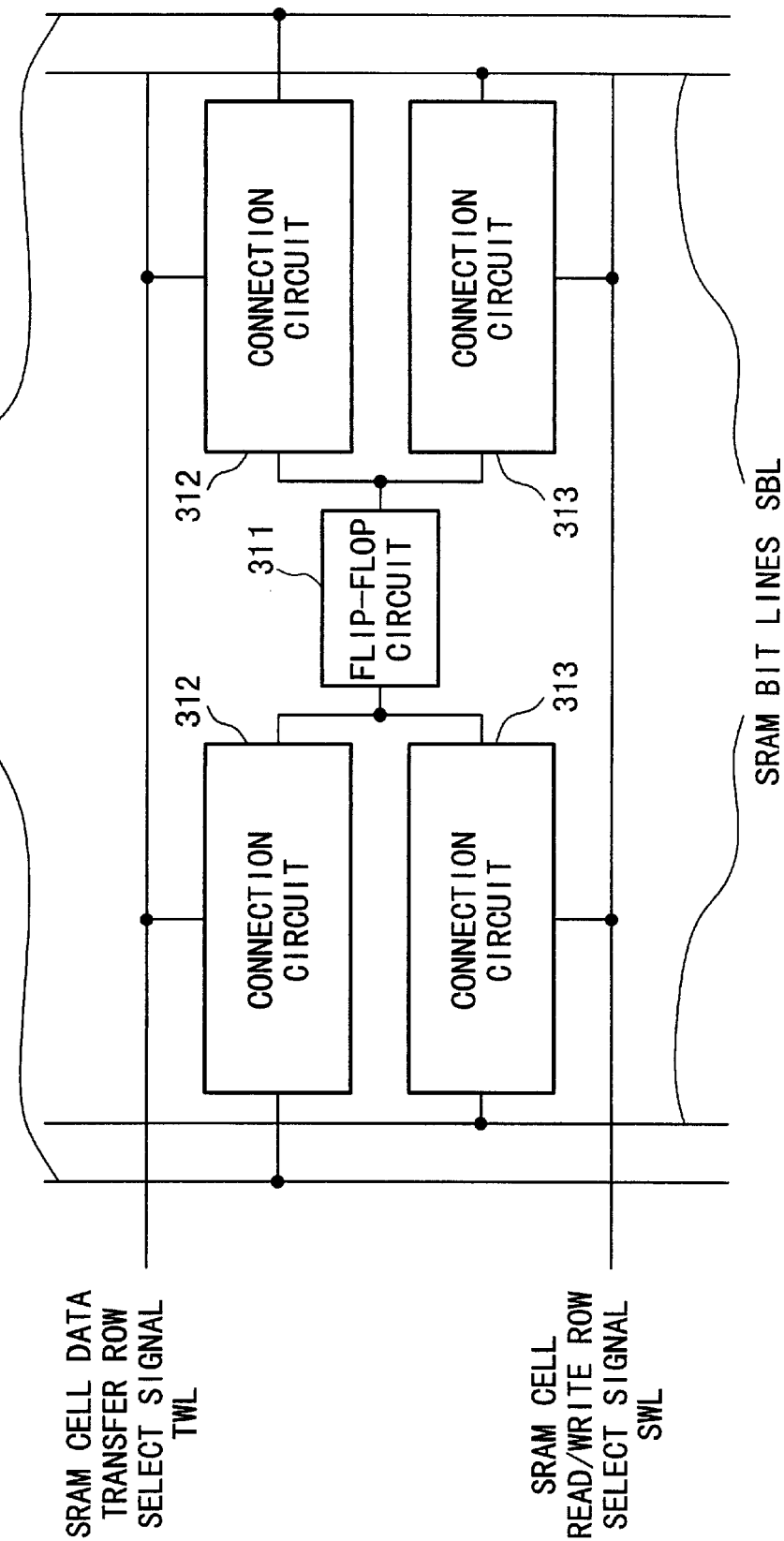

FIG. 37 shows an example of a static memory cell SMC, which is configured by a flip-flop circuit 311 and connection circuits 312, 313. The present example uses a flip-flop circuit as storage of the static memory cell SMC. However, the storage is not necessarily limited to the flip-flop circuit. Hence, it is possible to use any other circuits which are capable of storing data in a static manner as the storage of SMC. In addition, two connection circuits 312 are arranged on both sides of the flip-flop circuit 311 to establish connections with data transfer bus lines TBL. Further, two connection circuits 313 are arranged on both sides of the flip-flops circuit 311 to establish connections with SRAM bit lines SBL. In FIG. 36, there are provided an SRAM row decoder 121 and an SRAM row control circuit 124. To perform data transfer between the dynamic memory cells and static memory cells, the SRAM row decoder 121 produces SRAM cell data transfer row select signals TWL1 to TWL16 to activate the connection circuits 312 for establishing connections with the data transfer bus lines. To read or write data on the static memory cells, the SRAM row decoder 121 produces SRAM cell read/write row select signals SWL1 to SWL16 to activate the connection circuits 313 for establishing connections with the SRAM bit lines. Based on internal address signals iA0 to iA13 and SRAM control signals, the SAM row control circuit 124 produces SRAM internal row address signals iASR0 to iASR3, which are supplied to the SRAM row decoder 121. Incidentally, the SRAM row decoder 121 can be modified to provide a common SRAM cell data transfer row select signal TWL and an SRAM cell read/write row select signal SWL.

The SRAM bit lines SBL are connected with an SRAM bit line control circuit 303 and an SRAM column select circuit 304. Herein, the SRAM bit line control circuit 303 performs potential equalization and precharge to the bit lines SBL, while the SRAM column select circuit 304 establishes conduction between the bit lines SBL and data I/O lines SIO. In addition, there are provided an SRAM column decoder 123 and an SRAM column control circuit 122. Herein, the SRAM column decoder 123 produces select signals SSL1 to SSL128, which are input to the SRAM column select circuits (304). Based on the internal address signals iA0 to iA13 and SRAM control signals, the SRAM column control circuit 122 produces SRAM internal column address signals iASC4 to iASC10, which are supplied to the SRAM column decoder 123. Incidentally, it is possible to use a sense amplifier circuit for detecting and amplifying levels of the SRAM bit lines SBL as the SRAM bit line control circuit 303.

The data I/O lines SIO are connected with the external I/O terminal DQ by way of a read/write amplifier 307 and a data input/output circuit 308. Herein, the data I/O lines SIO can be separated in functions with respect to a read function and a write function respectively. Incidentally, it is possible to perform read operations or write operations to the static memory cells, regardless of data transfer operations, because the static memory cells are connected with data transfer bus lines TBL and SRAM bit lines SBL respectively.

(ii) SRAM Row Control Circuit

FIG. 38 shows an internal configuration of the SRAM row control circuit 124 shown in FIG. 36. As shown in FIG. 38, the SRAM row control circuit 124 is configured by an SRAM internal row address latch circuit 350, which produces SRAM internal row address signals iASR0 to iASR3 based on internal address signals iA0 to iA3 and a latch signal ASRL. Herein, the SRAM internal row address latch circuit 350 inputs the internal address signals iA0–iA3 in response to the latch signal ASRL which is produced in each of clock cycles for inputting read/write commands. The latch signal ASRL corresponds to a part of the SRAM control signals being produced by the operation control circuit 150 shown in FIG. 27.

(iii) SRAM Column Control Circuit

FIG. 39 shows an internal configuration of the SRAM column control circuit 122 shown in FIG. 36. The SRAM column control circuit of FIG. 39 contains an SRAM internal column address latch circuit 507 and a counter circuit 506. Herein, the SRAM internal column address latch circuit 507 inputs internal address signals iA4 to iA10 in response to a latch signal ASCL, which is produced in each of clock cycles for inputting read/write commands. The counter circuit 506 inputs an output of the SRAM internal column address latch circuit 507 in response to a control signal SCE, so that it performs count-up operations in accordance with a predetermined address sequence by a count-up signal CLKUP, which operates during burst operations for performing read or write operations on the SRAM. A multiplexer 508 transmits either an output of the latch circuit 507 or an output of the counter circuit 56 so as to output SRAM internal column address signals iASC4 to iASC10. Herein the multiplexer 508 allows transmission of the output of the latch circuit 407 in clock cycles for inputting read/write commands. Thus, the multiplexer 508 is controlled by a control signal SCSL so that the SRAM internal column address signals will be output as fast as possible.

In addition, the SRAM column control circuit 122 is designed to cope with multiple sets of static memory cells. In the present embodiment, static memory cells of the SRAM are divided into multiple SRAM cell blocks, each containing static memory cells being arranged in a same row. So, the SRAM column control circuit 122 is capable of setting different data input/output styles (e.g., burst length, data input/output address sequences, latencies, etc.) with respect to the multiple sets of static memory cells respectively. In order to do so, the SRAM column control circuit 122 is equipped with a data input/output style storage 505, which loads and stores data input/output styles in response to conditions of internal address signals iA0 to iA13 in the cycle of the foregoing second register setting command (or second mode register setting command, see FIG. 19). Incidentally, the present embodiment is designed such that only the burst length can be set as the data input/output style with respect to each set of static memory cells. Of course, the present embodiment can be modified such that the data input/output address sequence or latency is set as the data input/output style with respect to each set of static memory cells.

The data input/output style storage 505 contains multiple sets of circuits each corresponds to a load logic 502 and a register 503, a total number of which corresponds to a number of the multiple sets of static memory cells. Herein, the load logic 502 produces setting data representative of a data input/output style based on conditions of the internal address signals iA0 to iA13. A decode circuit 501 decodes the internal address signals iA0 to iA3 in response to an enable signal CRE, which is produced in the cycle of the second mode register setting command. The register 503 inputs and stores the setting data of the data input/output style (being output from the load logic 502) with respect to each set of static memory cells in response to an output of the decode circuit 501, content of which is selected by the enable signal CRE. In addition, a decode circuit 509 decodes the aforementioned SRAM internal row address signals iASR0 to iASR3, which are output from the SRAM internal row address latch circuit 350 shown in FIG. 38. In cycles of read/write commands, a multiplexer 504 is controlled by an output of the decode circuit 509 to selectively output one of outputs of the registers 503 respectively storing the setting data with respect to the multiple sets of static memory cells.

The counter circuit 506 inputs an output of the multiplexer 504 to operate in accordance with the data input/output style being set with respect to each set of static memory cells. Incidentally, it is necessary to provide multiple sets of the data input/output storage 505, a number of which corresponds to a number of data input/output styles being set. Herein, the count-up signal CLKUP, enable signal CRE, latch signal ASCL and control signals SCE, SCSL correspond to the foregoing SRAM control signals, which are produced by the operation control circuit 150 shown in FIG. 27. Incidentally, it is possible to use a common latch signal actualizing functions of the latch signal input to the SRAM internal row address latch circuit 350 and latch signal input to the SRAM internal column address latch circuit 507.

As described above, the present embodiment is designed such that the setting to the data input/output style storage 505 is made in the cycle of the second mode register setting command with respect to each set of static memory cells. Of course, the setting can be made with respect to a more sets of static memory cells at once. For example, the same setting is made with respect to two or more sets of static memory cells at once. That is, it is possible to make the setting in various combinations regarding various sets of static memory cells. Herein, the setting of SRAM row data in the second register setting command (see FIG. 5, (2)) is made by setting appropriate logical levels for addresses A4, A5 respectively. For example, if A4=L and A5=L, the setting is made with respect to each set of static memory cells. If A4=H and A5=L, the setting is made simultaneously with respect to two sets of static memory cells, wherein a least significant bit of the SRAM row data is ignored. If A4=L and A5=H, the setting is made simultaneously with respect to four sets of static memory cells, wherein low-order two bits of the SRAM row data are ignored.

In addition, the data input/output style storage 505 does not necessarily contain multiple sets of circuits each corresponding to the load logic 502 and register 503, a number of which corresponds to a number of the multiple sets of static memory cells. That is, it contains only a single common circuit, which is commonly used for the multiple sets of static memory cells. Further, the decode circuit 509 does not necessarily input the aforementioned signals iASR0 to iASR3 output from the SRAM internal row address latch circuit 305 shown in FIG. 38. That is, it is possible to provide another circuit for producing input signals for the decode circuits 509.

FIG. 40 shows an example of circuit configurations of the latch circuit 507 and multiplexer 508. Herein, the latch circuit 507 and multiplexer 508 employ circuit configurations, which are capable of providing outputs immediately by way of logic circuits inputting the internal clock signal iCLK, which is synchronized with the external basic clock signal CLK. Thus, it is possible to produce internal addresses at a high speed. In FIG. 40, reference symbols INTAi, /INTAi designate address signals from the counter circuit 506, while reference symbols EXTAi, /EXTAi designate signals being produced from intenal address signals iAi, for example. Switching of those signals is made by control signals SCSL, /SCSL and a burst control signal. Herein, SCSL designates a control signal, while /SCSL designates an inverse of the control signal. FIGS. 41A to 41I show an example of operations of the circuits shown in FIG. 40. The multiplexer 508 shown in FIG. 40 has a minimal delay, which is provided between iCLK and Yi being output therefrom. The multiplexer 508 outputs Yi, YiB, which are coupled together as an address pulse signal.

(iv) SRAM column decoder and data control circuit

FIG. 42 shows an example of internal configurations of the SRAM column decoder 123 and its data control circuit. The SRAM column decoder 123 contains a first column decoder 390 and a second column decoder 391. Herein, SRAM column select signals iASC are sequentially transmitted to the decoders 390, 391 respectively. Each of the decoders 390 and 391 operates in response to a single SRAM column select signal iASC. To do so, the first column decoder 390 is equipped with a first column address buffer 392, while the second column decoder 391 is equipped with a second column address buffer 393. The column decoders 390, 391 are connected with select lines (SSL0, which wired in parallel in directions of columns. In response to the two column decoders 390, 391, there are provided two set of circuitry each consisting of a data I/O line (SIO) and a data latch circuit.

FIGS. 43A to 43I show internal operation timings of the SRAM column decoder 123. Based on the clock signal CLK, the column address buffers 392, 393 controls the column decoders 390, 391 to select columns by signals iASC-1, iASC-2. In a burst mode in which column addresses are being selected consecutively, for example, the first and second column decoders 390, 391 operate alternatively. Data regarding columns (SSL-1, SSL-2) being selected by the column decoders 390, 391 are sequentially output onto the data I/O lines (SIO-1, SIO-2) respectively. The data I/O lines operate by a cycle time, which is two times longer than a request cycle time. So, the data are transmitted over the data I/O lines SIO-1, SIO-2 and are supplied to first and second data latch circuits 395, 396, wherein they are temporarily stored. Then, outputs of the data latch circuits 395, 396 are combined together before a data-out buffer 152, so that combined data are being output from an external I/O terminal DQ by the request cycle time.

The aforementioned circuit configurations speeding up cycles in consecutively outputting data and consecutively writing data without speeding up internal operation cycles. Even in the synchronous DRAM of double data rate (DDR), it is possible to obtain high-speed performance by using the aforementioned circuit configurations.

(8) I/O Map (i.e. Layout of Memory Cells for Each I/O)

FIG. 44 shows an I/O map in connection with the foregoing layout shown in FIG. 26.

This I/O map shows relationships in correspondence between external I/O terminals I/O0 to I/O15 and memory cells of the DRAM arrays 110-1 to 110-4. Herein, each DRAM array is configured by sixteen memory cell arrays (or blocks), which are shown by dotted lines in FIG. 44. A sense amplifier is arranged in periphery of each memory cell array. In each of the DRAM arrays 110-1 and 110-2, memory cells are arranged in mixture in connection with the external I/O terminals I/O0, I/O2, I/O4, I/O6, I/O9, I/O11, I/O13 and I/O15 respectively. In each of the DRAM arrays 110-3 and 110-4, memory cells are arranged in mixture in connection with the external I/O terminals I/O1, I/O3, I/O5, I/O7, I/O8, I/O10, I/O12 and I/O14 respectively.

In addition, the DRAM arrays are divided into multiple regions RG0 to RG15, so that the memory cells are arranged in lines with respect to the regions RG0 to RG15 in connection with the external I/O terminals respectively. Specifically, in the DRAM arrays 110-1 and 110-2, the memory cells connected with the external I/O terminals I/O0, I/O2, I/O4, I/O6, I/O9, I/O11, I/O13, I/O15 are arranged in the regions RG0, RG2, RG4, RG6, RG9, RG11, RG13, RG15 respectively. In the DRAM arrays 110-3 and 110-4, the memory cells connected with the external I/O terminals I/O1, I/O3, I/O5, I/O7, I/O8, I/O10, I/O12, I/O14 are arranged in the regions RG1, RG3, RG5, RG7, RG8, RG10, RG12, RG14 respectively.

FIG. 45 shows memory cells and peripheral circuits by way of an example of the region RG0 of the DRAM array 110-1.

As similar to the memory cell array shown in FIG. 49, the memory cell array shown in FIG. 45 contains memory cells which are arranged in an array consisting of rows and columns, wherein each column is defined by paired bit lines BL0, BL0b, and each row is defined by a word line crossing with the bit lines. Herein, "column" designates a set of memory cells being assigned with a same column address. In this example, the column is defined by the paired bit lines. Of course, the column is not necessarily limited to this example. That is, the column can be defined using other known configurations such as hierarchical bit line configurations and single bit line configurations.

Memory cells are arranged at points of intersection between the paired bit lines and word lines. Herein, the memory cells are arranged in a matrix form with respect to four paired bit lines BL0, BL0b, . . . , BL3, BL3b. Herein, a same arrangement pattern of memory cells is repeated with respect to the four paired bit lines respectively. All the memory cells being connected with the paired bit lines BL0, BL0b, . . . , BL3, BL3b are provided for a same external I/O terminal.

Incidentally, it is possible to employ another wiring layout of bit lines, wherein a new bit line BL1 is wired between the paired bit lines BL0, BL0b to belong to adjoining columns, for example.

In FIG. 45, sense amplifiers SAMP0, SAMP1, SAMP2 and SAMP3 are arranged in periphery of the memory cell array. Herein, the sense amplifier SAMP0 is connected with the paired bit lines BL0, BL0b; the sense amplifier SAMP1 is connected with the paired bit lines BL1, BL1b; the sense amplifier SAMP2 is connected with the paired bit lines BL2, BL2b; and the sense amplifier SAMP3 is connected with the paired bit lines BL3, BL3b. Incidentally, it is possible to provide a switching element intervening between the sense amplifier and bit lines, or it is possible to employ a sense amplifier of shared type. In addition, the sense amplifiers SAMP0, SAMP1, SAMP2 and SAMP3 are equipped with paired transfer gate transistors TG0, TG1, TG2 and TG3 respectively. So, the paired bit lines BL0, BL0b are connected to the data transfer bus lines TBL by way of the sense amplifier SAMP0 and the paired transfer gate transistors TG0. Similarly, BL1, BL1b are connected to TBL by way of SAMP1 and TG1; BL2, BL2b are connected to TBL by way of SAMP2 and TG2; and BL3, BL3b are connected to TBL by way of SAMP3 and TG3. The data transfer bus lines TBL are wired in a column direction on the memory cell array and is formed in an uppermost metal wiring layer.

The paired transfer gate transistors TG0 to TG3 are selectively controlled in conduction by select signals SEG0 to SEG3, which are activated in response to column addresses (or second addresses) respectively. Lines of the select signals SEG0 to SEG3 are wired in parallel with rows in periphery of the memory cell array.

Word lines which are activated based on row addresses (or first addresses) respectively are wired to extend across the DRAM arrays. So, memory cells being arranged in rows are activated by common row addresses respectively.

A group of memory cells being arranged in one column are connected with each paired bit lines and are selected in response to a same column address. In addition, the memory cells in one column are selected by row addresses respectively. In one cycle, data are read from one memory cell within multiple groups of memory cells, which are respectively connected with the paired bit lines BL0, BL0b, . . . , BL3, BL3b and which are arranged to adjoin each other in space.

All the memory cells within the region RG0 are used to store data, which are to be read out toward an external I/O terminal I/O0. Therefore, in a same cycle, data are not simultaneously read from two or more memory cells within the region RG0. In short, only one data is read from each region in one cycle. In other words, memory cells are arranged in the regions in such a way that columns, which are not simultaneously subjected to read operations in the same cycle, are arranged to adjoin each other.

In case of FIG. 45, the select signal lines SEG0 to SEG3 are arranged outside of the memory cell array. So, there is no limit to restrict a number of select signal lines, which can be set freely. The present embodiment is designed such that a paired data transfer bus lines are wired with respect to four columns. Of course, it is possible to arbitrarily set a relationship in numbers between the data transfer bus lines and columns. In addition, the present embodiment is designed such that the select signal lines are wired in parallel with the word lines (i.e., rows) to have points of intersection with respect to all columns of the memory cell array. For this reason, it is possible to arbitrarily select the paired transfer gate transistors, which are controlled in conduction by the select signal lines SEG0 to SEG3. Hence, there is no restriction in arrangement of locations of the columns, whose data are being read to the data transfer bus lines, within the memory cell array. That is, it is possible to freely set the locations of the columns within the memory cell array. Therefore, the columns whose data are simultaneously read to the external I/O terminals can be arranged at locations being apart from each other.

A number of the data transfer bus lines TBL can be reduced by increasing a number of select signal lines. So, in the case where they are formed in the uppermost metal wiring layer, it is possible to obtain merits in pattern formation of the semiconductor devices. In addition, since restriction to wiring pitches can be loosened, coupling capacity between lines are remarkably reduced. Therefore, it is possible to obtain improvements in reading speeds and reduction of consumed electric power because of reduction of load capacity. Further, it is possible to expect reduction of noise between the data transfer bus lines. This contributes to stability in operations of the semiconductor devices. The aforementioned effects become remarkable when no conduction layer is formed above the data transfer bus lines.

In some cases, destruction may be caused to occur on data of memory cells within the region RG0, which are badly influenced by charged particles being caused by neutrons introduced into the region RG0. Even if such destruction occurs on the region RG0 of the memory cell array of the present embodiment, there is a small impact that bit data emerging at the external I/O terminal I/O0 goes defective. In other words, it is possible to suppress a number of defective bits to one bit within overall data being read out at the external I/O terminals I/O0 to I/O15. Same thing can be said when neutrons are introduced into other regions.

Incidentally, an interval of distance between the region RG0 and its adjacent region RG2 is set greater than a range of distances in which memory cells are influenced by charged particles. In that case, even if neutrons are introduced into a border between the regions, corresponding charged particles merely affect memory cells belonging to any one region. Thus, it is possible to suppress a number of defective bits to a single bit within data being read out to the external I/O terminals I/O0 to I/O15.

It is possible to introduce coordination in "physical" positional relationships between columns in each region. For example, if a certain column address designates a column whose location is lower end of the region RG0, it is used to normally designate a column whose location is lower end of each of other regions. In that case, columns which are simultaneously selected within the same cycle are arranged to be apart from each other by at least an area of one region. This may allow proximal arrangement of regions, which are arranged in proximity to each other without providing intervals of distance substantially. So, even if neutrons are introduced into a border between adjacent regions which are arranged in proximity to each other without an interval of distance, there is no possibility in that both of data being simultaneously read from the regions go defective. In short, it is possible to suppress a number of defective bits to a single bit within data being read out to the external I/O terminals.

It is possible to provide a parity bit for error correction on each unit of data being read out to the external I/O terminals I/O0 to I/O15 within the same cycle. As described above, the array configuration of the present embodiment has an advantage in which it is possible to suppress a number of defective bits to a single bit within the data being read out to the external I/O terminals I/O0 to I/O15. Therefore, it is possible to accurately check whether a defective bit (i.e., a single bit in defectiveness) exists within the data or not with reference to the parity bit. Again, it is possible to perform error correction using the parity bit on each unit of data being read out within the same cycle. In that case, even if destruction is caused to occur due to neutrons on data of memory cells, it is possible to easily perform error correction on data being read out to the external.

It is an effective measure against soft errors to broaden pitches between memory cells with intervals of distance at a border between regions (RG) in which columns corresponding to different external I/O terminals are arranged to adjoin each other. In that case, it is effective to arrange impurities diffused layers of counter conduction type against substrate in border regions on a surface of a semiconductor substrate, wherein the impurities diffused layers are supplied with predetermined electric potentials or signals.

As described heretofore, this invention has a variety of technical features and effects, which are summarized as follows:

(1) A semiconductor storage device has a memory array in connection with external I/O terminals for inputting and outputting data, wherein memory cells are arranged in mixture in connection with the external I/O terminals. The memory array contains multiple columns each consisting of a number of memory cells. Herein, columns whose memory cells are subjected to read operations within the same cycle are arranged to be apart from each other. Therefore, even if destruction is caused to occur on data of the memory cells due to neutrons, there is no probability in that multiple bits of data being read out in the same cycle go defective simultaneously. So, it is possible to suppress variations of data being output to the external I/O terminals to the minimum.

(2) A semiconductor storage device contains a number of external I/O terminals, a main storage having a memory array in which memory cells are arranged in mixture in connection with the external I/O terminals, and an auxiliary storage that functions as a cache memory for the main storage. Herein, data are read from the main storage and are output to the external I/O terminals by way of the auxiliary storage. In addition, columns whose memory cells are subjected to read operations within the same cycle are arranged to be apart from each other. Therefore, it is possible to promptly respond to access requests being given from multiple memory masters without reduction of a cache hit rate. Even if destruction is caused to occur due to neutrons on data of memory cells, multiple bits of data being read out within the same cycle will not go defective simultaneously. So, it is possible to suppress variations of the data being output to the external I/O terminals to the minimum.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall with metes and bounds of the claims, or equivalence of such metes and bounds are therefore intended to be embraced by the claims.

What is claimed is:

1. A semiconductor integrated circuit device comprising:
    a plurality of external I/O terminals for inputting and outputting data;
    at least a memory cell array in which memory cells are arranged in mixture in connection with at least two external I/O terminals within the plurality of external I/O terminals, wherein the memory cells are arranged in an array form consisting of rows and columns in connection with word lines and bit lines respectively, so that data are read out from the memory cell array and are output to the plurality of external I/O terminals;
    a plurality of select signal lines;
    a plurality of switching elements interposed between the memory cell array and the plurality of external I/O terminals, each switching element connected to one of the plurality of select signal lines to output data from a column in the memory cell array,
    whereby connections between the select signal lines and the switching elements for the columns in the memory cell array are arranged such that columns containing memory cells which are simultaneously subjected to read operations within a same read cycle do not adjoin each other.

2. A semiconductor integrated circuit device according to claim 1 wherein bit lines respectively belonging to the columns are connected with data I/O lines by way of the switching elements.

3. The semiconductor integrated circuit device according to claim 2 wherein the plurality of select signal lines are wired to extend in parallel with the rows of the memory cell array.

4. The semiconductor integrated circuit device according to claim 2 wherein the data I/O lines are wired to extend in parallel with the columns of the memory cell array.

5. The semiconductor integrated circuit device according to claim 1 wherein a parity bit is provided for error correction on each unit of data being read out to the plurality of external I/O terminals within the same cycle.

6. A semiconductor integrated circuit device comprising:
    a plurality of external I/O terminals for inputting and outputting data;
    a main storage having at least a memory cell array in which memory cells are arranged in mixture in connection with at least two external I/O lines within the plurality of external I/O lines, wherein the memory cells are arranged in an array form consisting of rows and columns in connection with word lines and bit lines respectively;
    an auxiliary storage that functions as a cache memory for the main storage, so that bidirectional data transfer is allowed between the main storage and the auxiliary storage, and data are read out from the main storage and are output to the plurality of external I/O terminals by way of the auxiliary storage;
    a plurality of select signal lines;
    a plurality of switching elements interposed between the memory cell array and the plurality of external I/O terminals, each switching element connected to one of the plurality of select signal lines to output data from a column in the memory cell array,
    whereby switching elements for the columns in the memory cell array are connected to different select signal lines such that columns which are not subjected to read operations within the same read cycle are arranged to adjoin each other in the memory cell array.

7. A semiconductor integrated circuit device according to claim 6 wherein the memory cell array of the main storage includes a plurality of columns which are arranged to adjoin each other in space in connection with the external I/O terminals respectively and each of which is commonly assigned with a first address, wherein by selectively conducting the switching element in response to a second address, data are read out from any one of the plurality of columns and are output to any one of the plurality of external I/O terminals.

8. A semiconductor integrated circuit device according to claim 6 wherein a parity bit is provided for error correction on each unit of data being read out to the plurality of external I/O terminals within the same cycle.

9. A semiconductor storage device comprising:
    a plurality of external I/O terminals;
    a first DRAM array;
    a second DRAM array;
    an SRAM array; and
    a data transfer circuit used for data transfer between the SRAM array and each of the first and second DRAM array by way of data transfer bus lines,
    wherein each of the first and second DRAM arrays comprises:
        a plurality of columns each containing a plurality of memory cells, and the plurality of columns are arranged in mixture in connection with the plurality of external I/O terminals respectively;
        a plurality of select signal lines;
        a plurality of switching elements interposed between the plurality of memory cells and the plurality of external I/O terminals, each switching element connected to one of the plurality of select signal lines to output data from a column of memory cells,
        whereby switching elements for the columns in the memory cell array are connected to different select signal lines such that columns which are not subjected to read operations within the same read cycle to adjoin each other in the memory cell array.

10. A semiconductor storage device according to claim 9 wherein columns respectively containing memory cells which are simultaneously subjected to read operations within the same cycle are arranged together by intervention of another column containing memory cells which are subjected to read operations in another cycle.

11. The semiconductor storage device according to claim 9 wherein a parity bit is provided for error correction on each unit of data being read out to the plurality of external I/O terminals within the same cycle.

12. A semiconductor storage device comprising:
    a plurality of external I/O terminals;
    a plurality of DRAM arrays;
    at least one SRAM array; and
    a data transfer circuit used for data transfer between the at least one SRAM array and the plurality of DRAM arrays by way of data transfer bus lines, wherein each DRAM array in the plurality of DRAM arrays comprises:
- a plurality of columns each containing a plurality of memory cells, and the plurality of columns are arranged in mixture in connection with the plurality of external I/O terminals respectively;
- a plurality of select signal lines;
- a plurality of switching elements interposed between the plurality of memory cells and the plurality of external I/O terminals, each switching element connected to one of the plurality of select signal lines to output data from a column of memory cells,
- wherein the connections between the select signal lines and the switching elements are arranged such that columns respectively containing memory cells which are simultaneously subjected to read operations within a same cycle are arranged not to adjoin each other.

13. The semiconductor storage device according to claim 12, wherein columns respectively containing memory cells which are simultaneously subjected to read operations within the same cycle are arranged together by intervention of another column containing memory cells which are subjected to read operations in another cycle.

14. The semiconductor storage device according to claim 12, wherein a parity bit is provided for error correction on each unit of data being read out to the plurality of external I/O terminals within the same cycle.

* * * * *